(12) United States Patent
Whetsel

(10) Patent No.: US 8,046,651 B2
(45) Date of Patent: Oct. 25, 2011

(54) COMPARE CIRCUIT RECEIVING SCAN REGISTER AND INVERTED CLOCK FLIP-FLOP DATA

(75) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 150 days.

(21) Appl. No.: 12/410,561

(22) Filed: Mar. 25, 2009

(65) Prior Publication Data

US 2009/0271674 A1  Oct. 29, 2009

Related U.S. Application Data

(60) Provisional application No. 61/047,767, filed on Apr. 2, 2008, provisional application No. 61/061,292, filed on Jun. 13, 2008.

(51) Int. Cl.
*G01R 31/28* (2006.01)
(52) U.S. Cl. ............ 714/731; 714/729; 714/734
(58) Field of Classification Search .......... 714/726, 714/727, 729, 733, 734, 731
See application file for complete search history.

(56) References Cited

U.S. PATENT DOCUMENTS

| | | | | |
|---|---|---|---|---|
| 5,740,182 A * | 4/1998 | Narain | | 714/726 |
| 5,828,579 A * | 10/1998 | Beausang | | 716/102 |
| 5,872,793 A * | 2/1999 | Attaway et al. | | 714/726 |
| 5,898,702 A * | 4/1999 | Narayanan et al. | | 714/726 |
| 6,763,488 B2 * | 7/2004 | Whetsel | | 714/729 |
| 6,769,080 B2 * | 7/2004 | Whetsel | | 714/729 |
| 6,853,212 B2 * | 2/2005 | Chandar et al. | | 326/16 |
| 7,051,257 B2 * | 5/2006 | Whetsel | | 714/729 |
| 7,613,972 B2 * | 11/2009 | Takeoka et al. | | 714/731 |
| 7,739,568 B1 * | 6/2010 | Bertanzetti | | 714/729 |
| 2005/0055615 A1 * | 3/2005 | Agashe et al. | | 714/727 |
| 2006/0095819 A1 * | 5/2006 | Bhatia | | 714/726 |
| 2009/0240997 A1 * | 9/2009 | Hasegawa | | 714/731 |

OTHER PUBLICATIONS

Hobbs, E.D.; , "Practical considerations for designing ASICs which incorporate scan path and JTAG techniques," Automated Testing and Software Solutions, IEE Colloquium on , vol., No., pp. 9/1-9/4, Apr. 8, 1992 URL: http://ieeexplore.ieee.org/stamp/stamp.jsp?tp=&arnumber=168147&isnumber=4347.*

Lofstrom, K.; , "Early capture for boundary scan timing measurements," Test Conference, 1996. Proceedings., International , vol., No., pp. 417-422, Oct. 20-25, 1996 doi: 10.1109/TEST.1996.557045 URL: http://ieeexplore.ieee.org/stamp/stamp.jsp?tp=&arnumber=557045&isnumber=12091.*

* cited by examiner

*Primary Examiner* — Cynthia Britt
(74) *Attorney, Agent, or Firm* — Lawrence J. Bassuk; W. James Brady; Frederick J. Telecky, Jr.

(57) ABSTRACT

The disclosure describes a novel method and apparatus for providing expected data, mask data, and control signals to scan test architectures within a device using the falling edge of a test/scan clock. The signals are provided on device leads that are also used to provide signals to scan test architectures using the rising edge of the test/scan clock. According to the disclosure, device test leads serve to input different test signals on the rising and falling edge of the test/scan clock which reduces the number of interconnects between a tester and the device under test.

4 Claims, 27 Drawing Sheets

COMPARE CIRCUIT RECEIVING SCAN REGISTER AND INVERTED CLOCK FLIP-FLOP DATA

FIELD OF THE DISCLOSURE

This application claims priority from Provisional Application No. 61/047,767, filed Apr. 2, 2008, and also claims priority from Provisional Application No. 61/061,292, filed Jun. 13, 2008.

This disclosure relates in general to device scan architectures and in particular to device scan test architectures that use the falling edge of scan clocks to input mask data, expected data, and scan enable signals during test.

BACKGROUND OF THE DISCLOSURE

Most electrical devices today, which may be ICs or embedded cores within ICs, use scan test architectures to test combinational logic within the devices. Scan test architectures within a device comprise scan paths having externally accessible scan inputs, externally accessible control inputs and externally accessible scan outputs. Alternately, scan test architectures within a device may comprise scan paths having externally accessible scan inputs, externally accessible control inputs and scan outputs that are internally coupled to a compare circuit within the device for comparing the scan outputs with externally accessible expected data inputs. Further, scan test architectures within a device may comprise scan paths having externally accessible scan inputs, externally accessible control inputs and scan outputs internally coupled to a compressor circuit within the device for compressing unmasked scan outputs into a signature. The masking or unmasking of a scan output to the compressor circuit is provided by externally accessible mask data inputs to the circuit.

The expected data inputs to the compare circuit and the mask data inputs to the compressor circuit are provided by additional signal inputs to the device. Requiring a device to have additional inputs for the expected and mask data increases the number of interconnects between the device and a tester. This increase in interconnect increases the cost of the tester, which is reflected in the cost of the device being tested. The present disclosure advantageously provides a way to eliminate the need for a device to have additional inputs for expected and mask data from a tester by allowing the expected and mask data signals to be input to the device from the tester using the scan data inputs of the device. Additional features of the present disclosure, beyond the elimination of expected and mask data inputs, will be described in detail below.

BRIEF SUMMARY OF THE DISCLOSURE

The disclosure provides an improved way to scan test circuits in a device by utilizing the falling edge of the scan clock to input expected data, mask data and/or test control signals to the device. The expected data, mask data and/or test control signals are advantageously input to the device using the same device test leads that input test signals to the scan test circuits on the rising edge of the scan clock.

DETAILED DESCRIPTION OF THE DISCLOSURE

Figure 1A:
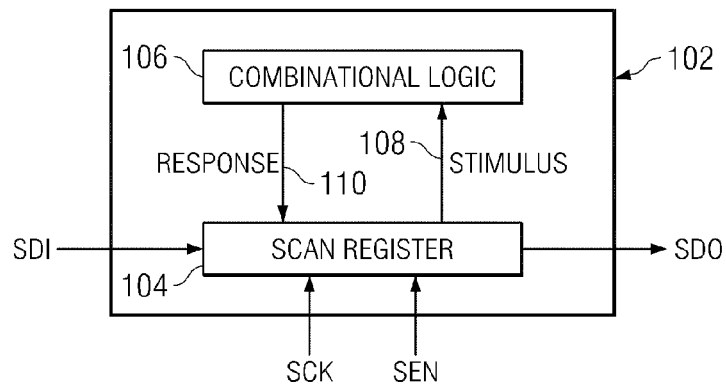
FIG. 1A illustrates a conventional scan architecture within a device.

FIG. 1A illustrates a conventional method of using a scan register 104 to test combinational logic 106 in a device. The scan register has a serial data input (SDI), a serial data output (SDO), scan clock input (SCK), a scan enable input (SEN), parallel outputs 108 coupled to parallel inputs to the combinational logic, and parallel inputs 110 coupled to parallel outputs from the combinational logic. The SDI, SDO, SCK and SEN device signals are coupled to a tester.

Figure 1B:
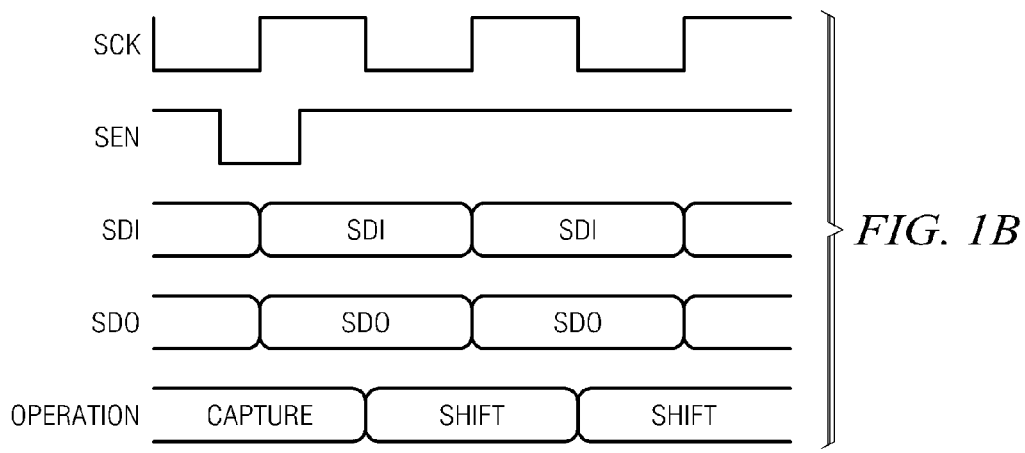
FIG. 1B illustrates the operation of the FIG. 1A scan architecture.

FIG. 1B illustrates the timing of a tester operating the scan register of FIG. 1A to input test stimulus to the combinational logic and output test response from the combinational logic. When SEN goes low, response data is captured into the scan register on the rising edge of SCK. When SEN goes high, the scan register shifts data from SDI to SDO on the rising edge of SCK. The shift and capture logic levels on SEN could be reversed if desired. The shift operation unloads the captured response and loads the next stimulus data to be applied to the combinational logic. This process of capturing response data and shifting the scan register repeats until the test is complete. Scan testing, as shown in FIG. 1, is well known in the industry.

Figure 2:
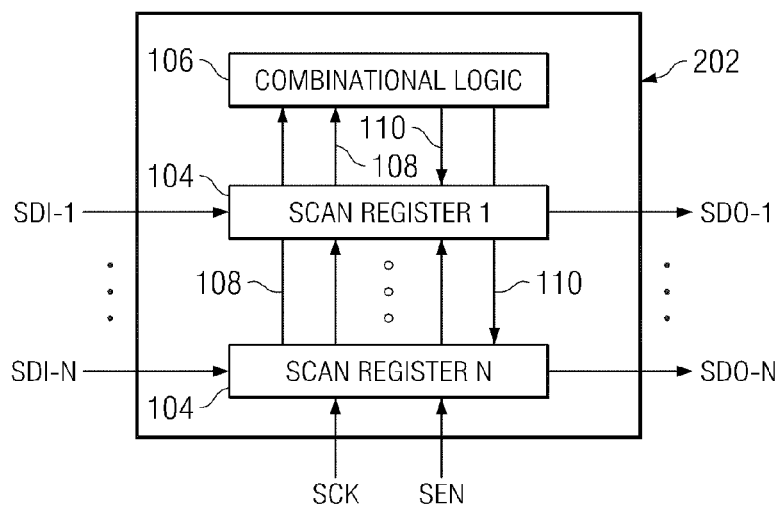
FIG. 2 illustrates a conventional parallel scan architecture within a device.

FIG. 2 illustrates a conventional method of using a parallel group of the scan registers 104 of FIG. 1 to test combinational logic 106 in a device 202. Each scan register 1-N is coupled to an associated SDI 1-N input and SDO 1-N output of a tester. Also each scan register 1-N is coupled to SCK and SEN signals of the tester and to the combinational logic via parallel outputs 108 and parallel inputs 110. Parallel scan testing, as shown in FIG. 2, is well known in the industry.

Figure 3:
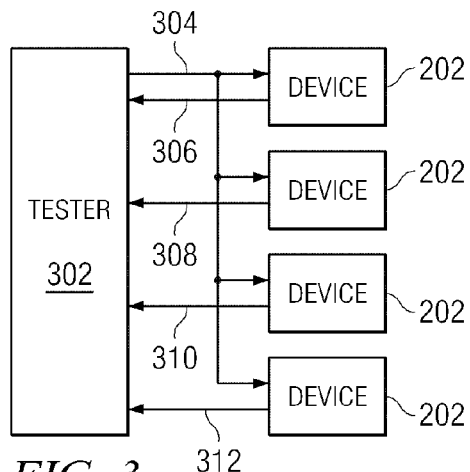
FIG. 3 illustrates a parallel arrangement between a tester and plural devices to be tested using the scan architectures of FIGS. 1 and 2.

FIG. 3 illustrates a conventional arrangement between a tester 302 and a group of FIG. 2 devices 202 to be tested in parallel. The tester has an output bus 304 for outputting the SDI 1-N signals to all devices 202. The tester has input buses 306-312 for inputting the SDO 1-N signals from each device 202. The tester needs only a single output bus 304 to output the SDI 1-N signals to each device 202 being tested in parallel since each device 202 receives the same SDI 1-N signals. However, the tester requires a separate input bus 306-312 for each device 202 to allow the SDO 1-N outputs of each device 202 to be separately input to the tester. While not shown, the tester also outputs SCK and SEN signals to all devices to operate the scan registers 104. Requiring the tester to have a separate input bus 306-312 for each device being tested in parallel increases the cost of the tester and, as a result, the cost of each device.

Figure 4B:
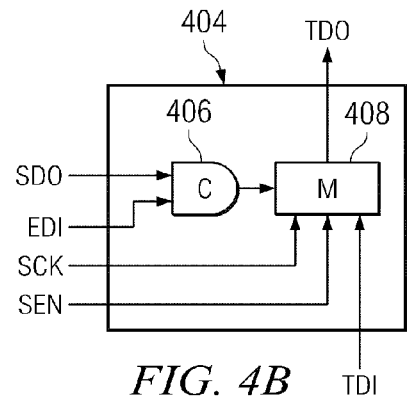
FIG. 4B illustrates an example compare circuit having expected data inputs.
Figure 4A:
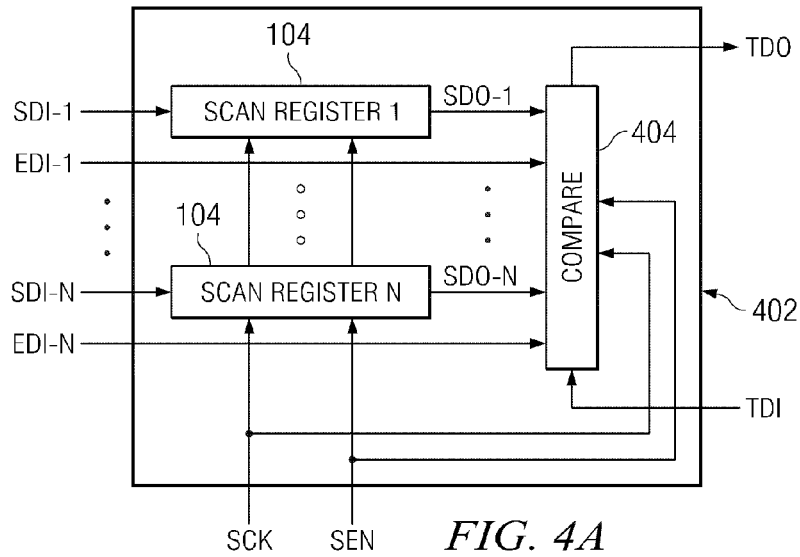
FIG. 4A illustrates a scan test architecture that uses an internal compare circuit and expected data inputs.

FIG. 4A illustrates a scan test architecture whereby a compare circuit 404 is placed in a device 402. The scan test architecture of FIG. 4A is the same as that of FIG. 2 with the exception that the compare circuit 404 has been added. For simplicity, the combinational logic is not shown in FIG. 4A. However, each scan register 104 is coupled to combinational logic via its parallel inputs 110 and outputs 108 as previously described in regard to FIG. 2. The compare circuit 404 is coupled to the SDO 1-N outputs of each scan register 1-N, the SCK and SEN signals, and externally accessible expected data 1-N (EDI 1-N) signals. The compare circuit 404, in this example, is also coupled to an externally accessible JTAG test data input (TDI) signal and test data output (TDO) signal to allow shifting out the test results stored in compare circuit 404. The compare circuit 404 operates in response to the SCK and SEN signals to compare the SDO 1-N outputs of each scan register 1-N 104 with an expected data input 1-N (EDI 1-N) from the tester. The compare circuit 404 eliminates the need for the device 402 to output SDO 1-N signals from scan registers 1-N to the tester. However, and as seen, an EDI 1-N input from the tester is required for each SDO 1-N output from the scan registers 104.

FIG. 4B illustrates one example implementation of compare circuit 404. The compare circuit includes a comparing circuit 406, such as an XOR gate, that inputs an SDO signal from a scan register 104 and an EDI signal from a tester and outputs a comparison signal to a memory circuit (M) 408. The memory circuit 408 operates in response to the SCK and SEN signals to evaluate the comparison results from the comparing circuit 406 during the test. At the end of the test, the test comparison results can be accessed via a JTAG TDI to TDO signal path. The compare circuit 408 can be of any complexity. For example the compare circuit 408 can be as simple as a flip flop that latches a state upon the first detection of a failure or the compare circuit 408 can be more sophisticated, perhaps including a multiple fail detection memory latches and a failure logging circuit that indicates which compare operation failed.

Figure 4C:
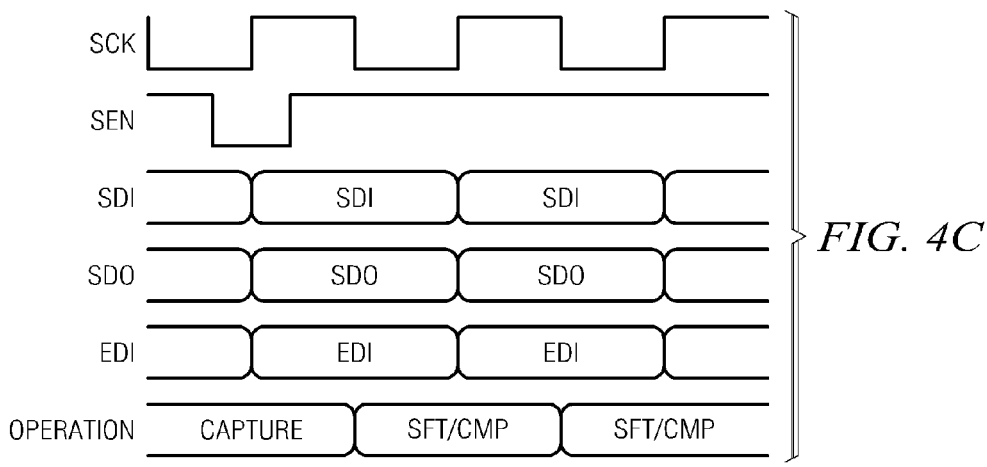
FIG. 4C illustrates the operation of the FIG. 4 scan test architecture.

FIG. 4C illustrates the timing of a tester operating the scan registers 104 and compare circuit 404 to test combinational logic. When SEN goes low, response data is captured into the scan registers 104 on the rising edge of SCK. When SEN goes high, the scan registers shift (SFT) data from SDI to SDO on the rising edge of SCK while the compare circuit 404 compares (CMP) the SDO 1-N data outputs from the scan registers against EDI 1-N data signals from the tester. This process of capturing response data, shifting the scan registers and comparing their SDO outputs repeats until the test is complete. At the end of the test, the test results stored in the memory circuit 408 can be shifted out to the tester for examination via the JTAG TDI and TDO scan path.

Figure 5A:
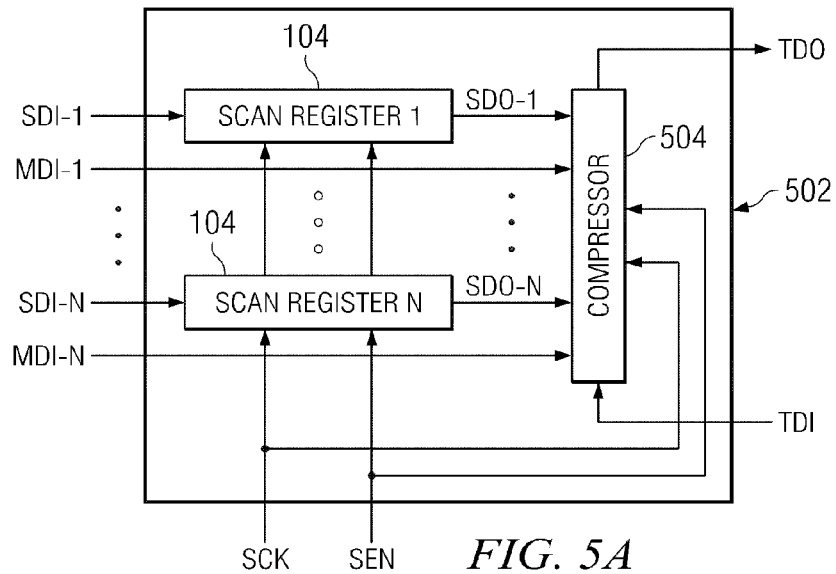
FIG. 5A illustrates a scan test architecture that uses an internal compressor circuit and mask data inputs.

FIG. 5A illustrates a scan test architecture whereby a compressor circuit 504 is placed in a device 502. The scan test architecture of FIG. 5A is similar to that of FIG. 4A with the exception that the compressor circuit 504 is used instead of the compare circuit 404. As with FIG. 4A, the combinational logic being tested is not shown in FIG. 5A. The compressor circuit 504 is coupled to the SDO 1-N outputs of each scan register 1-N, the SCK and SEN signals, and externally accessible mask data 1-N (MDI 1-N) signals. The compressor circuit 504, in this example, is also coupled to an externally accessible JTAG test data input (TDI) signal and test data output (TDO) signal to allow shifting out the test results stored in compressor circuit 504. The compressor circuit 504 operates in response to the SCK and SEN signals to compress the SDO 1-N outputs of each scan register 1-N 104 into a signature used to determine if the test passes or fails. Since some of the SDO response signals from the scan registers may be unknown signals, a MDI 1-N signal from the tester is associated with each SDO 1-N output signal and input to the compressor 504. The MDI 1-N signals are used to mask off unknown SDO 1-N response signals so that those SDO signals will not have an effect on the test signature being taken. The compressor circuit 504 eliminates the need for the device 502 to output SDO 1-N signals from scan registers 1-N to the tester. However, and as seen, a MDI 1-N input from the tester is required for each SDO 1-N output from the scan registers 104.

Figure 5B:
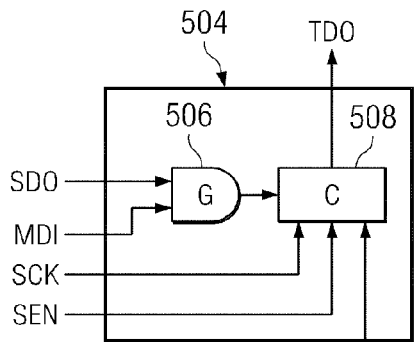
FIG. 5B illustrates an example compressor circuit having mask data inputs.

FIG. 5B illustrates one example implementation of compressor circuit 504. The compressor circuit includes a masking gate 506, such as an OR gate, that inputs an SDO signal from a scan register 104 and a MDI signal from a tester and outputs a signal to a compression circuit (C) 508. If the SDO input to gate 506 is not masked by the MDI input, the output of the gate will be the same as the SDO input to the gate. If the gate is masked by the MDI input, the output of the gate 506 will be set to a predetermined logic state that is independent of the SDO input. The compression circuit 508 operates in response to the SCK and SEN signals to compress unmasked SDO 1-N inputs into a signature during the test. At the end of the test, the test signature can be accessed via the TDI and TDO signals. The compression circuit 508 can be of any known type such as but not limited to a multiple input shift register (MISR).

Figure 5C:
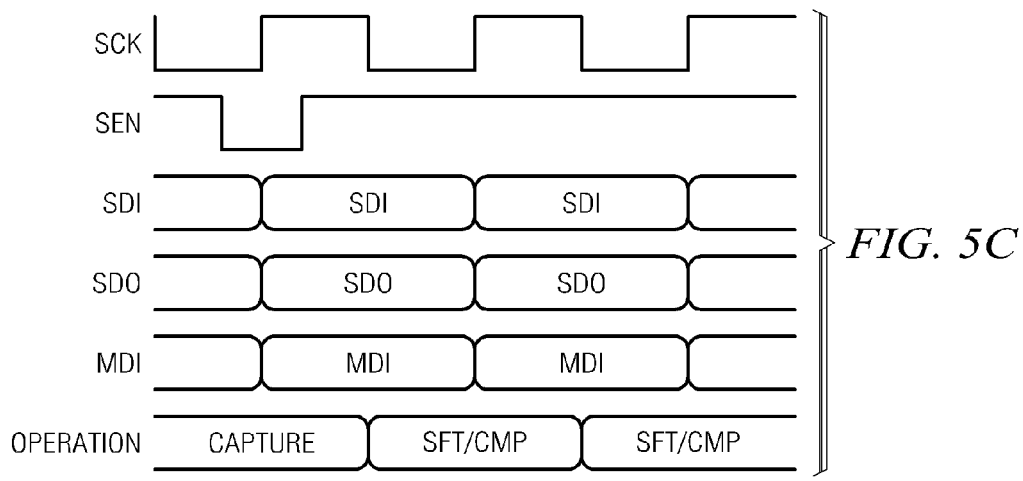
FIG. 5C illustrates the operation of the FIG. 5A scan test architecture.

FIG. 5C illustrates the timing of a tester operating the scan registers 104 and compressor circuit 504 to test combinational logic. When SEN goes low, response data is captured into the scan registers 104 on the rising edge of SCK. When SEN goes high, the scan registers shift (SFT) data from SDI to SDO on the rising edge of SCK while the compressor circuit 504 compresses (CMP) the unmasked SDO 1-N data outputs from the scan registers. This process of capturing response data, shifting the scan registers and compressing their unmasked SDO outputs repeats until the test is complete. At the end of the test, the test signature collected in the compression circuit 508 can be shifted out to the tester for examination via the JTAG TDI and TDO scan path.

Figure 6:
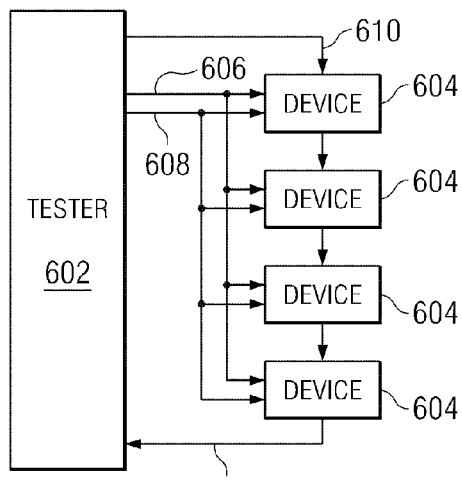
FIG. 6 illustrates a parallel arrangement between a tester and plural devices to be tested using the scan architectures of FIGS. 4 and 5.

FIG. 6 illustrates a conventional arrangement between a tester 602 and a group of devices 604 to be tested in parallel. The devices 604 could be a group of devices 402 of FIG. 4 or a group of device 502 of FIG. 5. The tester has a first output bus 606 for outputting the SDI 1-N signals to all devices 604. The tester has a second output bus 608 for outputting EDI 1-N signals or MDI 1-N signals to all devices 604. If the devices 604 are devices 402 of FIG. 4, output bus 608 will be used to output EDI 1-N signals to the devices. If the devices 604 are device 502 of FIG. 5, output bus 608 will be used to output MDI 1-N signals to the devices. The tester also has a JTAG TDI output 610 to a first device in the group and a JTAG TDO input 612 from the last device in the group. TDI to TDO connections are formed between the devices to provide the tester with a JTAG scan path through all the devices 604 in the group for unloading test compare results from device compare circuits 404 or to unload test signatures from device compressor circuits 504. While not shown, the tester also outputs JTAG control signals TCK and TMS to all devices to operate the TDI to TDO scan path and SCK and SEN signals to all devices to operate the scan registers 104 and compare/compressor circuits 404/504.

As seen in FIG. 6 and due to the scan test architecture implemented in the devices 604, the tester only needs the two buses 606 and 608 and the JTAG TDI 610 to TDO 612 scan path signals to test all the devices 604 in the group in parallel. Bus 606 is used input the SDI 1-N signals to all devices 604 and bus 608 is used to input the EDI 1-N or MDI 1-N signals to all devices 604. Thus the test arrangement between the tester and devices being tested in FIG. 6 is superior to the test arrangement of FIG. 3 in reducing the number of interconnects between the tester and devices. Reducing the interconnects between the tester and devices leads to less expensive testers and therefore a reduction in the cost of the devices being tested. However, it would be even more advantageous, cost-wise, if the number of interconnects between the tester and the devices could be further reduced. For example if bus 606 and bus 608 each comprise 64 separate signals, 128 interconnects are required between the tester and devices. The present disclosure as described below provides, among other embodiments, a method and apparatus for allowing the signals of bus 608 to be transmitted on bus 606. Thus the example 128 interconnects above between the tester and devices being tested can be further reduced by the present disclosure to only 64 interconnects between the tester and devices being tested.

Figure 7A:
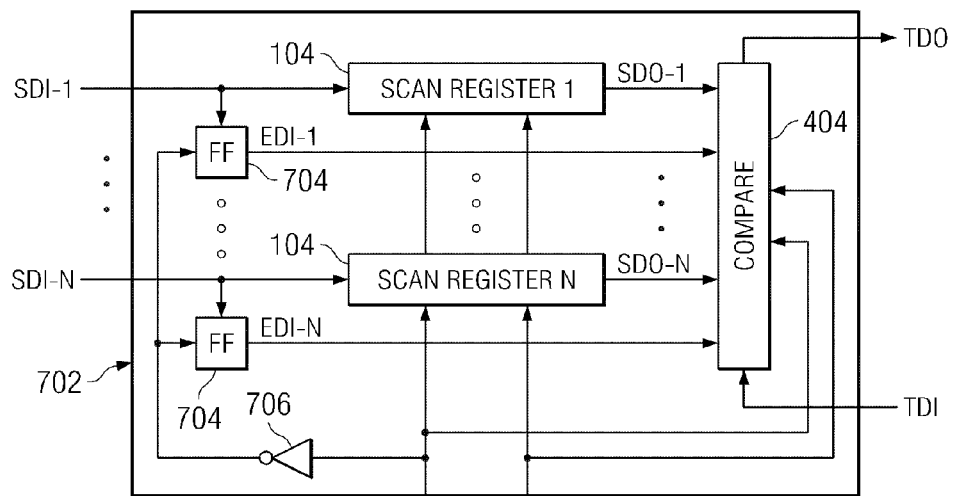
FIG. 7A illustrates a scan architecture using a comparator and expected data inputs according to the disclosure.

FIG. 7A illustrates an embodiment of the disclosure in a device 702. As seen, the disclosure improves upon the scan test architecture of FIG. 4 by placing flip flops (FF) 704 on each SDI 1-N device input. The data input of each FF is coupled to an associated SDI 1-N input from the tester. The clock input of each FF 704 is coupled to the SCK input from the tester via inverter 706. The data output of each FF 704 is coupled to an EDI 1-N input to compare circuit 404. As can be appreciated, this embodiment of the disclosure enables the EDI 1-N data inputs to the device 702 to now be provided by the SDI 1-N data inputs to the device 702, instead of by the separate EDI 1-N inputs to the device 402 of FIG. 4.

Figure 7B:
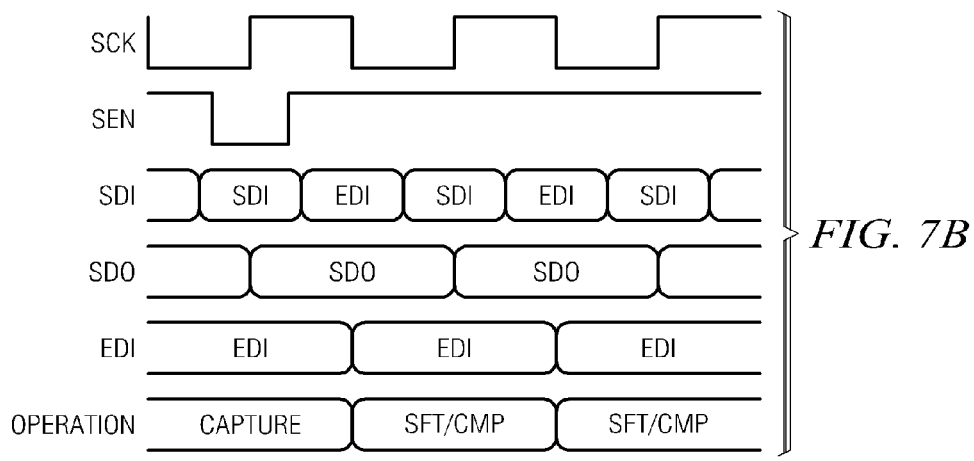
FIG. 7B illustrates the operation of the FIG. 7A scan architecture.

As seen in the timing diagram of FIG. 7B, the tester inputs SDI data to the scan registers on the rising edge of SCK and EDI data to the FFs on the falling edge of SCK. The EDI outputs from the FFs are input to the comparators to be compared with the SDO outputs from the scan registers as described in FIG. 4. Inputting the EDI data on the falling edge of SCK is transparent to the normal SDI data input on the rising edge of SCK. Thus the disclosure maintains the capture and shift/compare operations of the scan approach of the FIG. 4 device while eliminating the need for the FIG. 4 device to have separate inputs for inputting the EDI data, which advantageously reduces the number of connection between the device and tester.

Figure 8A:
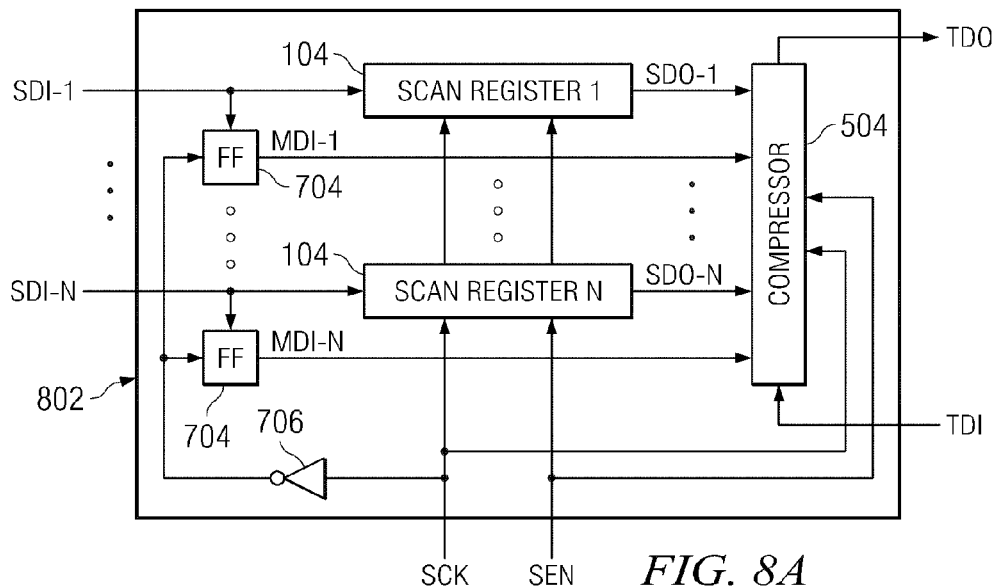
FIG. 8A illustrates a scan architecture using a compressor and mask data inputs according to the disclosure.

FIG. 8A illustrates an embodiment of the disclosure in a device 802. As seen, the disclosure improves upon the scan test architecture of FIG. 5 by placing flip flops (FF) 704 on each SDI 1-N device input. The data input of each FF is coupled to an associated SDI 1-N input from the tester. The clock input of each FF 704 is coupled to the SCK input from the tester via inverter 706. The data output of each FF 704 is coupled to a MDI 1-N input to compressor circuit 504. As can be appreciated, this embodiment of the disclosure enables the MDI 1-N data inputs to the device 802 to now be provided by the SDI 1-N data inputs to the device 802, instead of by the separate MDI 1-N inputs to the device 502 of FIG. 5.

Figure 8B:
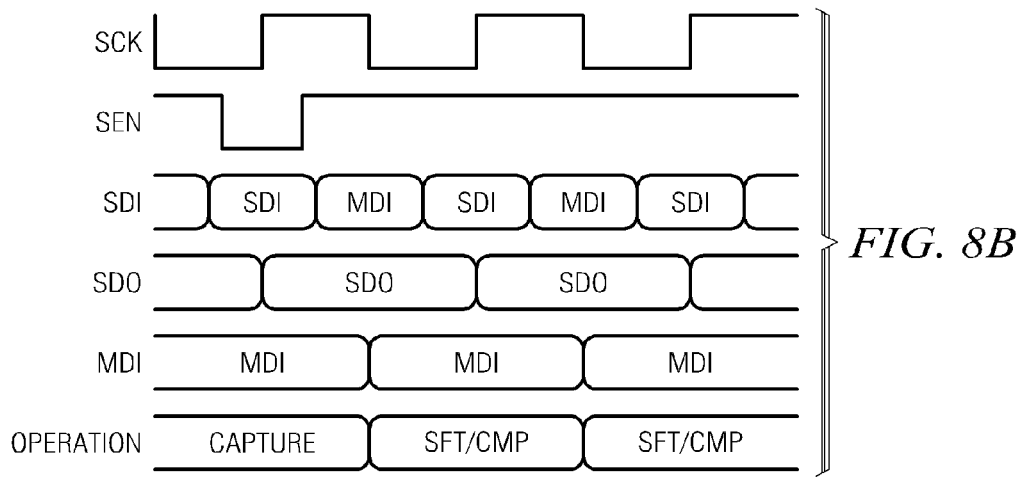
FIG. 8B illustrates the operation of the FIG. 8A scan architecture.

As seen in the timing diagram of FIG. 8B, the tester inputs SDI data to the scan registers on the rising edge of SCK and MDI data to the FFs on the falling edge of SCK. The MDI outputs from the FFs are input to the compressor circuit to be used to mask the SDO outputs from the scan registers as described in FIG. 5. Inputting the MDI data on the falling edge of SCK is transparent to the normal SDI data input on the rising edge of SCK. Thus the disclosure maintains the capture and shift/compress operations of the scan approach of the FIG. 5 device while eliminating the need for the FIG. 5 device to have separate inputs for inputting the MDI data, which advantageously reduces the number of connection between the device and tester.

Figure 9:
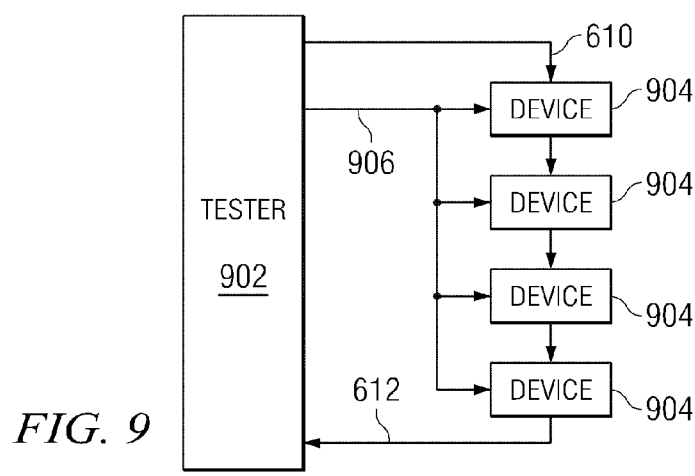
FIG. 9 illustrates a parallel arrangement between a tester and plural devices to be tested using the scan architectures of FIGS. 7 and 8.

FIG. 9 illustrates an arrangement between a tester 902 and a group of devices 904 to be tested in parallel, according the disclosure. The devices 904 could be a group of devices 702 of FIG. 7 or a group of device 802 of FIG. 8. The tester has an output bus 906 for outputting the SDI 1-N signals and EDI 1-N or MDI 1-N signals to all devices 604. Tester 902 is the same as the tester 602 of FIG. 6 with the exception that it has been designed to output SDI data to the devices 904 for input to the device scan registers 104 on the rising edge of SCK and EDI or MDI data to the devices 904 for input to the FFs 704 on the falling edge of SCK. Bus 906 is the same as bus 606 of FIG. 6 with the exception that each signal of bus 906 provides both an SDI 1-N signal and an EDI 1-N or MDI 1-N signal to each device 904. If the devices 904 are devices 702 of FIG. 7, output bus 906 will be used to output SDI and EDI signals to the devices. If the devices 904 are devices 802 of FIG. 8, output bus 906 will be used to output SDI and MDI signals to the devices. As with FIG. 6, the tester 902 has a JTAG TDI output 610 to a first device in the group and a JTAG TDO input 612 from the last device in the group. TDI to TDO connections are formed between the devices to provide the tester with a JTAG scan path through all the devices 904 in the group for unloading test compare results from device compare circuits 404 or to unload test signatures from device compressor circuits 504. While not shown, the tester also outputs JTAG control signals TCK and TMS to all devices to operate the TDI to TDO scan path and SCK and SEN signals to all devices to operate the scan registers 104 and compare/compressor circuits 404/504.

As seen in FIG. 9 and due to the scan test architecture implemented in the devices 904, the tester only needs one bus 906 and the JTAG TDI 610 to TDO 612 scan path signals to test all the devices 904 in the group in parallel. As previously mentioned and while not shown, the tester also outputs JTAG control signals TCK and TMS to all devices to operate the TDI to TDO scan path and SCK and SEN signals to all devices to operate the scan registers 104 and compare/compressor circuits 404/504. Thus the test arrangement between the tester and devices being tested in FIG. 9 is superior to the test arrangement of FIG. 6 in reducing the number of interconnects between the tester and devices. As mentioned, reducing the interconnects between the tester and devices leads to less expensive testers and therefore a reduction in the cost of the devices being tested. Using the same 64 signal bus width example of FIG. 6, the interconnects between the tester 902 and devices 904 of FIG. 9 are reduced from 128 for the two bus arrangement of FIG. 6 to only 64 for the single bus arrangement of FIG. 9. Also the test time to test the devices 904 of FIG. 9 is the same as the test time to test the devices 604 of FIG. 6, since the inputting of EDI or MDI data on bus 906 on the falling edge of SCK takes no additional time.

Figure 10:
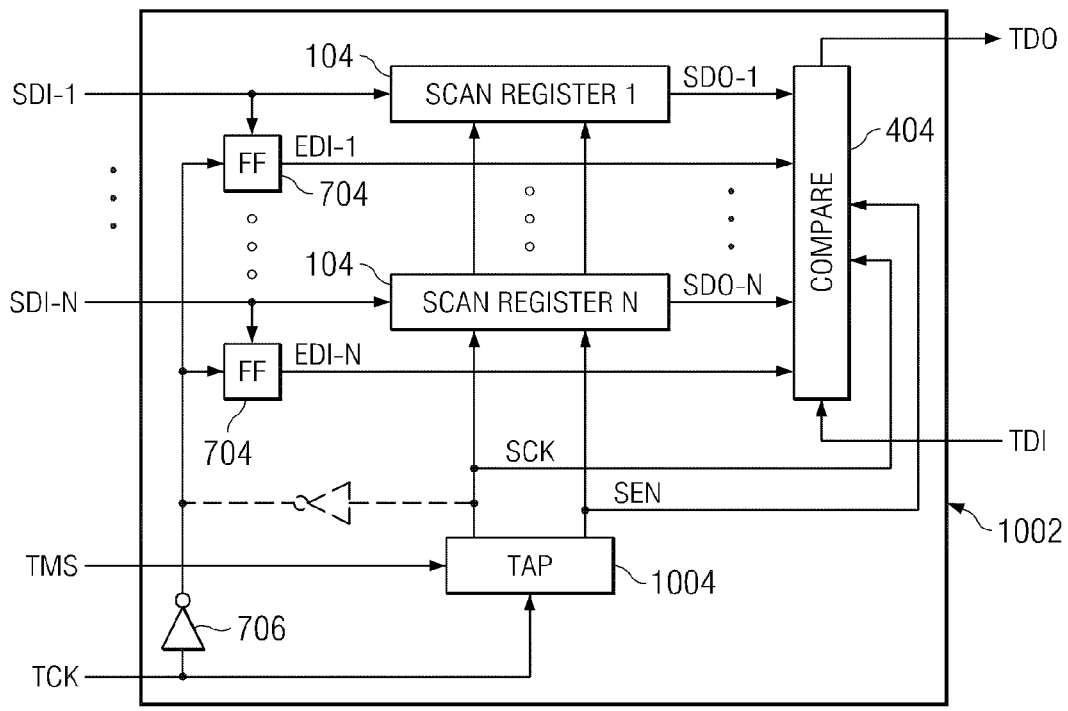
FIG. 10 illustrates a scan architecture using a comparator, expected data inputs, and test access port (TAP) according to the disclosure.

FIG. 10 illustrates an embodiment of the disclosure in a device 1002. As seen, the device 1002 uses a JTAG test access port (TAP) 1004 to provide control to the scan test architecture of FIG. 7. The JTAG TAP is described in detail in IEEE standard 1149.1. The scan test architecture of FIG. 10 is the same as FIG. 7 with the exception that the TAP 1004 is used to control the SCK and SEN signals instead of SCK and SEN signals being controlled directly by a tester. The device TAP 1004 is coupled to a tester via a test mode select (TMS) signal and a test clock (TCK) signal, and to the scan registers 104 and compare circuit 404 via the SCK and SEN signals. In this example, the clock inputs to FFs 704 are coupled to the TCK signal via inverter 706. As seen in dotted line, the clock input to the FFs 704 could be coupled to the SCK output from the TAP via an inverter 706 instead of to the TCK via an inverter 706 if desired. It is assumed at this point that all devices of this disclosure that include a TAP and FFs may clock the FFs using either the TCK input to the device or the SCK clock output from the TAP of the device. The SCK and SEN signals from TAP 1004 control the scan test architecture as previously described in FIG. 7, i.e. when SEN is low, response data from combinational logic is captured into scan registers 104 on the rising edge of SCK and when SEN is high, the scan registers 104 shift data from SDI 1-N to SDO 1-N on the rising edge of SCK while the compare circuit 404 compares the SDO 1-N data from the scan registers against EDI 1-N data from FFs 704 on the rising edge of SCK. The TAP 1004 is also used to operate the TDI to TDO scan path through compare circuit 404 to unload the test compare results at the end of test.

Figure 11:
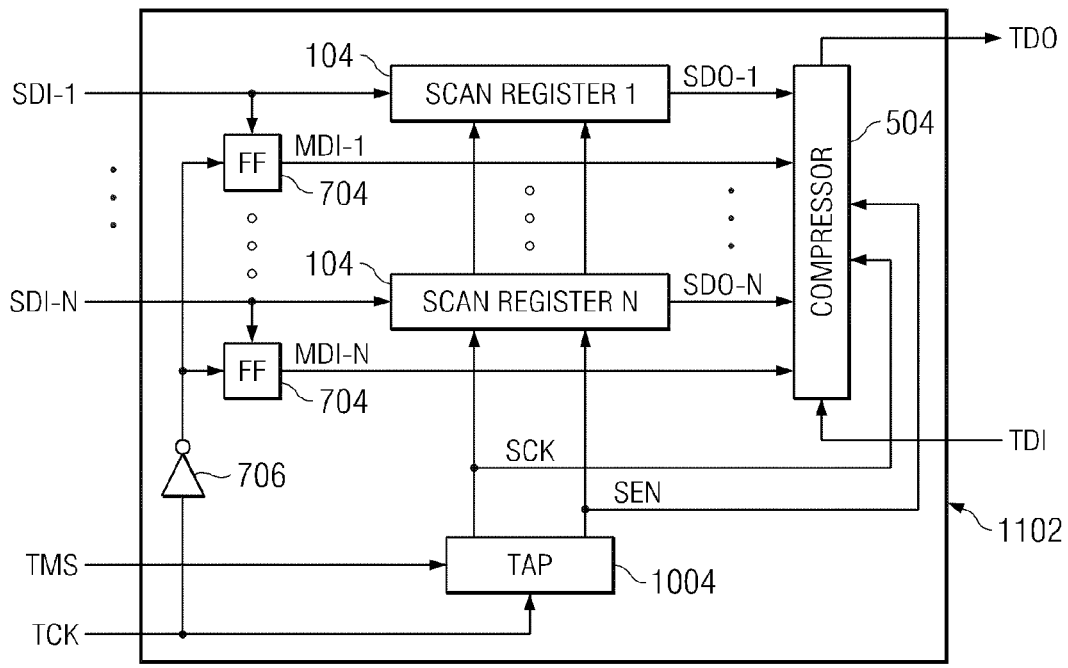
FIG. 11 illustrates a scan architecture using a compressor, mask data inputs, and a TAP according to the disclosure.

FIG. 11 illustrates an embodiment of the disclosure in a device 1102. As seen, the device 1102 uses a JTAG TAP 1004 to provide control to the scan test architecture of FIG. 8. The scan test architecture of FIG. 11 is the same as FIG. 8 with the exception that the TAP 1004 is used to control the SCK and SEN signals instead of SCK and SEN signals being controlled directly by a tester. The device TAP 1004 is coupled to a tester via the TMS and TCK signals, and to the scan registers 104 and compressor circuit 504 via the SCK and SEN signals. As with the scan test architecture of FIG. 10, the clock inputs to FFs 704 are coupled to the TCK signal via inverter 706, but as mentioned the clock input to the FFs 704 could be coupled to the SCK output from the TAP via an inverter 706 if desired. The SCK and SEN signals from TAP 1004 control the scan test architecture as previously described in FIG. 8, i.e. when SEN is low, response data from combinational logic is captured into scan registers 104 on the rising edge of SCK and when SEN is high, the scan registers 104 shift data from SDI 1-N to SDO 1-N on the rising edge of SCK while the compressor circuit 504 compresses masked and unmasked SDO 1-N data from the scan registers into a signature on the rising edge of SCK. The TAP 1004 is also used to operate the TDI to TDO scan path through compressor circuit 504 to unload the test signature at the end of test.

Using a JTAG TAP 1004 to control the scan test architectures of FIGS. 10 and 11 introduces an undesired delay between when response data can be captured into scan registers 104 at the end of a scan register shift operation, as will be described in regard to FIGS. 12, 13, 14 and 14A below.

Figure 12:
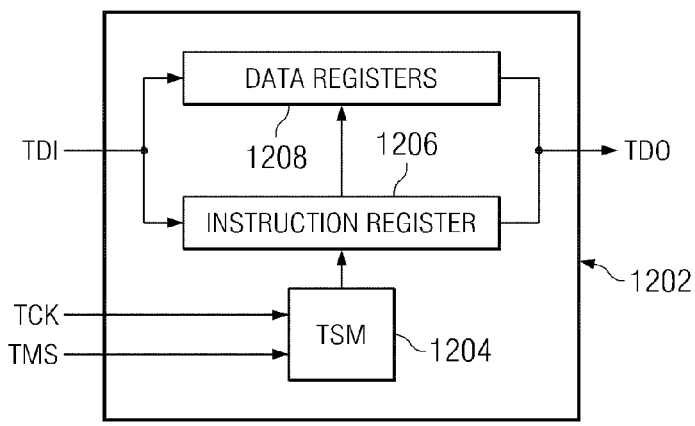
FIG. 12 illustrates a conventional TAP architecture.

FIG. 12 illustrates a simplified view of the test architecture defined in the IEEE standard 1149.1 Test Access Port and Boundary Scan Architecture (JTAG) in a device 1202. The JTAG architecture comprises a TAP state machine (TSM) 1204, an instruction register 1206, and selectable data registers 1208. TSM 1204 is controlled by TMS and TCK inputs to perform shift operations through the instruction register 1206 or through a selected data register 1208 from TDI to TDO. The JTAG architecture of FIG. 12 is well known in the industry.

Figure 13:
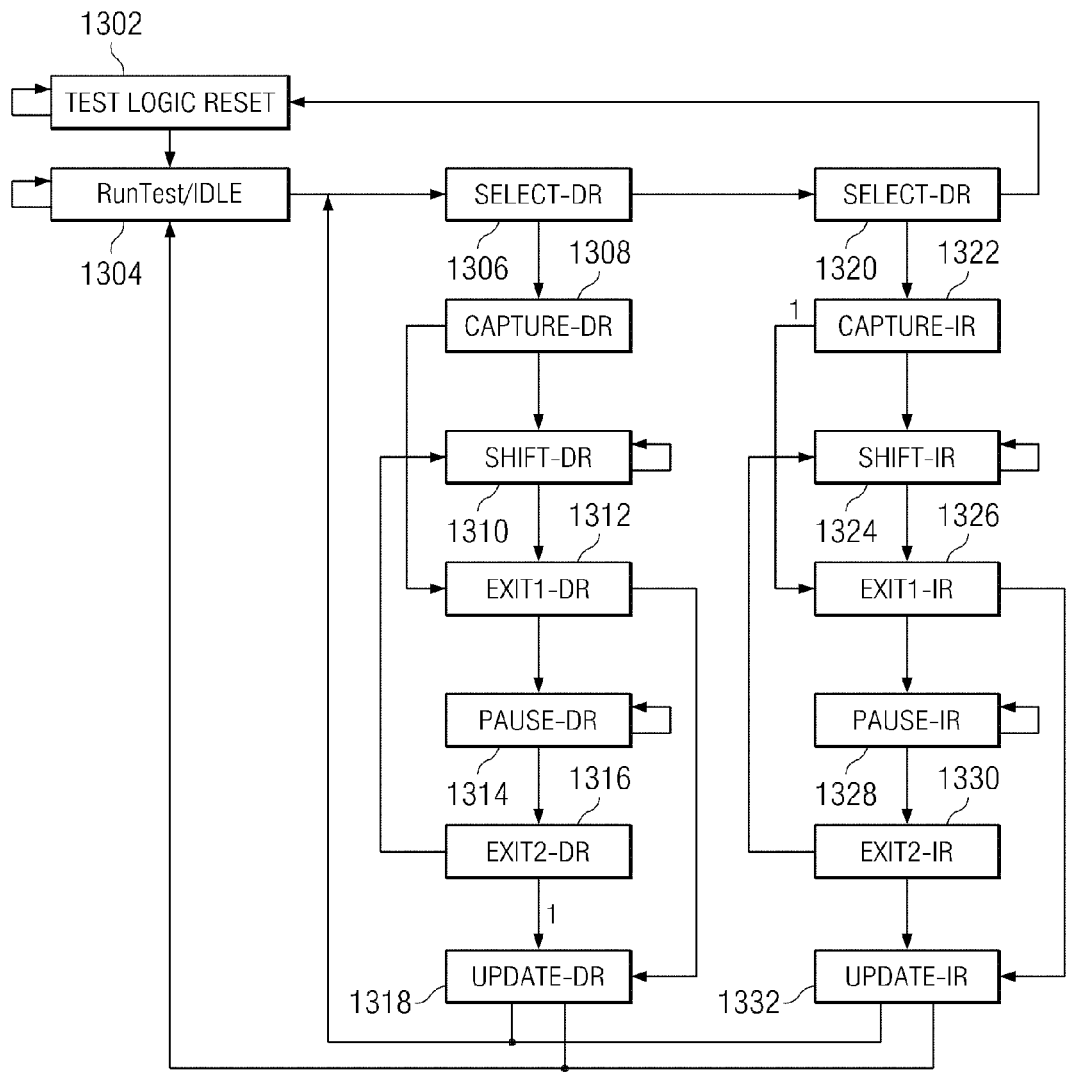
FIG. 13 illustrates the state diagram of the TAP state machine.
Figure 14A:
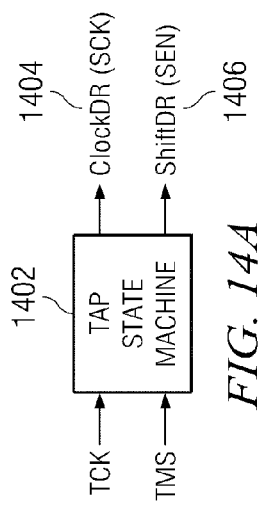
FIG. 14A illustrates a simplified view of the TAP state machine.

FIG. 13 illustrates the operational state diagram of TSM 1204 which comprises the 16 states shown. This TSM state diagram is well known in the industry. When the TSM is not performing an instruction or data register shift operation it can be placed in a Test Logic Reset state 1302 or a Run Test/Idle state 1304. Instruction and data register shift operations are symmetrical in that they both have Capture states 1308 & 1322, shift states 1310 & 1324, Exit1 states 1312 & 1326, Pause states 1314 & 1328, Exit2 states 1316 & 1330, and Update states 1318 & 1332. Data register shift operations are selected by the Select-DR state 1306. Instruction register shift operations are selected by the Select-IR state 1320. The above mentioned undesired delay between when data can be captured following a shift operation can be seen in the number of state transitions it takes to enter the Capture-DR state 1308 after existing from the Shift-DR state 1310. FIGS. 14 and 14A are provided to illustrate this undesired capture delay in more detail.

FIG. 14A illustrates a simplified TSM 1402 having standard TMS and TCK inputs and ClockDR 1404 and ShiftDR 1406 outputs. TSM 1402 has additional standard outputs, but only the standard ClockDR 1404 and ShiftDR 1406 outputs are required to illustrate the undesired capture delay problem. As seen, the ClockDR output 1404 can be coupled to drive SCK as shown in FIGS. 10 & 11 and the ShiftDR output 1406 can be coupled to drive SEN as shown in FIGS. 10 & 11. In most cases, the coupling of ClockDR to SCK and ShiftDR to SEN is performed by an instruction loaded into the instruction register 1206 of the JTAG architecture of FIG. 12.

Figure 14B:
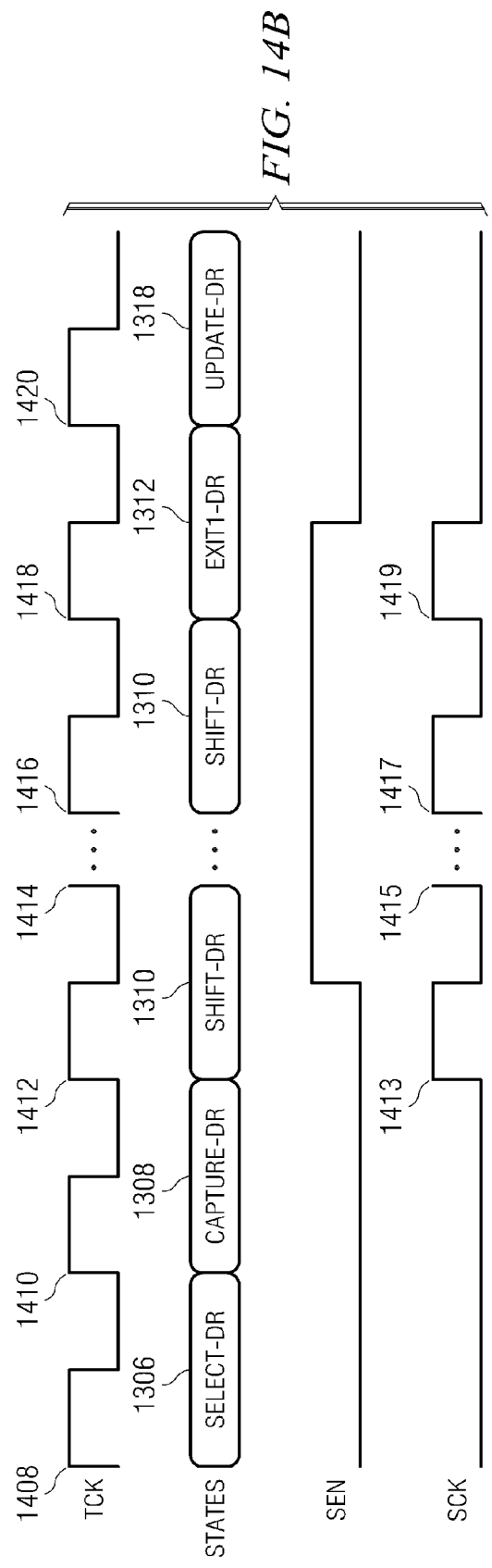
FIG. 14B illustrates transitions through the TAP state machine diagram during scan operations.

FIG. 14B illustrates the timing of using the TSM 1402 to perform a data register shift operation when SEN is coupled to the TSM ShiftDR signal 1406 and SCK is coupled to the TSM ClockDR signal 1404. As seen, the TSM transitions into the Select-DR state 1306 on the rising edge of TCK 1408, the TSM transitions to the Capture-DR state 1308 on the rising edge of TCK 1410, the TSM transitions to the Shift-DR state 1310 and performs the capture operation on the rising edge of TCK 1412 via SCK 1413, the TSM remains in Shift-DR state 1310 shifting data during TCKs 1414-1416 (via SCKs 1415-

1417), TSM transitions to the Exist1-DR state 1312 and performs the last shift operation on the rising edge of TCK 1418 (via SCK 1419), TSM transitions to the Update-DR state 1318 on TCK 1420 then back to the Select-DR state 1306 on TCK 1408 to repeat the capture and shift operation.

As can be seen, it takes four TCK rising edges (1420,1408, 1410,1412) to capture data following the last shift TCK rising edge 1418. This four TCK delay in capturing data after the last shift operation has occurred prevents at-speed or delay testing of the combinational logic. At-speed and delay testing requires that a capture operation be performed immediately after the last shift operation. Therefore faults in combinational logic on slow stimulus to response paths cannot be tested adequately using a TAP 1004 to control the SCK and SEN signals of scan test architectures. As a result, TAPs are seldom used to control scan test architectures. The following FIGS. 15 and 16 illustrate how the scan test architectures of FIGS. 10 and 11 can be altered to eliminate the TAP capture delay described in FIGS. 12, 13, 14 and 14A above.

Figure 15A:
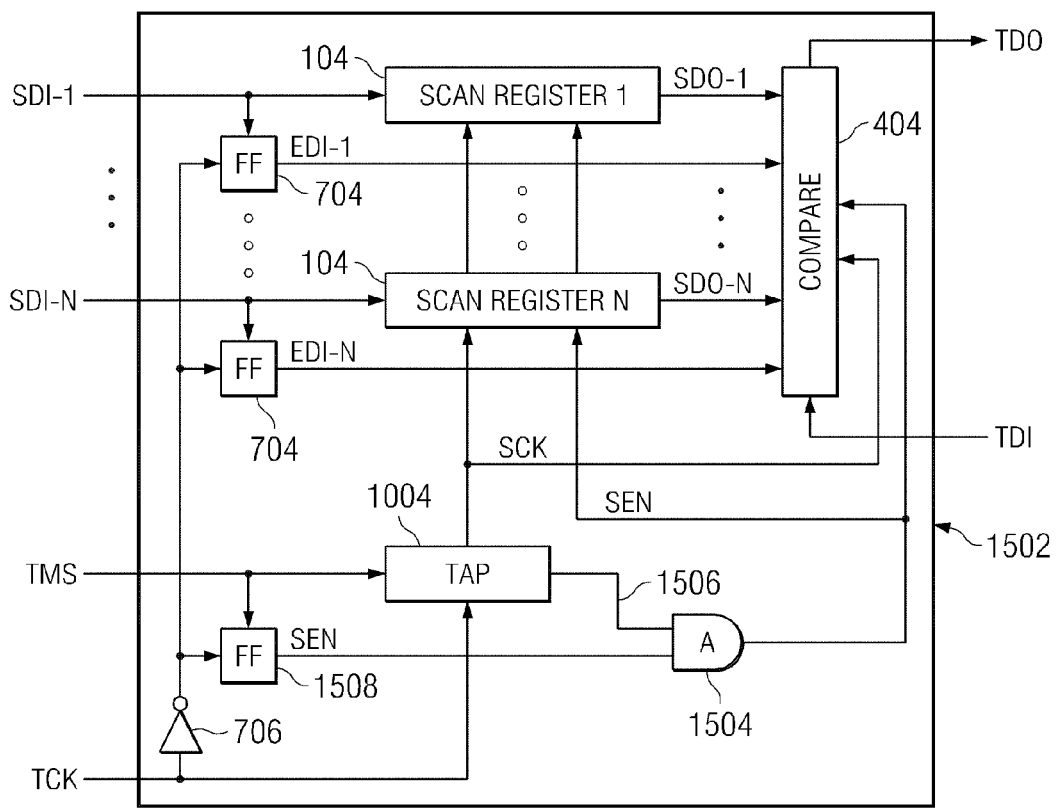
FIG. 15A illustrates a scan architecture using a comparator, expected data inputs, a TAP, and gating to allow improved scan operations according to the disclosure.

FIG. 15A illustrates an embodiment of the disclosure in a device 1502. The scan test architecture of FIG. 15A is the same as the scan test architecture of FIG. 10 with the following exception. A FF 1508 and an And gate 1504 have been added to the architecture. The data input to the FF 1508 is coupled to the TMS input and the clock input of FF 1508 is coupled to the TCK input via inverter 706. The And gate 1504 has an input coupled to the data output of FF 1508, and input coupled to a control signal 1506 output from TAP 1004, and an output coupled to the SEN inputs of the scan registers 104 and compare circuit 404. The SCK signal from the TAP 1004 and the SEN signal from the And gate 1504 control the scan test architecture as previously described in FIG. 10, i.e. when SEN is low, response data from combinational logic is captured into scan registers 104 on the rising edge of SCK and when SEN is high, the scan registers 104 shift data from SDI 1-N to SDO 1-N on the rising edge of SCK while the compare circuit 404 compares the SDO 1-N data from the scan registers against EDI 1-N data from FFs 704 on the rising edge of SCK. The difference between the FIG. 10 and FIG. 15A scan architectures is that the SEN signal is provided by the TMS input, via FF 1508, instead of being provided by the TAP as in FIG. 10. Also the TAP 1004 of FIG. 15A remains in the Shift-DR state 1310 during the scan test operation, instead of transitioning through the data register scan states mentioned in FIG. 14B. During test, the control signal 1506 from TAP 1004 is set high to allow the SEN output from FF 1508 to pass through And gate 1504 to be input to the scan registers 104 and compare circuit 404. The control signal 1506 can be set high by an instruction loaded into the TAP's instruction register 1206. The control signal 1506 may, for example, be coupled to the ShiftDR signal 1406 from TSM 1402 of FIG. 14A in response to the loaded instruction. While an And gate 1504 is shown in FIG. 15A, other types of gating arrangements could be similarly used to gate the SEN signal from FF 1508 on and off.

Figure 15B:
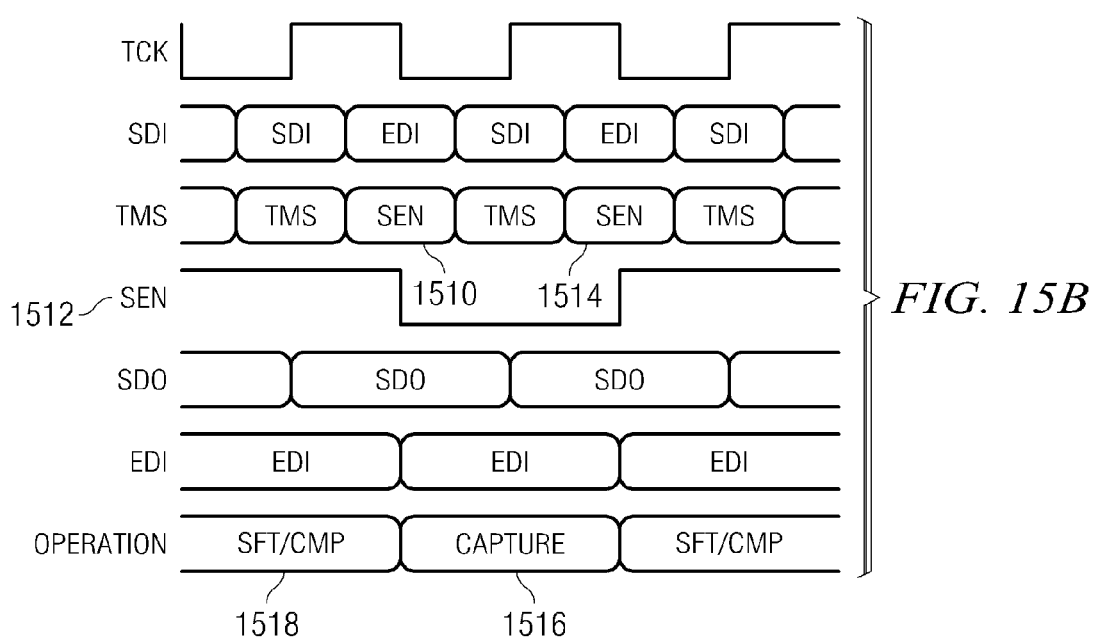
FIG. 15B illustrates the operation of the FIG. 15A scan architecture.

FIG. 15B illustrate the timing operation of the scan test architecture of FIG. 15A. The operation is similar to the operation of the scan architecture of FIG. 10 in that SDI 1-N data is input on the rising edge TCK and EDI 1-N data is input on the falling edge of TCK. The difference in the operation of FIG. 15B is that the SEN signal that controls the capturing of data into the scan registers 104 and the shifting of the scan registers 104 and comparing of the SDO 1-N outputs of the scan registers 104 is provided by the TMS input, instead of by the TAP 1004. As seen, TMS signals are input on the TMS input lead on the rising edge of TCK to control the operation of TAP 1004 and SEN signals are input on the TMS input lead to FF 1508 on the falling edge of TCK to control the capture and shift/compare operations.

As mentioned in FIG. 15A, the TAP 1004 remains in the Shift-DR state 1310 of FIG. 13 during the scan test operation. While in the Shift-DR state 1310, the TAP 1004 couples the free running TCK input to the SCK output to continuously output SCKs to the scan registers 104 and compare circuit 404. As seen in the timing diagram, at predetermined times during the continuously running SCK a connected tester inputs a SEN signal 1510 on TMS to set the SEN output 1512 of And gate 1504 low, which causes the scan registers 104 to cease shifting and capture data from combinational logic under test. Also the low on the SEN signal disables the compare operation of the compare circuit 404. After setting the SEN signal low, the tester inputs a SEN signal 1514 on TMS to set the SEN output 1512 of And gate 1504 back high to cause the scan registers 104 to shift data and the compare circuit to compare the SDO 1-N outputs of the scan registers 104 against the EDI 1-N inputs from the tester.

It should be understood that the tester may set the SEN signal 1512 low for more than one SCK to allow the scan register 104 to perform back-to-back capture operations if desired.

It should also be understood that while the example of FIG. 15A and other Figures to follow describe a logic low state on SEN for capture and a logic high state on SEN for shift and compare operations, the disclosure is not limited to a particular logic state implementation for SEN. Indeed, the disclosure may be designed according to any desired logical realization to where one of the logical SEN states performs the step of capturing data and the other logical SEN state performs the step of, (1) shifting and comparing the captured data, (2) shifting and compressing the captured data, or (3) shifting the captured data out of the device.

As can be seen in the timing diagram the scan test architecture of FIG. 15A allows a capture operation 1516 to occur immediately after a last shift/compare operation 1518. This immediate capture operation at the end of a scan operation is enabled by having the tester provide the SEN signal 1512 instead of having the TAP 1004 provide the SEN signal 1512. Thus the scan test architecture of FIG. 15A overcomes the capture delay problem mentioned in regard to the scan test architecture of FIG. 10, which advantageously enables the scan test architecture of FIG. 15A to perform at-speed and/or delay scan test operations.

Figure 16A:
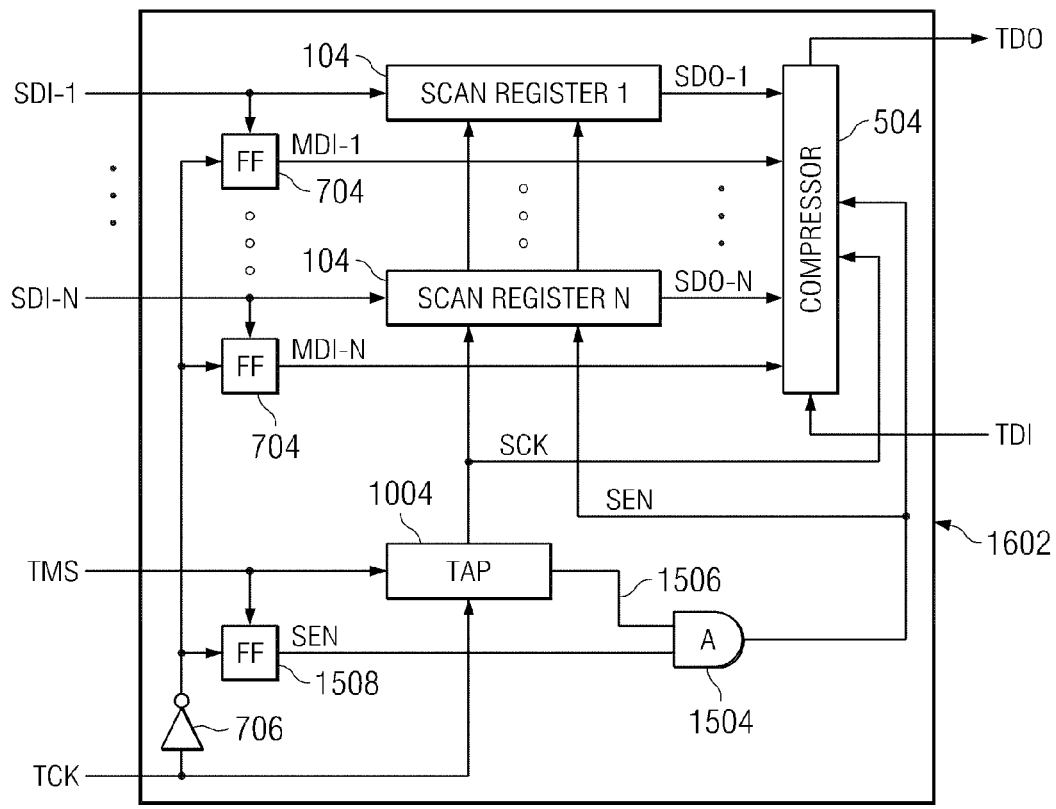
FIG. 16A illustrates a scan architecture using a compressor, mask data inputs, a TAP, and gating to allow improved scan operations according to the disclosure.

FIG. 16A illustrates an embodiment of the disclosure in a device 1602. The scan test architecture of FIG. 16A is the same as the scan test architecture of FIG. 15 with the exception that a compressor circuit 504 has been substituted for the compare circuit 404 of FIG. 15. The compressor circuit 504 is a multiple input shift register (MISR) circuit, which is a known type of data compression circuit. Also FFs 704 input MDI 1-N data from a tester to compressor circuit 504 instead of EDI 1-N data as in FIG. 15. The SCK signal from the TAP 1004 and the SEN signal from the And gate 1504 control the scan test architecture as previously described in FIG. 15. When SEN is low response data from combinational logic is captured into scan registers 104 on the rising edge of SCK and when SEN is high the scan registers 104 shift data from SDI 1-N to SDO 1-N on the rising edge of SCK while the compressor circuit 504 compresses unmasked SDO 1-N data from the scan registers into a signature on the rising edge of SCK.

As with the difference between the FIG. 10 and FIG. 15 scan test architectures, the difference between the FIG. 11 and FIG. 16A scan architectures is that the SEN signal is provided by the TMS input, via FF 1508, instead of being provided by the TAP as in FIG. 11. As with the TAP 1004 of FIG. 15, the TAP 1004 of FIG. 16A remains in the Shift-DR state 1310 during the scan test operation, instead of transitioning through the data register scan states mentioned in FIG. 14A. During test, the control signal 1506 from TAP 1004 is set high to allow the SEN output from FF 1508 to pass through And gate 1504 to be input to the scan registers 104 and compressor circuit 504. The control signal 1506 can be set high by an instruction loaded into the TAP's instruction register 1206. While an And gate 1504 is shown in FIG. 15, other types of gating, such as but not limited to OR, NAND, or NOR gating, could be used to gate the SEN signal on and off.

Figure 16B:
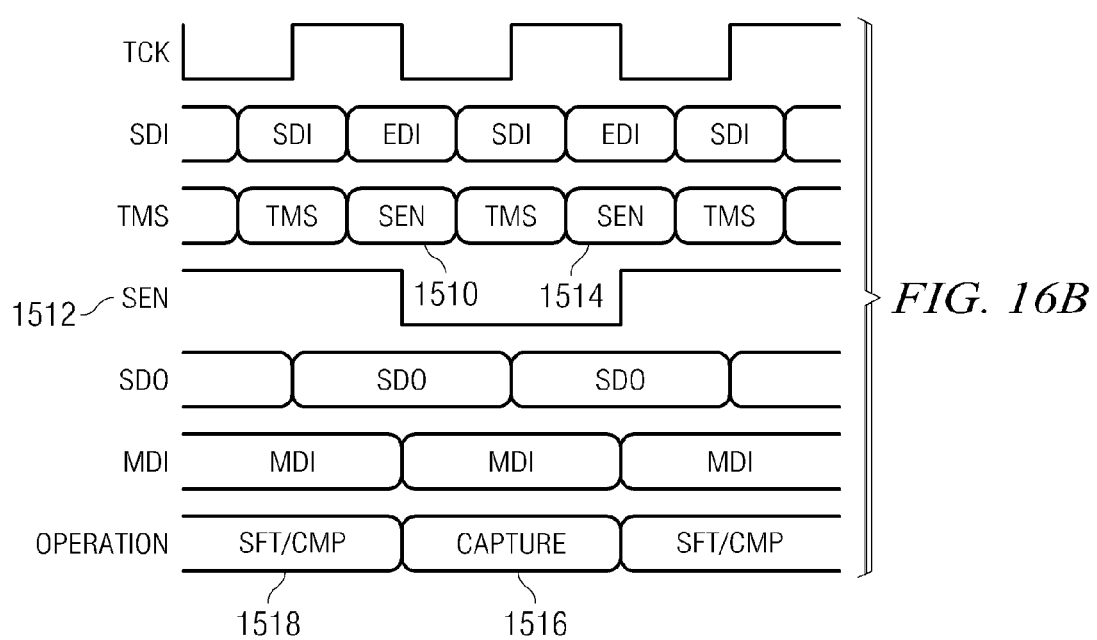
FIG. 16B illustrates the operation of the FIG. 16A scan architecture.

FIG. 16B illustrate the timing operation of the scan test architecture of FIG. 16A. The operation is the same as the operation described in FIG. 15B with the exception that the SEN signal 1512 controls the compressor circuit 504 of FIG. 16A instead of the compare circuit 404 of FIG. 15. As seen, the SEN signal 1512 that controls the capturing of data into the scan registers 104 and the shifting of the scan registers 104 and compressing of masked and unmasked SDO 1-N outputs of the scan registers 104 is provided by the TMS input, instead of by the TAP 1004. TMS signals are input on the TMS input on the rising edge of TCK to control the operation of TAP 1004 and SEN signals are input on the TMS input to FF 1508 on the falling edge of TCK to control the capture and shift/compress operations.

As mentioned above, the TAP 1004 remains in the Shift-DR state 1310 of FIG. 13 during the scan test operation. While in the Shift-DR state 1310, the TAP 1004 couples the free running TCK input to the SCK output to continuously output SCKs to the scan registers 104 and compressor circuit 504. As seen in the timing diagram, at predetermined times during the continuously running SCK a connected tester inputs a SEN signal 1510 on TMS to set the SEN output 1512 of And gate 1504 low, which causes the scan registers 104 to capture data and disables the compress operation of the compressor circuit 504. After setting the SEN signal low, the tester inputs a SEN signal 1514 on TMS to set the SEN output 1512 of And gate 1504 back high to cause the scan registers 104 to shift data and the compressor circuit to compress masked and unmasked SDO 1-N outputs of the scan registers 104 into a signature.

As can be seen in the timing diagram the scan test architecture of FIG. 16A allows a capture operation 1516 to occur immediately after a last shift/compress operation 1518. This immediate capture operation at the end of a scan operation is enabled by having the tester provide the SEN signal 1512 instead of having the TAP 1004 provide the SEN signal 1512. Thus the scan test architecture of FIG. 15 overcomes the capture delay problem mentioned in regard to the scan test architecture of FIG. 11, which advantageously enables the scan test architecture of FIG. 16A to perform at-speed and/or delay test operations.

Figure 17A:
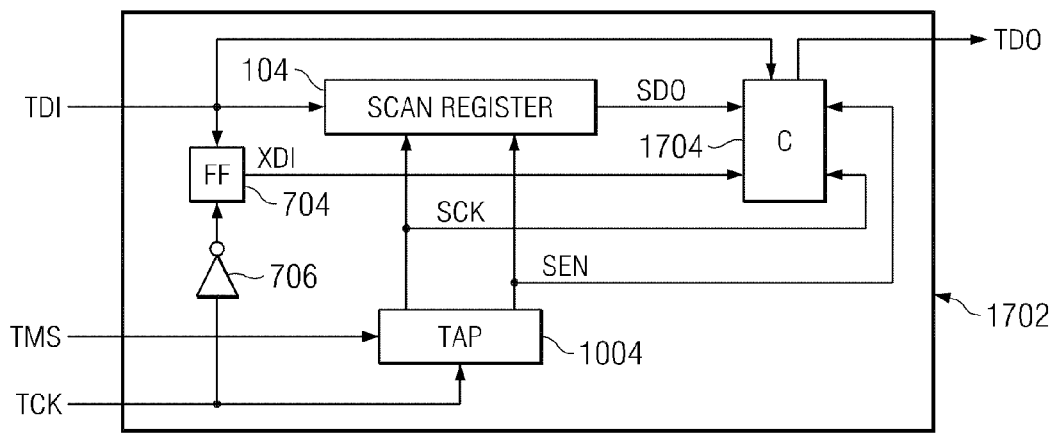
FIG. 17A illustrates a single scan register architecture using a comparator or compressor, expected or mask data inputs, and a TAP according to the disclosure.

FIG. 17A illustrates an embodiment of the present disclosure in a device 1702. The scan test architecture of device 1702 comprises a scan register 104, a TAP 1004, a FF 704, and a circuit 1704. The scan register has an input coupled to the devices TDI input, an input coupled to SCK from TAP 1004, an input coupled to SEN from TAP 1004, and a SDO output coupled to circuit 1704. Circuit 1704 has an input coupled to the scan register SDO output, an input coupled to the output of FF 704, an input coupled to SCK, an input coupled to SEN, an input coupled to the devices TDI input lead and an output coupled to the devices TDO output lead. The TAP receives control from TMS and TCK device inputs. The FF 704 has a data input coupled to TDI, a clock input coupled to TCK via inverter 706, and an output coupled to circuit 1704. Circuit 1704 can be a compare circuit 404 or a compressor circuit 504. If circuit 1704 is a compare circuit 404, the data output from FF 704 will EDI data to be used by the compare circuit 404 as previously described. If circuit 1704 is a compressor circuit 504, the data output from FF 704 will be MDI data to be used by the compressor circuit 504 as previously described. The XDI term used on the output of FF 704 of FIG. 17 is to indicate that the output can be either EDI data or MDI data. At the end of a test, the contents of circuit 1704, compare results or signature, can be scan out of the device 1702 via the JTAG TDI to TDO scan path through circuit 1704.

Figure 17B:
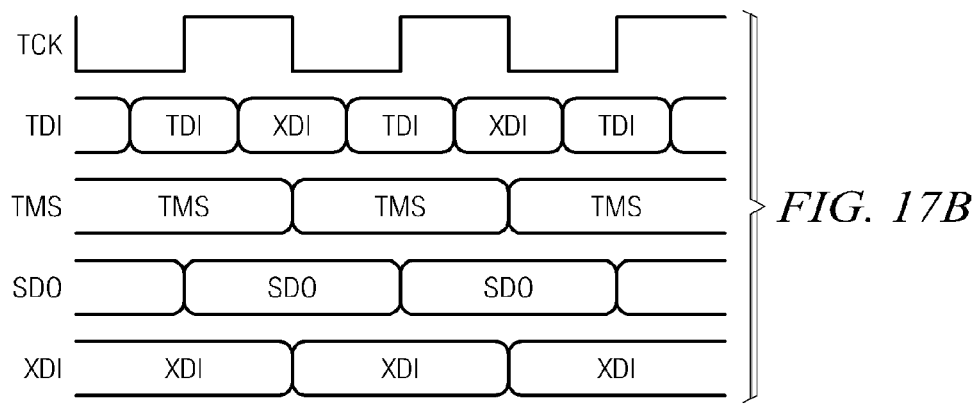
FIG. 17B illustrates the operation of the FIG. 17A scan architecture.

FIG. 17B illustrates the timing operation of the scan test architecture of FIG. 17A. The TDI input lead of device 1702 inputs TDI data to the scan register 104 on the rising edge of TCK and XDI data to FF 704 on the falling edge of TCK. The TMS input lead inputs TMS signals to the TAP 1004 on the rising edge of TCK. If circuit 1704 is a compare circuit 404, the XDI data from FF 704 will be EDI data used to compare against the SDO data output from scan register 104. If circuit 1704 is a compressor circuit 504, the XDI data from FF 704 will be MDI data used to mask or unmask the SDO data output from scan register 104 as previously described.

Figure 18A:
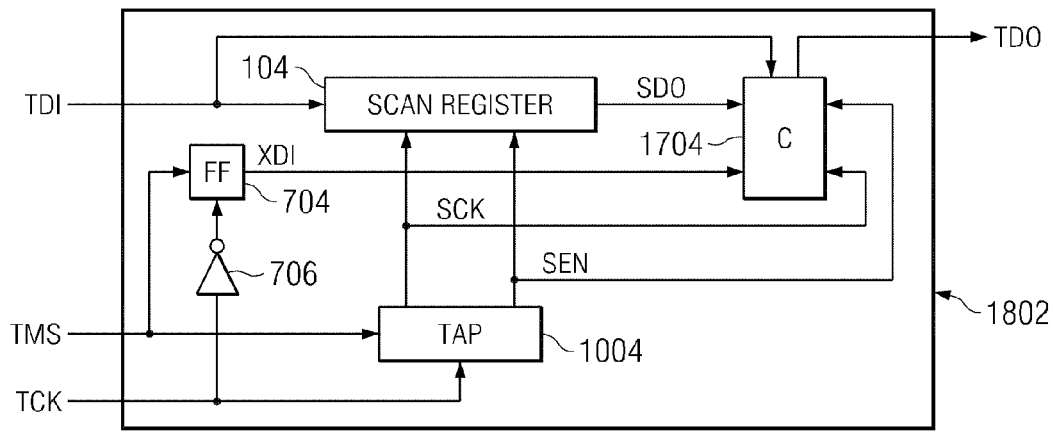
FIG. 18A illustrates another single scan register architecture using a comparator or compressor, expected or mask data inputs, and a TAP according to the disclosure.
Figure 18B:
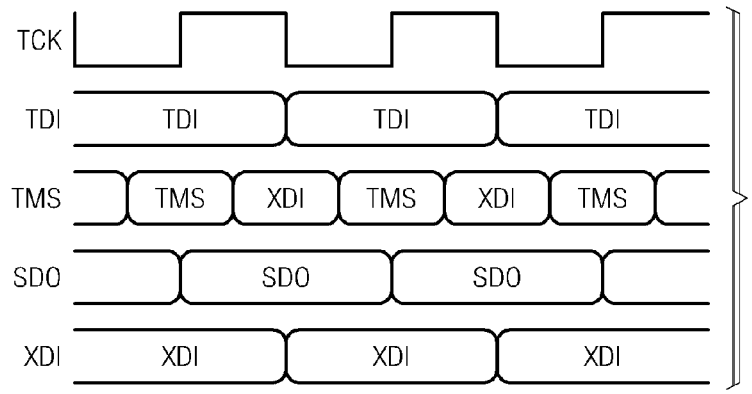
FIG. 18B illustrates the operation of the FIG. 18A scan architecture.

FIG. 18A illustrates a device 1802 containing the scan test architecture of FIG. 17A modified to where the XDI signal to circuit 1704 is provided by the device TMS input lead via FF 704 instead of by the device TDI input lead of FIG. 17A. As seen in the timing diagram of FIG. 18A, the operation of the scan test architecture of FIG. 18A is identical to that of FIG. 17A with the exception that the XDI signal is provided by the TMS input lead.

Figure 19A:
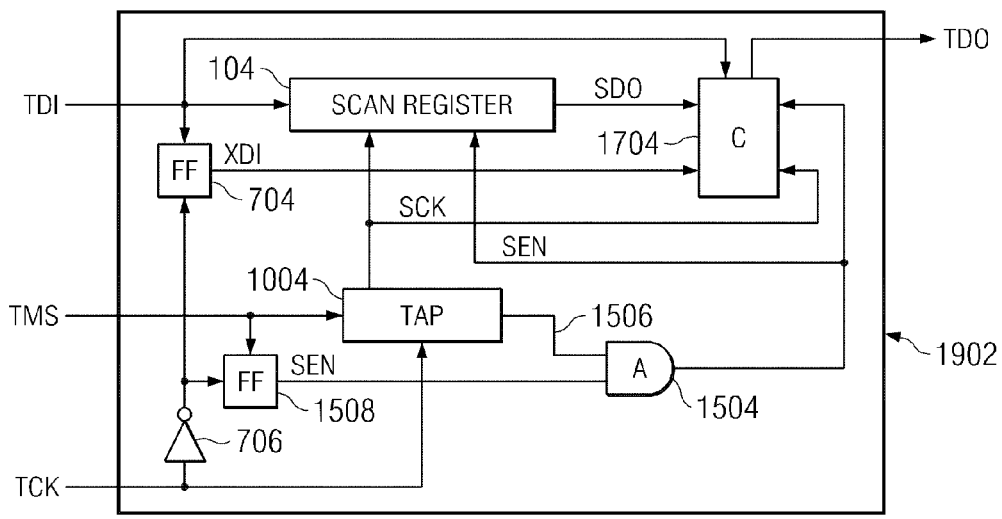
FIG. 19A illustrates a single scan register architecture using a comparator or compressor, expected or mask data inputs, a TAP, and gating to allow improved scan operations according to the disclosure.

FIG. 19A illustrates an embodiment of the present disclosure in a device 1902. The scan test architecture of device 1902 comprises a scan register 104, a TAP 1004, a FF 704, a FF 1508, an And gate 1504, and a circuit 1704. The scan register has an input coupled to the devices TDI input lead, an input coupled to SCK from TAP 1004, an input coupled to the SEN output from And gate 1504, and a SDO output coupled to circuit 1704. Circuit 1704 has an input coupled to the scan register SDO output, an input coupled to the XDI output of FF 704, an input coupled to the SCK output of TAP 1004, an input coupled to the SEN output of And gate 1504, an input coupled to the devices TDI input lead and an output coupled to the devices TDO output lead. And gate 1504 has an input coupled to the SEN output of FF 1508, an input coupled to a control signal 1506 from TAP 1004, and an output coupled to scan register 104 and circuit 1704. The TAP receives control from TMS and TCK device inputs. The FF 704 has a data input coupled to TDI, a clock input coupled to TCK via inverter 706, and an output coupled to circuit 1704. As mentioned in FIG. 17, circuit 1704 can be a compare circuit 404 or a compressor circuit 504. If circuit 1704 is a compare circuit 404, the XDI data output from FF 704 will EDI data to be used by the compare circuit as previously described. If circuit 1704 is a compressor circuit 504, the XDI data output from FF 704 will be MDI data to be used by the compressor circuit as previously described. At the end of a test, the contents of circuit 1704, compare results or signature, can be scan out of the device 1902 via the JTAG TDI to TDO scan path through circuit 1704.

Figure 19B:
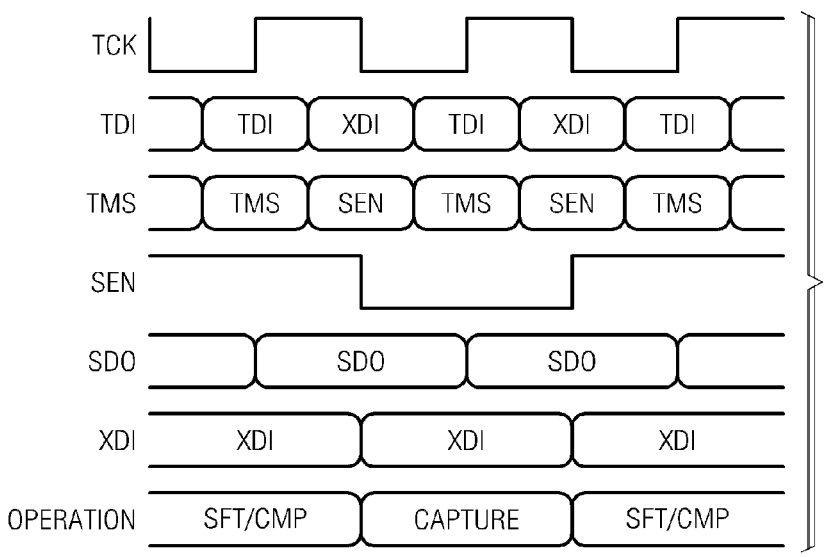
FIG. 19B illustrates the operation of the FIG. 19A scan architecture.

FIG. 19B illustrates the timing operation of the scan test architecture of FIG. 19A. The TDI input lead of device 1902 inputs TDI data to the scan register 104 on the rising edge of TCK and XDI data to FF 704 on the falling edge of TCK. The TMS input lead of device 1902 inputs TMS signals to TAP 1004 on the rising edge of TCK and SEN control signals to FF 1508 on the falling edge of TCK. If circuit 1704 is a compare circuit 404, the XDI data from FF 704 will be EDI data used to compare against the SDO data output from scan register 104. If circuit 1704 is a compressor circuit 504, the XDI data from FF 704 will be MDI data used to mask or unmask the SDO data output from scan register 104 as previously described. The SEN control signal from FF 508 is used to operate the SEN output of And gate 1504 to control the operation of scan register 104 and circuit 1704 as previously described in regard to FIG. 15.

Figure 20A:
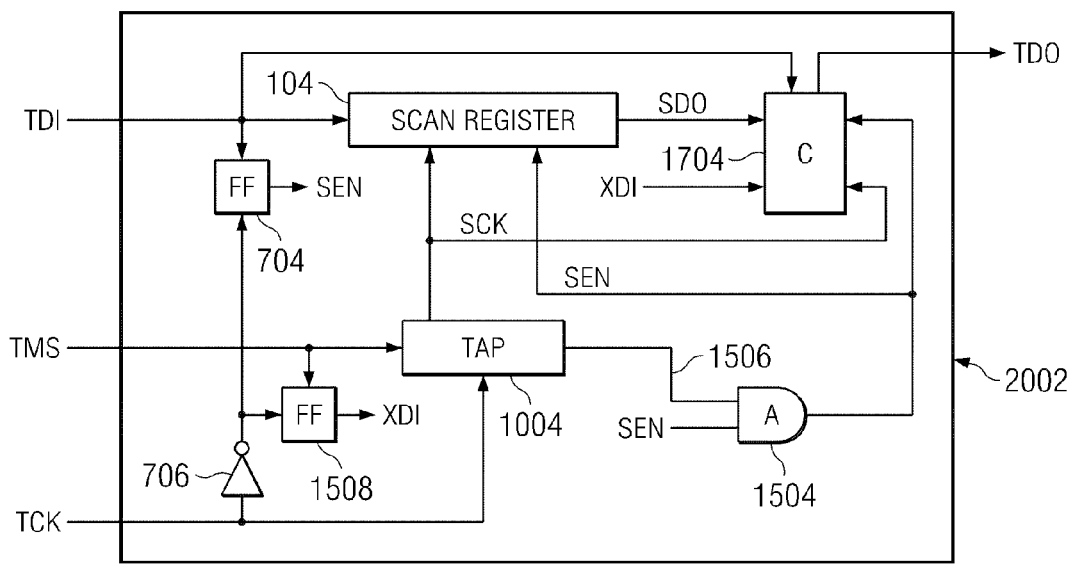
FIG. 20A illustrates another single scan register architecture using a comparator or compressor, expected or mask data inputs, a TAP, and gating to allow improved scan operations according to the disclosure.
Figure 20B:
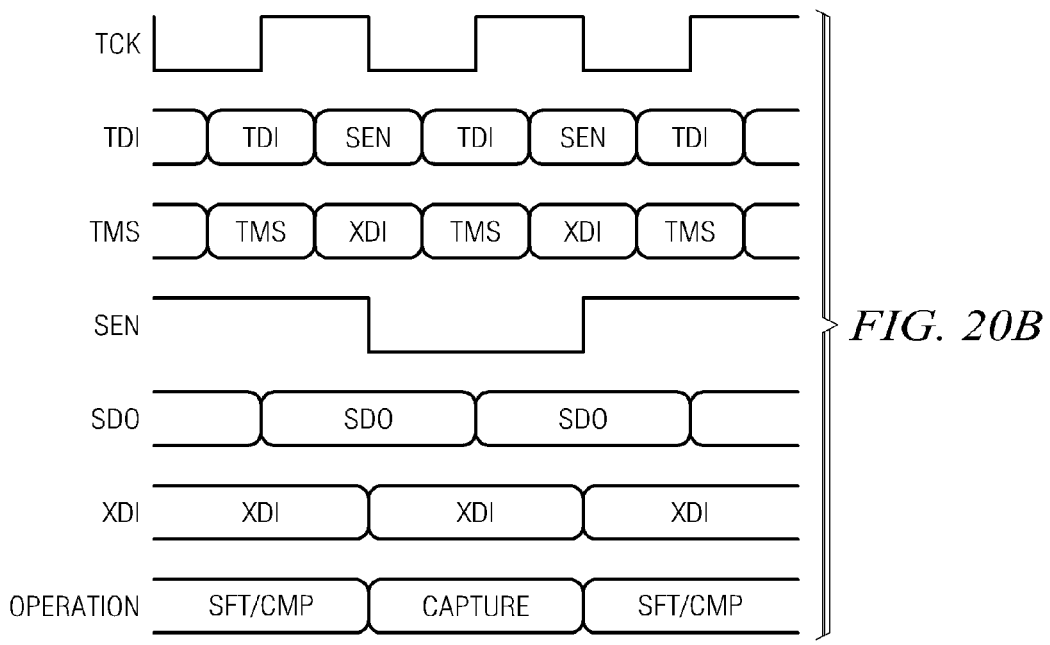
FIG. 20B illustrates the operation of the FIG. 20A scan architecture.

FIG. 20A illustrates a device 2002 containing the scan test architecture of FIG. 19A modified to where the XDI signal is provided to circuit 1704 by the TMS input lead via FF 1508 and the SEN signal is provided to scan register 104 and circuit 1704 by the TDI input lead via FF 704. As seen in the timing diagram of FIG. 20B, the operation of the scan test architecture of FIG. 20 is identical to that of FIG. 19 with the exception that the XDI signal is provided by the TMS input lead and the SEN signal is provided by the TDI input lead.

Figure 21A:
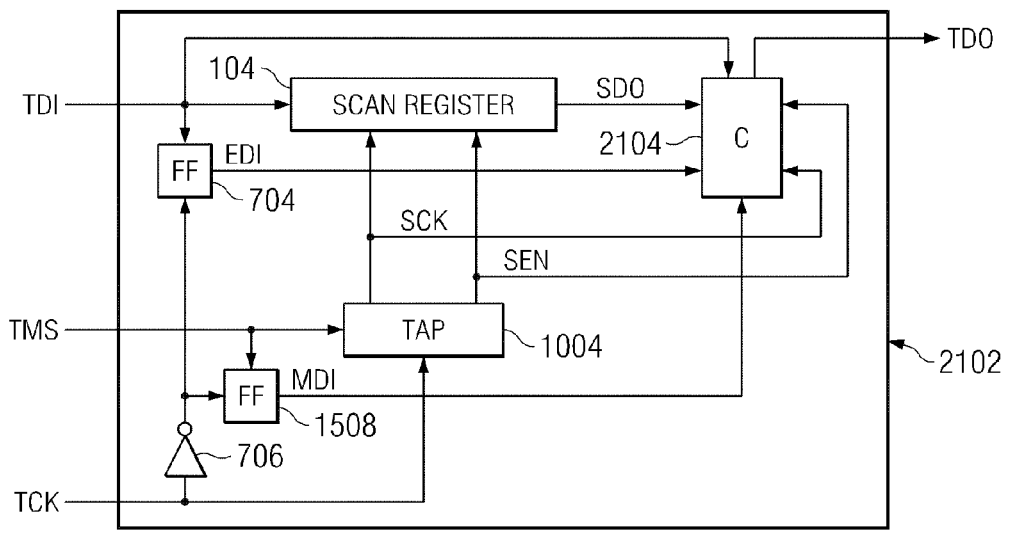
FIG. 21A illustrates a single scan register architecture using a comparator, expected data input, mask data input, and a TAP according to the disclosure.

FIG. 21A illustrates an embodiment of the present disclosure in a device 2102. The scan test architecture of device 2102 comprises a scan register 104, a TAP 1004, a FF 704, a FF 1508 and a compare circuit 2104. The scan register has an input coupled to the devices TDI input lead, an input coupled to SCK from TAP 1004, an input coupled to SEN from TAP 1004, and a SDO output coupled to compare circuit 2104. Compare circuit 2104 has an input coupled to the scan register SDO output, an input coupled to the EDI output of FF 704, an input coupled to the MDI output of FF 1508, an input coupled to SCK, an input coupled to SEN, an input coupled to the devices TDI input lead and an output coupled to the devices TDO output lead. The TAP receives control from TMS and TCK device inputs. The FF 704 has a data input coupled to TDI, a clock input coupled to TCK via inverter 706, and an EDI output coupled to compare circuit 2104. The FF 1508 has a data input coupled to TMS, a clock input coupled to TCK via inverter 706, and an MDI output coupled to compare circuit 2104. Compare circuit 2102 differs from compare circuit 404 in that it inputs both a EDI and MDI signal. The EDI signal is used to compare against the SDO output from scan register 104 and the MDI signal is used to mask off the result of the compare operation between the EDI and SDO signals. At the end of a test, the contents of compare circuit 2104 can be scanned out of the device 2102 via the JTAG TDI to TDO scan path through compare circuit 2104.

Figure 21B:
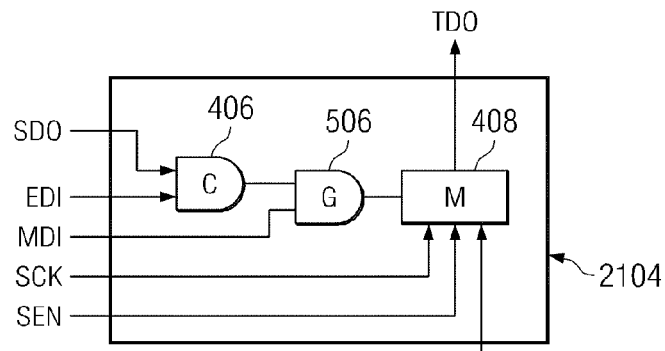
FIG. 21B illustrates an example comparator circuit having expected and mask data inputs.

FIG. 21B illustrates one example implementation of compare circuit 2104. The compare circuit 2104 includes a comparing circuit 406, such as an XOR gate, that inputs an SDO signal from scan register 104 and an EDI signal from a tester via FF 704 and outputs a comparison result signal. The compare circuit 2104 includes a masking gate 506, such as an AND gate, that inputs the comparison result signal from comparing circuit 408 and a MDI signal from a tester via FF 1508, and outputs a signal to a memory circuit 408. The memory circuit 408 operates in response to the SCK and SEN signals to evaluate the signal output from masking gate 506 to determine whether a SDO to EDI comparison passes or fails during the test. Some SDO outputs from scan register 104 may be in unknown states. It is not possible to use the EDI input to compare against SDO outputs that are unknown. Whenever an unknown SDO signal is output from the scan register 104, the tester will input a MDI signal, via FF 1508, to the masking gate 506 to force the output of masking gate 506 to a compare pass state, independent of the actual compare output from compare circuit 406. The memory circuit 408 treats a forced compare pass state from mask gate 506 as a passing compare operation between SDI and EDI.

At the end of the test, the test comparison results of the memory circuit 408 can be accessed via the JTAG TDI and TDO scan path signals. The compare circuit 408 can be of any complexity. For example the compare circuit 408 can be as simple as a flip flop that latches a state upon the first detection of a comparison failure signal or the compare circuit 408 can be more sophisticated, perhaps including multiple fail detection memory latches and a failure logging circuit that indicates which compare operation(s) failed.

Figure 21C:
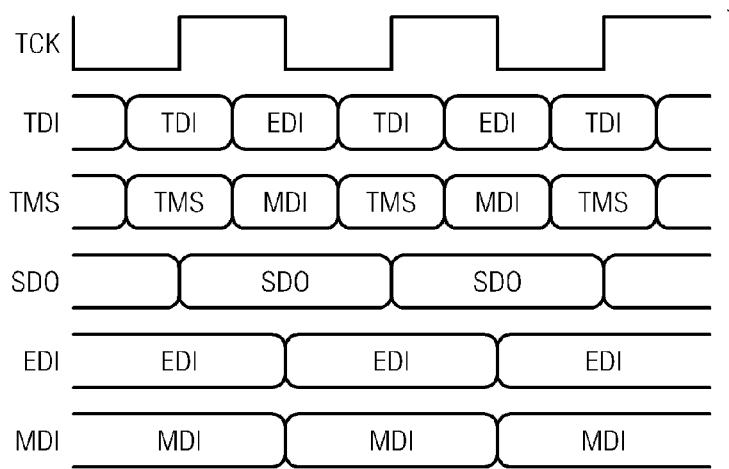
FIG. 21C illustrates the operation of the FIG. 21A scan architecture.

FIG. 21C illustrates the timing operation of the scan test architecture of FIG. 21A. The TDI input lead of device 2102 inputs TDI data to the scan register 104 on the rising edge of TCK and EDI data to FF 704 on the falling edge of TCK. The TMS input lead inputs TMS signals to the TAP 1004 on the rising edge of TCK and MDI data to FF 1508 on the falling edge of TCK. The tester transitions the TAP 1004 through the data register shifting states of FIG. 13, as described in FIG. 14A, to perform the capture and shift/compare operations. The capture and shift/compare operations repeat until the test is complete. At the end of the test, the test results stored in the memory circuit 2104 can be shifted out to the tester for examination via the JTAG TDI and TDO scan path.

Figure 22A:
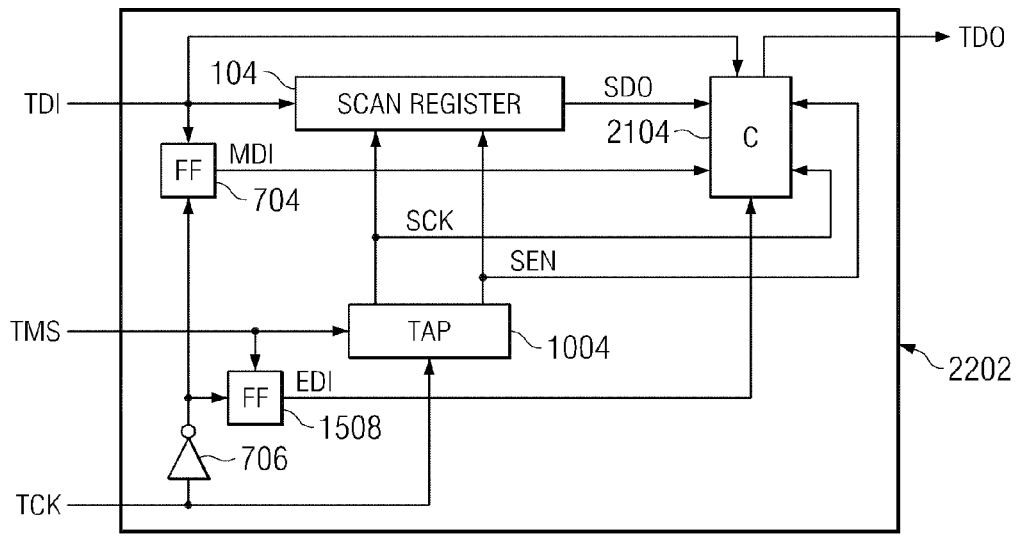
FIG. 22A illustrates another single scan register architecture using a comparator, expected data input, mask data input, and a TAP according to the disclosure.
Figure 22B:
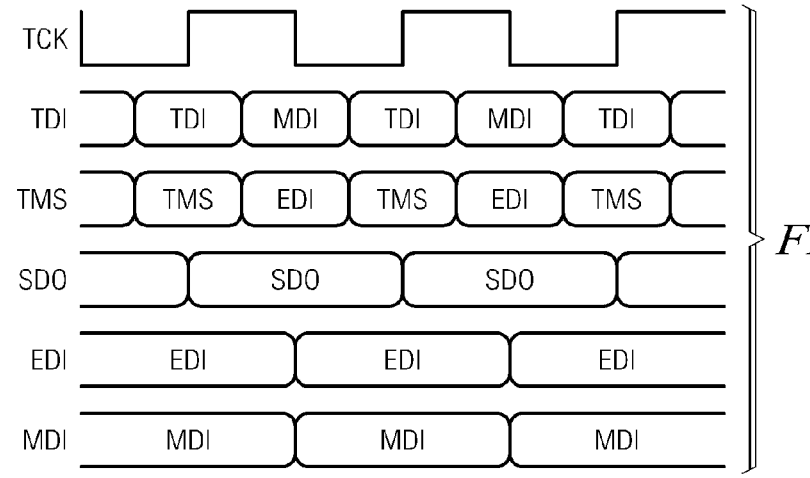
FIG. 22B illustrates the operation of the FIG. 22A scan architecture.

FIGS. 22A and 22B are provided to illustrate that the scan test architecture and operation described in regard to FIGS. 21A, 21B, and 21C can be modified to operate in a device 2202 whereby the TDI input lead provides the MDI data input to compare circuit 2104, via FF 704, and the TMS input lead provides the EDI data input to compare circuit 2104, via FF 1508. With the exception that EDI is provided by the TMS input lead and MDI is provided by the TDI input lead, the scan architecture and operation of FIGS. 22A and 22B is the same as the scan architecture and operation of FIGS. 21A, 21B and 21C.

Figure 23A:
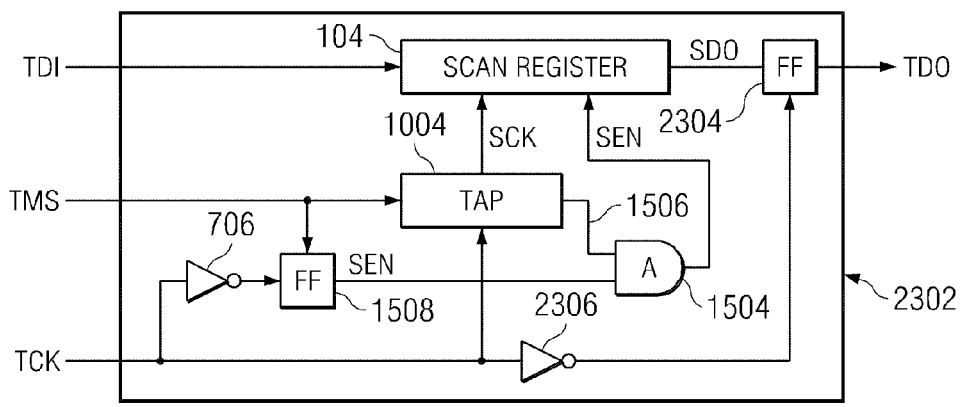
FIG. 23A illustrates a single scan register architecture using a TAP and gating to allow improved scan operations according to the disclosure.

FIG. 23A illustrates an embodiment of the present disclosure in a device 2302. The scan test architecture of device 2302 comprises a scan register 104, a TAP 1004, an And gate 1504, FFs 1508 and 2304, and inverters 706 and 2306. The scan register has an input coupled to the devices TDI input lead, an input coupled to SCK from TAP 1004, an input coupled to the SEN signal from And gate 1504, and a SDO output coupled to the TDO output lead, via FF 2304. According to the JTAG (1149.1) standard, the TDO output of a device is to be registered on the falling edge of TCK. To meet this falling edge requirement, FF 2304 is placed in the data path between scan register 104 SDO output and the device TDO output lead and clocked by TCK via inverter 2306. The inversion function of inverter 2306 could be performed by inverter 706 if desired which would eliminate the need of inverter 2306.

It should be understood that the disclosure is not limited to requiring FF 2304 in the TDO path and it could be removed, along with inverter 2306, if so desired to provide a non-registered path between the scan register's SDO output and the device's TDO output lead.

The TAP 104 receives control from the TMS and TCK device input leads. The FF 1508 has a data input coupled to TMS, a clock input coupled to TCK via inverter 706, and a SEN output coupled to scan register 104 via And gate 1504. The SEN output from And gate 1504 is used to control when the scan register captures and shifts data. As mentioned in regard to FIG. 15, using the SEN output of FF 1508 to control when the scan register 104 captures and shifts data instead of using the SEN output from TAP 1004 eliminates the undesired delay between a last shift operation and the capture operation.

During test, the TAP 1004 is transitioned into and remains in the Shift-DR state 1310 of FIG. 13. Control signal 1506 is set high during the Shift-DR state 1310 to allow the And gate 1504 to pass the SEN signal from FF 1508 to scan register 104. As mentioned, the control signal 1506 could be the ShiftDR signal 1406 of FIG. 14. While the TAP is in the Shift-DR state 1310 and the SEN signal from FF 1508 is high, the scan register 104 shifts data to and from a tester via the TDI and TDO device leads. During the shifting of data, the SEN signal from FF 1508 is periodically set low, via the TMS input lead, to cause the scan register to capture response data from combinational logic under test. At the end of a test, the TAP transitions out of the Shift-DR state 1310 and sets the control signal 1506 low, inhibiting And gate 1504 from passing the SEN signal from FF 1508 to scan register 104.

Figure 23B:
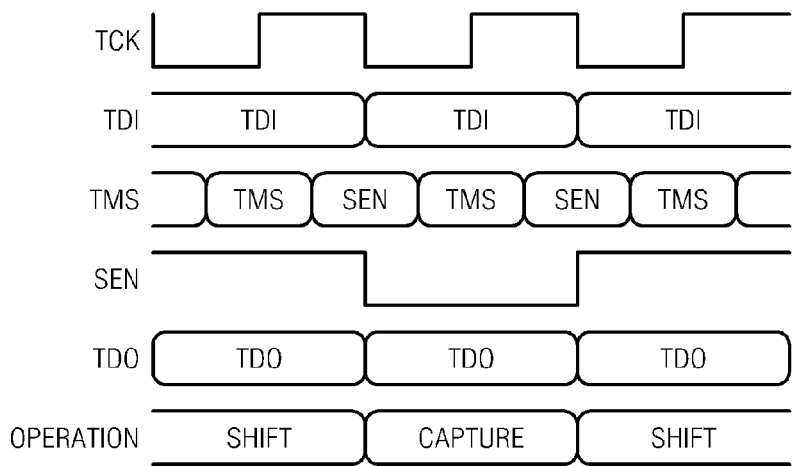
FIG. 23B illustrates the operation of the FIG. 23A scan architecture.

FIG. 23B illustrates the timing operation of the scan test architecture of FIG. 23A. The TDI input lead of device 2302 inputs TDI data from a tester to the scan register 104 on the rising edge of TCK and the TDO output lead of device 2302 outputs TDO data to a tester from the scan register 104 on the falling edge of TCK. The TMS input lead inputs TMS signals to the TAP 1004 on the rising edge of TCK and SEN control signals to FF 1508 on the falling edge of TCK.

Figure 24A:
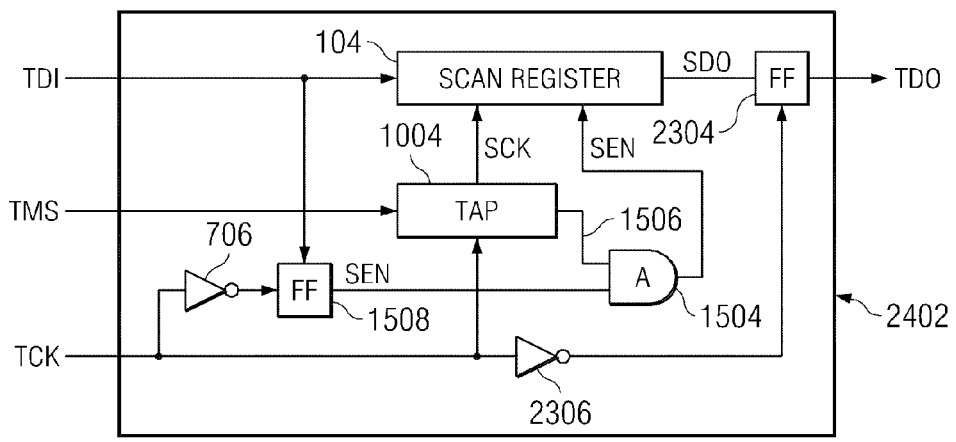
FIG. 24A illustrates another single scan register architecture using a TAP and gating to allow improved scan operations according to the disclosure.
Figure 24B:
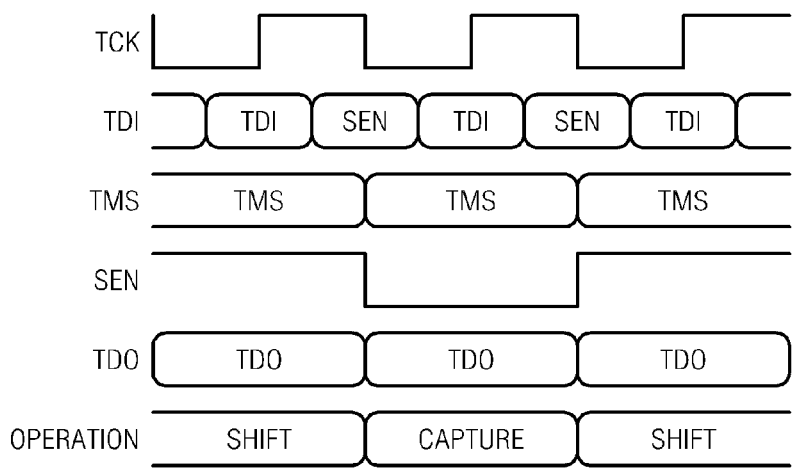
FIG. 24B illustrates the operation of the FIG. 24A scan architecture.

FIGS. 24A and 24B are provided to illustrate that the scan test architecture and operation described in regard to FIGS. 23A and 23B can be modified to operate in a device 2402 whereby the TDI input lead provides the SEN control signal to scan register 104 via FF 1508. With the exception that the SEN control signal is provided by the TDI input lead instead of by the TMS input lead, the scan architecture and operation of FIGS. 24A and 24B is the same as the scan architecture and operation of FIGS. 23A and 23B.

As seen, the device scan test architectures of FIGS. 17-24 only use the TDI, TMS, TCK and TDO signal leads of the JTAG (IEEE 1149.1) standard. Since the JTAG TDI, TMS, TCK and TDO signal leads are dedicated device signal leads, i.e. not shared with functional device signal leads as are the SDI and SDO signals of previous Figures, these scan test architectures can be accessed to test the devices at any point in the device's life cycle. For example, a device manufacturer can access the scan test architectures to test the device during its design and manufacture and the customer purchasing the device can access the scan test architecture to test the device in the customer's system application.

Figure 25A:
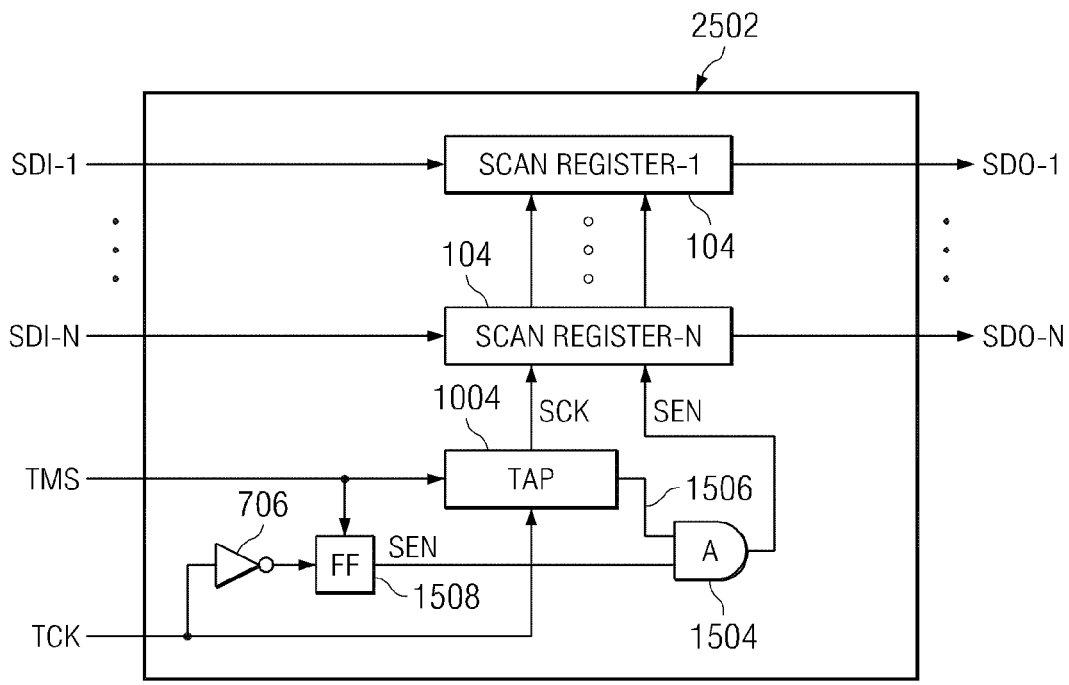
FIG. 25A illustrates a parallel scan register architecture using a TAP and gating to allow improved scan operations according to the disclosure.

FIG. 25A illustrates an embodiment of the present disclosure in a device 2502. The scan test architecture of device 2502 comprises scan registers 1-N 104, a TAP 1004, an And gate 1504, and inverter 706. During test the scan registers 1-N have inputs coupled to the SDI 1-N device input leads, an input coupled to SCK from TAP 1004, an input coupled to the SEN signal from And gate 1504, and outputs coupled to the SDO 1-N device output leads. The TAP 104 receives control from the TMS and TCK device input leads. The FF 1508 has a data input coupled to TMS, a clock input coupled to TCK via inverter 706, and a SEN output coupled to the scan registers 1-N 104 via And gate 1504. The SEN output from And gate 1504 is used to control when the scan registers 1-N capture and shift data. As mentioned in regard to FIG. 15, using the SEN output of FF 1508 to control when the scan registers 1-N 104 capture and shift data instead of using the SEN output from TAP 1004 eliminates the delay between a last shift operation and the capture operation.

During test, the TAP 1004 is transitioned into and remains in the Shift-DR state 1310 of FIG. 13. Control signal 1506 is set high during the Shift-DR state 1310 to allow the And gate 1504 to pass the SEN signal from FF 1508 to scan registers 104. While the TAP is in the Shift-DR state 1310 and the SEN signal from FF 1508 is high, the scan registers 1-N 104 shift data to and from a tester via the SDI 1-N and SDO 1-N device leads. During the shifting of data, the SEN signal from FF 1508 is periodically set low by the tester, via the TMS input lead, to cause the scan registers 104 to cease shifting and capture response data from combinational logic under test. At the end of a test, the tester transitions the TAP out of the Shift-DR state 1310 which sets the control signal 1506 low, inhibiting And gate 1504 from passing further SEN signals from FF 1508 to scan registers 1-N 104.

Figure 25B:
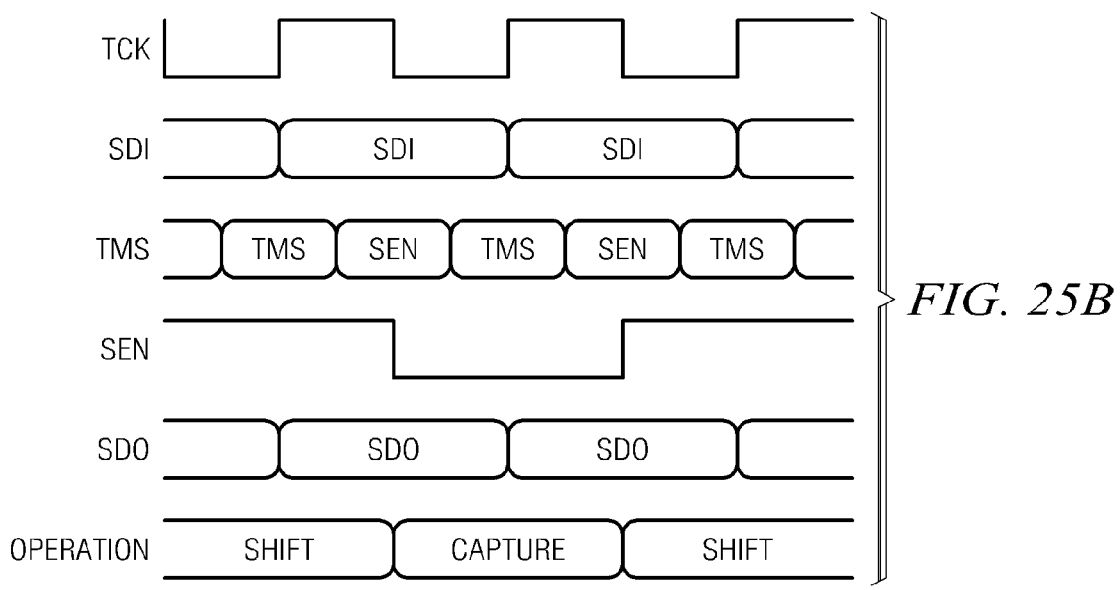
FIG. 25B illustrates the operation of the FIG. 25A scan architecture.

FIG. 25B illustrates the timing operation of the scan test architecture of FIG. 25A. The SDI 1-N input leads of device 2502 input test stimulus data from a tester to the scan registers 104 on the rising edge of TCK and the SDO 1-N output leads output test response data to a tester from the scan registers 104 on the rising edge of TCK. The TMS input lead inputs TMS signals to the TAP 1004 on the rising edge of TCK and SEN control signals to FF 1508 on the falling edge of TCK. During test, the tester inputs SEN control signals to cause the scan registers to shift and capture data as previously described.

Figure 26:
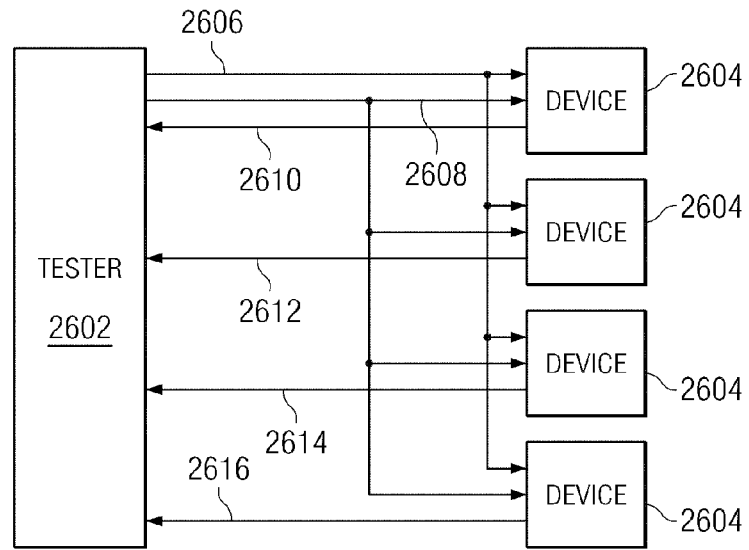
FIG. 26 illustrates a parallel arrangement between a tester and plural devices to be tested using the scan architectures of FIGS. 23, 24, and 25.

FIG. 26 illustrates an arrangement between a tester 2602 and devices 2604 being scan tested in parallel. Devices 2604 could be devices 2302 of FIG. 23, device 2402 of FIG. 24 or devices 2502 of FIG. 25. The tester outputs test stimulus data to all devices 2604 via bus 2606 and outputs TMS and TCK signals to all devices 2604 via bus 2608. The tester inputs test response data from each device 2604 using a separate bus 2610-2616 from each device 2604. If the devices 2604 being tested are devices 2302 or 2402 of FIGS. 23 and 24, tester output bus 2606 inputs TDI data to the devices while tester input buses 2610-2616 input TDO data from the devices. If the devices 2604 being tested are devices 2502 of FIG. 25, tester output bus 2606 inputs SDI 1-N data to the devices while tester input buses 2610-2616 input SDO 1-N data from the devices. During test, the tester inputs the SEN control signal to the devices to regulate when the scan registers of the devices shift and capture data, as previously described in regard to FIGS. 23-25.

Figure 27:
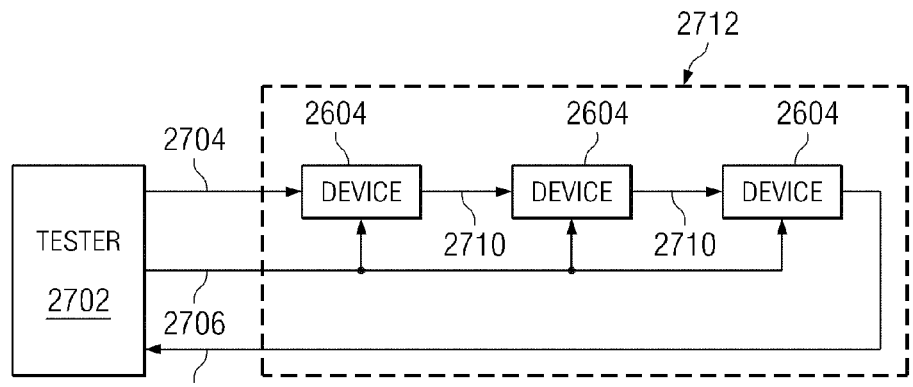
FIG. 27 illustrates a serial arrangement between a tester and plural devices to be tested using the scan architectures of FIGS. 23, 24, and 25.

FIG. 27 illustrates an arrangement between a tester 2702 and devices 2604 being scan tested in series. Devices 2604 could be devices 2302 of FIG. 23, device 2402 of FIG. 24 or devices 2502 of FIG. 25. The tester outputs test stimulus data to the first device 2604 in the series arrangement via bus 2704 and outputs TMS and TCK signals to all devices 2604 via bus 2706. The tester inputs test response data from the last device in the serial arrangement via bus 2708. The devices are connected together in series via buses 2710, such that the TDO or SDO 1-N outputs of a leading device 2604 connects to the TDI or SDI 1-N inputs of a trailing device 2604, respectively. If the devices 2604 are devices 2302 or 2402 of FIGS. 23 and 24, TDO to TDI connections are formed between a leading and trailing device via buses 2710. If the devices 2604 are devices 2502 of FIG. 25, SDO 1-N to SDI 1-N connections are formed between a leading and trailing device via buses 2710. It should be noted that if the devices 2604 are devices 2302 or 2402 in a customer's system 2712, the devices can be scan tested using the dedicated TDI, TMS, TCK and TDO device leads. During test, the tester inputs the SEN control signal to the devices to regulate when the scan registers of the devices shift and capture data, as previously described in regard to FIGS. 23-25.

Figure 28:
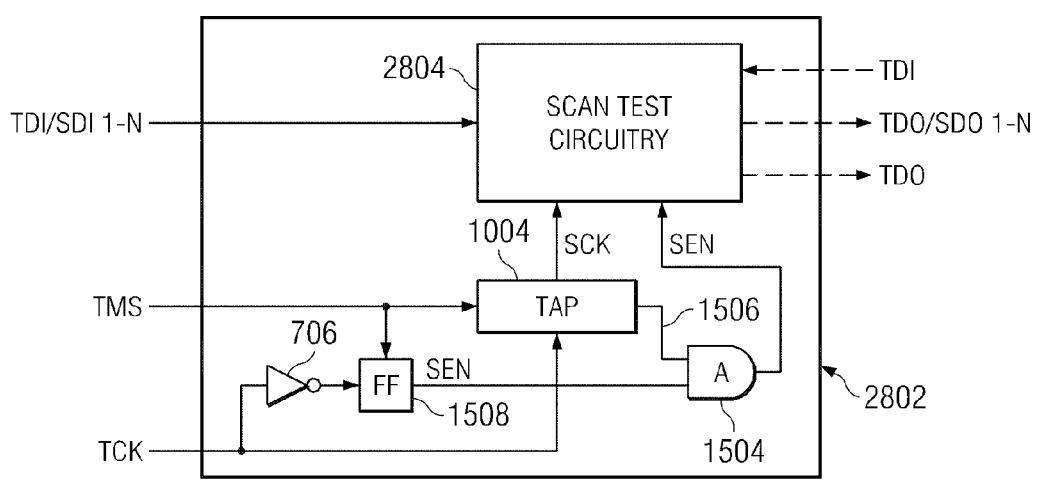
FIG. 28 illustrates a general scan test architecture interfaced to a TAP and gating to allow improved scan operations according to the disclosure.

FIG. 28 is provided to illustrate that the disclosure's feature of inputting the SEN control signal from a device 2802 TMS input lead on the falling edge of TCK can be used generally to provide the previously described improved shift and capture control to any type of scan test circuitry 2804 within the device 2802. As seen the scan test circuitry 2804 can receive test input from a TDI input or from SDO 1-N inputs and can output test results from a TDO output, SDO 1-N outputs, or from a TDI to TDO scan path. While the SEN control signal is shown being provided by the TMS input lead in FIG. 28, it may also be provided by a TDI or SDI input lead as well as described previously in regard to FIGS. 20 and 24.

Figure 29A:
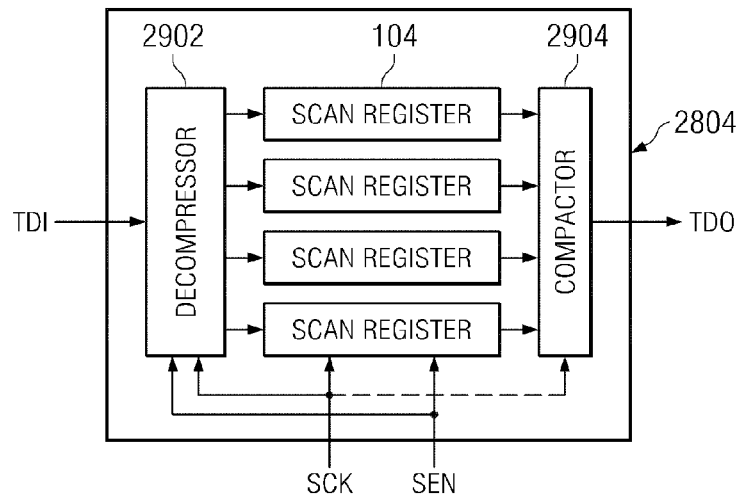
FIG. 29A illustrates a scan test architecture using a decompressor and compactor circuit that could be substituted for the general scan test architecture of FIG. 28 according to the disclosure.

FIG. 29A illustrates that the scan test circuitry 2804 of FIG. 28 may be a decompressor and compactor type scan test circuit. The decompressor 2902 operates to receive compressed input patterns from a tester via a TDI input lead, decompress the input pattern into parallel scan outputs, and input the parallel scan outputs to scan inputs of parallel scan registers 104. The compactor 2904 operates to receive scan outputs from the parallel scan registers 104, compact the scan outputs into a compressed format for outputting to a tester using a TDO output lead. Using a decompressor and compactor type scan test circuits allows accessing a large number of parallel scan paths using a small number of device inputs and outputs (TDI and TDO in this case). A variety of decompressor circuits based on linear feedback shift registers (LFSR) or ring generators exist that could be adapted for use in the scan test architecture of FIG. 29A. Also a variety of compactor circuits based on XOR gating exist that could be adapted for use in the scan test architecture of FIG. 29A. In this embodiment, the single input decompressor 2902, scan registers 104, and single output compactor 2904 are shown to operate in response to the SCK and SEN signals of FIG. 28.

During operation, the decompressor 2902 responds to SCK while SEN is high (i.e. scan register shift mode) to: (1) input compressed stimulus data from TDI, (2) decompress the compressed stimulus data input into parallel stimulus data output, and (3) input the parallel stimulus data to the scan registers 104. When the scan registers 104 are filled with the parallel stimulus data from decompressor 2902, the SEN signals goes low to cause the scan registers to capture the response outputs from combinational logic under test. The decompressor 2902 responds to the SEN signal going low to prepare for the next compressed stimulus data input from TDI. For example, decompressor 2902 may be prepared for the next compressed stimulus data input from TDI by being reset or otherwise initialized in response to SEN going low. Compactor 2904 consists of XOR gating that compacts the scan register 104 outputs (SR Out) into a single signal that is output on TDO.

Figure 29B:
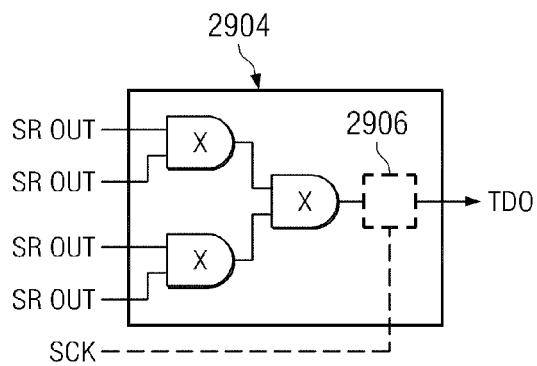
FIG. 29B illustrates an example compactor circuit for FIG. 29A.

An example XOR (X) compactor that could be used for compactor 2904 is shown in FIG. 29B. The TDO output of the FIG. 29B compactor could be registered with a FF 2906, shown in dotted line, to provide a registered TDO output to the tester if desired. If a registration FF 2906 is used on TDO, the FF could be timed by the SCK signal as shown in dotted line in FIGS. 29A and 29B.

Figure 30B:
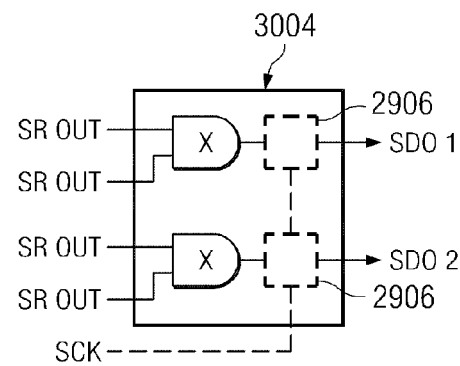
FIG. 30B illustrates an example compactor circuit for FIG. 30A.
Figure 30A:
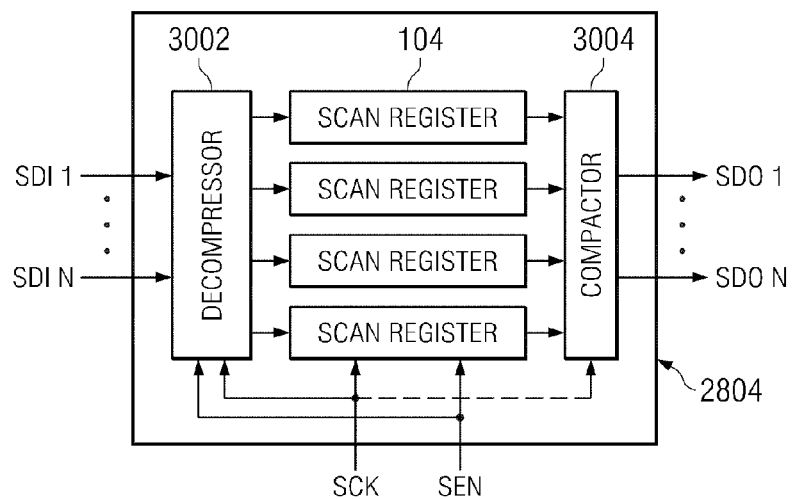
FIG. 30A illustrates another scan test architecture using a decompressor and compactor circuit that could be substituted for the general scan test architecture of FIG. 28 according to the disclosure.

FIG. 30A illustrates that the scan test circuitry 2804 of FIG. 28 may be another type of decompressor and compactor scan test circuit. The decompressor 3002 operates to receive compressed input patterns from a tester via two or more SDI input leads, decompress the input pattern into parallel scan outputs, and input the parallel scan outputs to scan inputs of parallel scan registers 104. The compactor 3004 operates to receive scan outputs from the parallel scan registers 104, compact the scan outputs into a compressed format for outputting to a tester using two or more SDO output leads. As with FIG. 29A, variety of decompressor and compactor type circuits exist that could be adapted for use in the scan test architecture of FIG. 30A. In this embodiment, the multiple input decompressor 3002, scan registers 104, and multiple output compactor 3004 are shown to operate in response to the SCK and SEN signals of FIG. 28.

During operation, the decompressor 3002 responds to SCK while SEN is high to: (1) input compressed stimulus data from the SDI inputs, (2) decompress the compressed stimulus data input into parallel stimulus data output, and (3) input the parallel stimulus data to the scan registers 104. When the scan registers 104 are filled with the parallel stimulus data from decompressor 3002, the SEN signals goes low to cause the scan registers to capture the response outputs from combinational logic under test. The decompressor 3002 responds to the SEN signal going low to prepare for the next compressed stimulus data input from SDI 1-N. For example, decompressor 3002 may be prepared for the next compressed stimulus data input from SDI 1-N by being reset or otherwise initialized in response to SEN going low. Compactor 3004 consists of XOR gating that compacts the scan register 104 outputs (SR Out) into two or more signals that is output on SDO 1-N.

An example XOR (X) compactor that could be used for compactor 3004 is shown in FIG. 30B. The SDO outputs of the FIG. 30B compactor could be registered with a FF 2906, shown in dotted line, to provide registered SDO outputs to the tester if desired. If registration FFs 2906 are used on the SDO outputs, the FFs could be timed by the SCK signal as shown in dotted line in FIGS. 30A and 30B.

Figure 31:
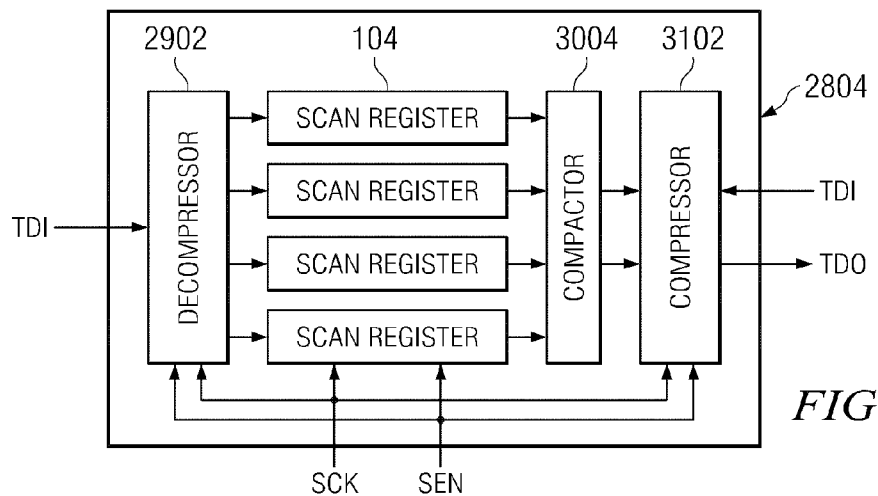
FIG. 31 illustrates a scan test architecture using a decompressor, compactor, and compressor circuit that could be substituted for the general scan test architecture of FIG. 28 according to the disclosure.

FIG. 31 illustrates that the scan test circuitry 2804 may comprise a single input decompressor 2902, a compactor 3004 and a compressor 3102. The compactor 3004 is used to reduce the number of scan register outputs down to a reasonable number for input to the compressor 3102. If desired, the compactor 3004 may be removed to allow the compressor 3102 to directly receive all the scan register 104 outputs, but this would increase the size of the compressor circuit 3102. The decompressor 2902 and compactor 3004 operates as described in FIGS. 29 and 30. The compressor 3102 operates to receive compacted scan outputs from the parallel scan registers 104 via compactor 3004 and compress them into a signature for outputting to a tester using a JTAG TDI and TDO scan path or other output means. Compressor 3102 is similar to compressor 504 of FIG. 16 in that it compresses the compacted scan register outputs from the compactor 3004 into a signature in response to SCK while the SEN signal is high, i.e. while the scan registers are shifting. However compressor 3102 does not include the ability to mask the outputs from scan registers 104, as did compressor 504. In this embodiment, the decompressor 2902, scan registers 104, compactor 3004 and compressor 3102 are shown to operate in response to the SCK and SEN signals of FIG. 28.

During operation, the decompressor 2902 responds to SCK while SEN is high to: (1) input compressed stimulus data from TDI, (2) decompress the compressed stimulus data input into parallel stimulus data output, and (3) input the parallel stimulus data to the scan registers 104. The compressor 3102 responds to SCK while SEN is high to: (1) input compacted scan outputs from compactor 3004 and (2) compress the compacted scan outputs into a signature. When the scan registers 104 are filled with the parallel stimulus data from decompressor 2902, the SEN signals goes low to cause the scan registers to capture the next response outputs from combinational logic under test. The decompressor 2902 responds to the SEN signal going low to prepare for the next compressed stimulus data input from SDI 1-N, as described in FIG. 29. The compressor 3102 responds to the SEN signal going low to cease its compression operation.

Figure 32:
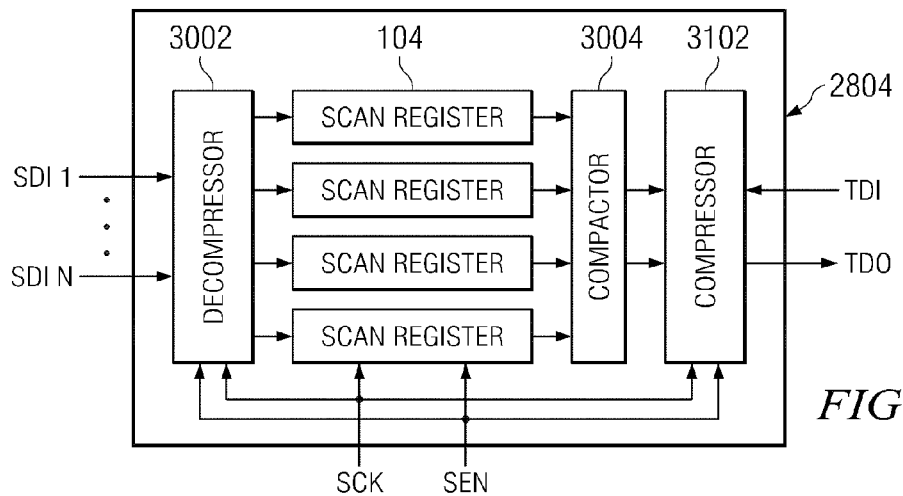
FIG. 32 illustrates another scan test architecture using a decompressor, compactor and compressor circuit that could be substituted for the general scan test architecture of FIG. 28 according to the disclosure.

FIG. 32 illustrates that the scan test circuitry 2804 may comprise a multiple input decompressor 3002, a compactor 3004 and compressor 3102. As previously described in FIG. 30, decompressor 3002 operates to receive compressed stimulus input on two or more SDI input leads and outputs decompressed parallel outputs to parallel scan registers 104. As previously described in FIG. 31, compressor 3102 operates to receive compacted scan outputs from scan registers 104, via compactor 3004, and compress them into a signature for outputting to a tester using a JTAG TDI and TDO scan path or other output means. In this embodiment, the decompressor 3002, scan registers 104, compactor 3004 and compressor 3102 are shown to operate in response to the SCK and SEN signals of FIG. 28.

During operation, decompressor 3002 responds to SCK while SEN is high to: (1) input compressed stimulus data from SDI 1-N, (2) decompress the compressed stimulus data input into parallel stimulus data output, and (3) input the parallel stimulus data to the scan registers 104, while the compressor 3102 compresses the compacted scan outputs from compactor 3004 into a signature. When the scan registers 104 are filled with the parallel stimulus data from decompressor 3002, the SEN signals goes low to cause the scan registers to capture the response outputs from combinational logic under test. The decompressor 3002 responds to the SEN signal going low to prepare for the next compressed stimulus data input from SDI 1-N, as described in FIG. 30. The compressor 3102 ceases compressing data into a signature in response to SEN going low.

Figure 33A:
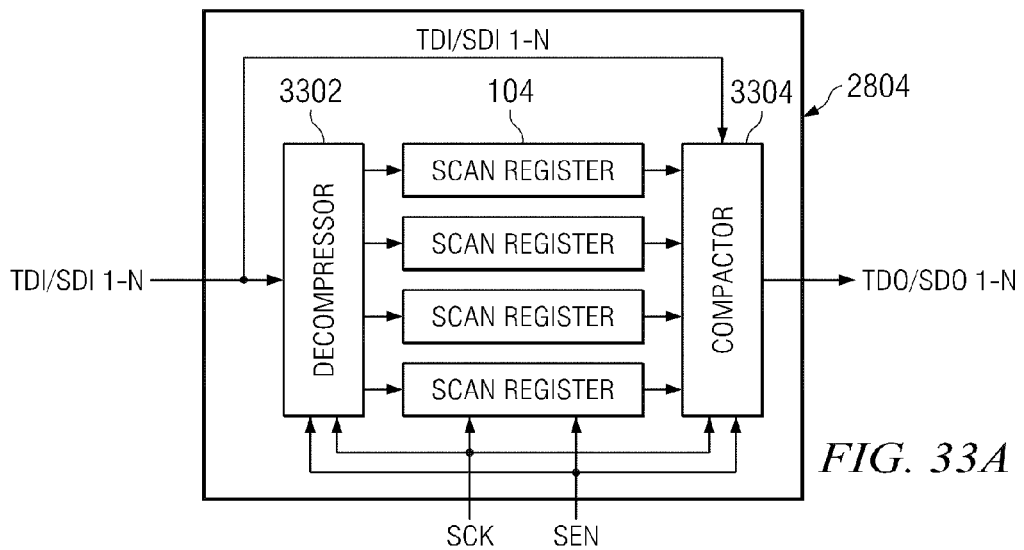
FIG. 33A illustrates a scan test architecture using a decompressor and maskable compactor that could be substituted for the general scan test architecture of FIG. 28 according to the disclosure.
Figure 33B:
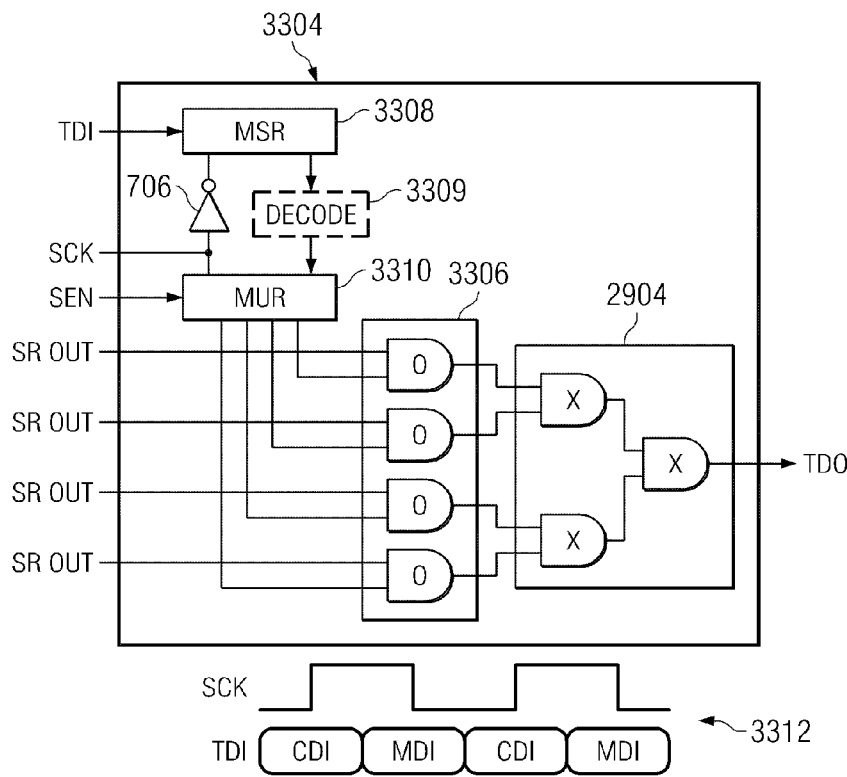
FIG. 33B illustrates an example maskable compactor for use in FIG. 31.

FIG. 33A illustrates that the scan test circuitry 2804 may comprise a decompressor 3302 and compactor 3304. Decompressor 3302 may be either the single input (TDI) decompressor 2902 of FIG. 29 or the multiple input (SDI 1-N) decompressor 3002 of FIG. 30. Compactor 3304 is similar to compactors 2904 and 3004 but differs in that it includes masking inputs and circuitry to allow masking off selected don't care or unknown outputs from scan registers 104 when they are shifting data. If not masked, don't care or unknown data from scan registers 104 can corrupt the compacted data output to the tester and invalidate the test. In this embodiment, the decompressor 3302, scan registers 104, and compactor 3304 are shown to operate in response to the SCK and SEN signals of FIG. 28 and, in addition, the mask inputs to compactor 3304 are provided using the same device input leads (TDI or SDI 1-N) that provide the compressed stimulus data to the decompressor 3302. Thus a device using this embodiment, which uses the same device input leads for inputting compressed data to decompressor 3302 and mask data to compactor 3304, requires fewer connections to a tester FIG. 33B illustrates an example implementation of compactor 3304 that uses the TDI input lead to input mask data to compactor 3304 on the falling edge of SCK. The compactor 3304 includes compactor circuit 2904 of FIG. 29B, mask circuitry 3306, mask shift register (MSR) 3308, mask update register (MUR) 3310, and inverter 706. MSR 3308 inputs data from TDI, the SCK signal via inverter 706, and outputs parallel data to MUR 3310, either directly or via decode circuitry 3309. MUR 3310 inputs parallel data from the parallel outputs of MSR 3308, the SCK signal, the SEN signal and outputs parallel data to mask circuit 3306. The mask circuit 3306 inputs the mask data from MUR 3310 and the scan register 104 outputs (SR Out), and outputs masked or unmasked data to compactor circuit 2904. Compactor circuit 2904 compacts the masked or unmasked data inputs from the mask circuit down to one signal and outputs that one signal on the TDO output lead.

While SEN is high, the TDI input lead inputs compressed data input (CDI) to the decompressor 3302 on the rising edge of SCK and mask data input (MDI) to MSR 3308 on the falling edge of SCK, as shown in timing example 3312. When SEN goes low, the mask data shifted into MSR 3308 is transferred into MUR 3310, either directly or via decode circuit 3309, to be applied to the OR gates of mask circuitry 3306. In this example, a logic high on a Mask bit forces an OR gate output high (the mask output state in this example) independent of the scan register output (SR Out) to the OR gate. Thus don't care outputs from one or more scan registers 104 can be mask off so as not to effect the operation of compactor circuit 2904. In this example, while OR gates are used in masking circuit 3306, And gates could be used in masking circuit 3306 as well. If And gates were used, logic low Mask bits would be input to compare circuit 3306 from MUR 3310 to force the And gate outputs low, the mask state.

Figure 33C:
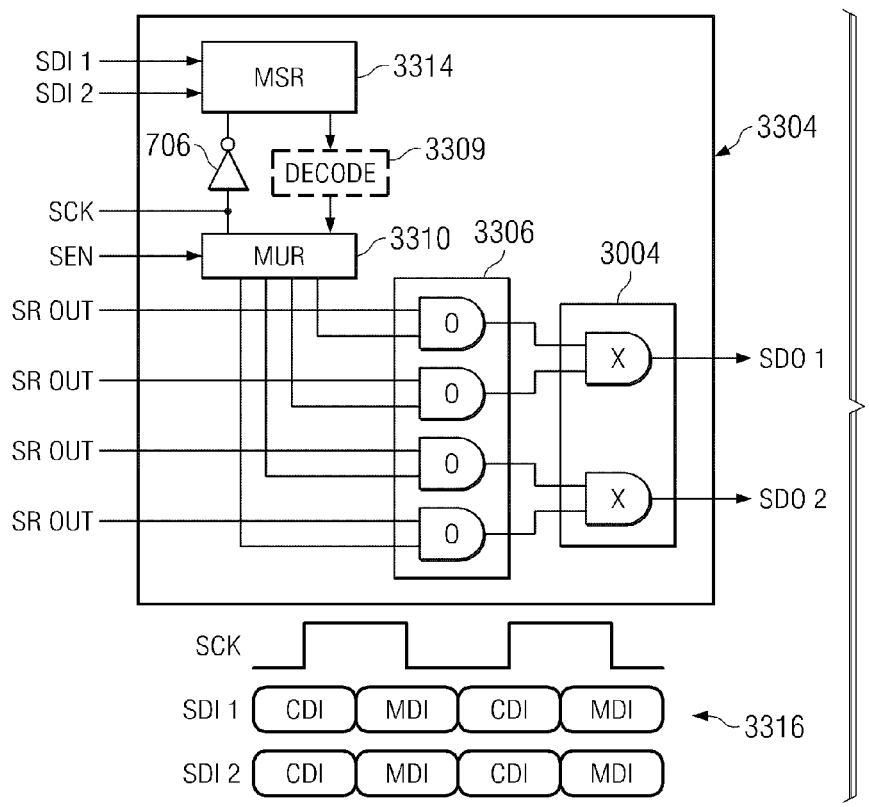
FIG. 33C illustrates another example maskable compactor for use in FIG. 31.

FIG. 33C illustrates an example implementation of compactor 3304 that uses plural SDI input leads, SDI 1 and SDI 2 in this example, to input mask data to compactor 3304 on the falling edge of SCK. The compactor 3304 includes compactor circuit 3004 of FIG. 30B, mask circuitry 3306 of FIG. 33B, mask shift register (MSR) 3314, mask update register (MUR) 3310 of FIG. 33B, and inverter 706. MSR 3314 inputs data from SDI 1 and SDI 2, the SCK signal via inverter 706, and outputs parallel data to MUR 3310, either directly or via decode circuitry 3309. MUR 3310 inputs parallel data from the parallel outputs of MSR 3314, the SCK signal, the SEN signal and outputs parallel data to mask circuit 3306. The mask circuit 3306 inputs the mask data from MUR 3310 and the scan register 104 outputs (SR Out), and outputs masked or unmasked data to compactor circuit 3004. Compactor circuit 3004 compacts the masked or unmasked data inputs from the mask circuit down to two signals, in this example, and outputs the two signals on the SDO 1 and SDO 2 output leads.

While SEN is high, the SDI 1 and SDI 2 input leads input compressed data input (CDI) to the decompressor 3302 on the rising edge of SCK and mask data input (MDI) to MSR 3314 on the falling edge of SCK, as shown in timing example 3316. When SEN goes low, the mask data shifted into MSR 3314 is transferred into MUR 3310, either directly or via decode circuit 3309, to be applied to the OR gates of mask circuitry 3306. In this example, a logic high on a Mask bit forces an OR gate output high (the mask output state in this example) independent of the scan register output (SR Out) to the OR gate. Thus don't care outputs from one or more scan registers 104 can be mask off so as not to effect the operation of compactor circuit 3004. While OR gates are used in masking circuit 3306, And gates could be used in the masking circuit as described in FIG. 33B.

Figure 33D:
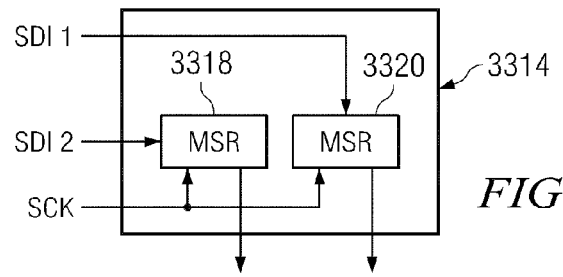
FIG. 33D illustrates an example mask shift register (MSR) for use in FIG. 33C.

FIG. 33D illustrates an example implementation of MSR 3314. As seen the shift register of MSR is broken up into two sections 3318 and 3320. Section 3318 inputs mask data from SDI 1 and section 3320 inputs mask data from SDO 2 in response to the SCK input from inverter 706. Breaking the shift register up into two sections allows the shift register to be loaded faster since the shift time to load mask data is reduced to only one half the length of the overall shift register. For example, a 16 bit MSR 3314 shift register can be loaded in only 8 shift cycles. If more SDI inputs were used, a further reduction in shift register load time can be achieved by further dividing the shift register into separate lower length shift registers.

Figure 34:
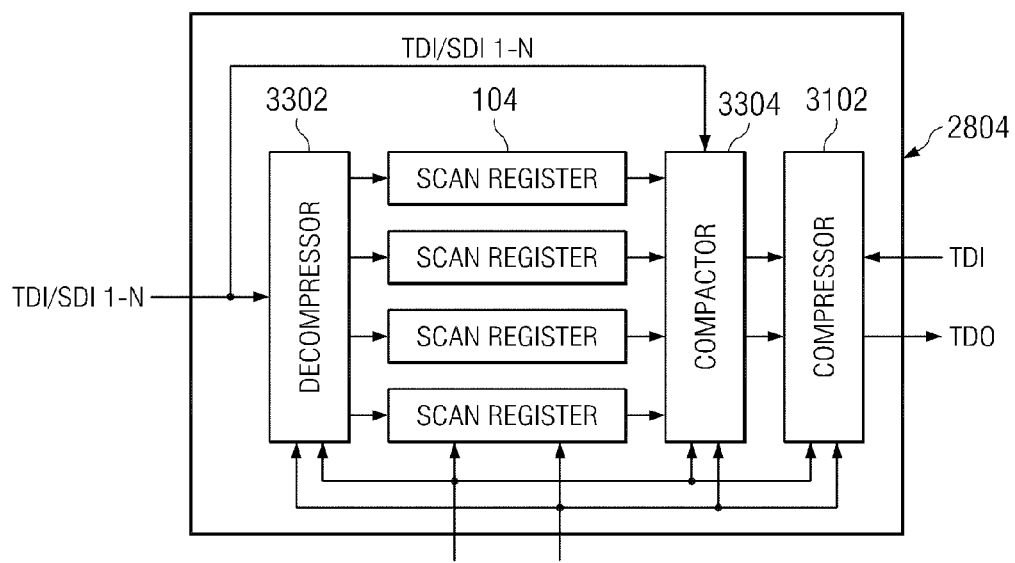
FIG. 34 illustrates a scan test architecture using a decompressor, maskable compactor, and compressor circuit that could be substituted for the general scan test architecture of FIG. 28 according to the disclosure.
Figure 35A:
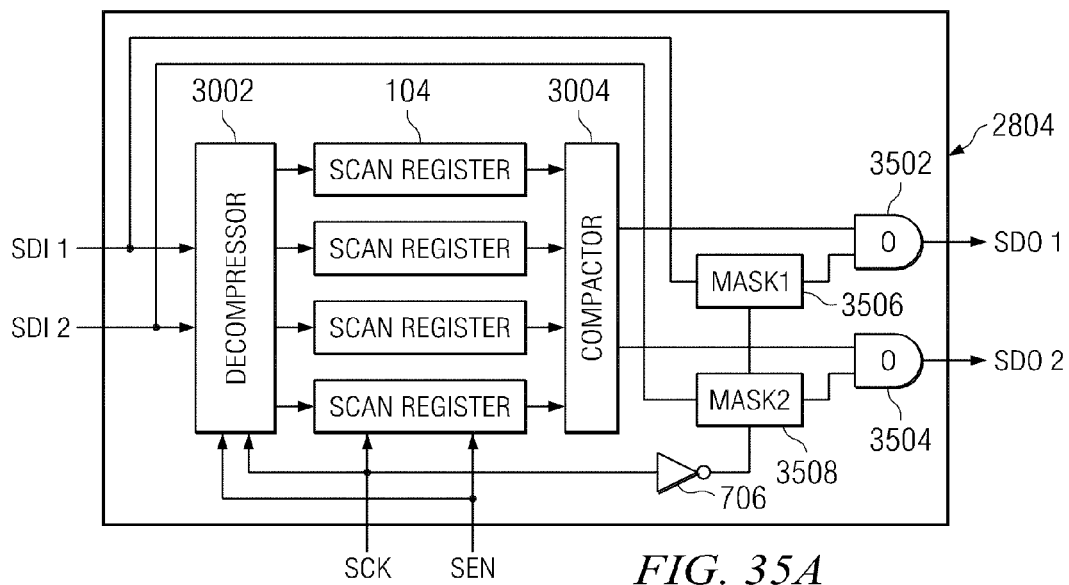
FIG. 35A illustrates a scan test architecture using a decompressor, compactor, and masking circuitry that could be substituted for the general scan test architecture of FIG. 28 according to the disclosure.

FIG. 34 illustrates that the scan test circuitry 2804 may comprise the decompressor circuit 3302 and compactor circuit 3304 of FIG. 33 and compressor circuit 3102 of FIGS. 31 and 32. The scan test circuit 2804 of FIG. 34 is similar to the scan test circuits 2804 of FIGS. 31 and 32 with the exception that the scan test circuit of FIG. 34 uses the maskable compactor circuit 3304 of FIG. 33C instead of the non-maskable compactor circuit 3004 of FIGS. 31 and 32. Use of compactor 3304 allows the compacted scan register inputs to compressor 3102 to be masked off to avoid inputting don't care inputs to compressor 3102, which would corrupt the signature taken by the compressor circuit 3102. In this embodiment, the decompressor 3302, scan registers 104, compactor 3304 and compressor 3102 are shown to operate in response to the SCK and SEN signals of FIG. 28 and, in addition, the mask inputs to compactor 3304 are provided using the same device input leads (TDI or SDI 1-N) that provide the compressed stimulus data to the decompressor 3302. Thus a device using this embodiment, which uses the same input device leads for inputting compressed data and mask data, requires fewer connections to a tester FIG. 35A illustrates that the scan test circuitry 2804 may comprise the decompressor circuit 3002 and compactor circuit 3004 of FIG. 30, mask gates 3502 and 3504, mask flip flops (FF) 3506 and 3508, and inverter 706 connected as shown. The scan test circuit 2804 of FIG. 35A is similar to the scan test circuit 2804 of FIG. 30 with the exception that the scan test circuit of FIG. 35A uses the mask gates and FFs to individually mask the SDO 1-2 device outputs. The masking approach of FIG. 35A differs from the masking approach of FIGS. 33A and 33B in that the outputs of the compactor 3004 are masked in FIG. 35A instead of the inputs to the compactor 3004 as shown in FIG. 33C.

In this embodiment, the decompressor 3002, scan registers 104, compactor 3004, mask gates 3502-3504, and mask FFs 3506-3508 operate in response to the SCK and SEN signals of FIG. 28 and, in addition, the mask data inputs (MDI) to FFs 3506-3508 are provided using the SDI 1-2 input leads that provide the compressed data inputs (COD) to the decompressor 3002. Thus a device using this embodiment, which uses the SDI input leads for inputting compressed data and mask data, requires fewer connections to a tester.

Figure 35B:
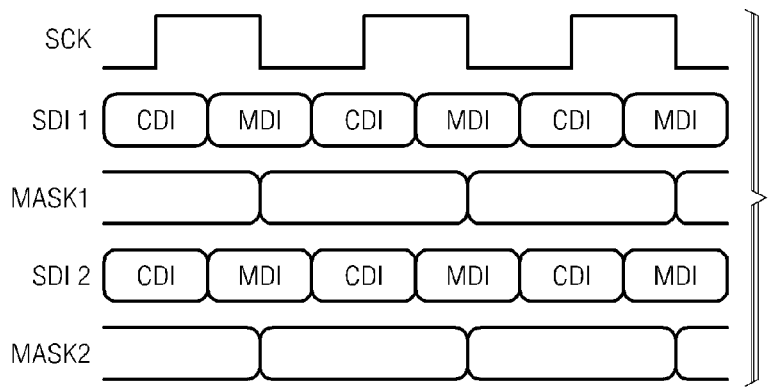
FIG. 35B illustrates the operation of the FIG. 35A scan architecture.

As seen in the timing example of FIG. 35B, and while SEN is high (shift mode), COD data from SDI 1 and SDI 2 is input to decompressor 3002 on the rising edge of SCK and MDI data from SDI 1 and SDI 2 is input to the mask FFs 3506-3508 on the falling edge of SCK, via inverter 706. The Mask 1 and Mask 2 outputs of FFs 3506 and 3508 are input to gates 3502 and 3504, respectively, to either mask or unmask one or both of the SDO 1 and SDO 2 outputs.

The advantage provided by the masking technique of FIG. 35A as opposed to the masking technique of FIG. 33C is that it allows the SDO outputs to be masked or unmasked during every SCK period of a shift operation, whereas the masking technique of FIG. 33C can only mask or unmask data once per shift operation. As seen in FIG. 33C, MUR 3310 is updated with new mask data during the capture operation when SEN is low and this mask data remains in effect during the subsequent shift operation when SEN is high. While only two SDIs and two SDOs are shown in this example, any number of SDIs and SDOs could be used. There should be an SDI input for each SDO output to allow an SDI input to provide mask data to a FF and gate circuit combination associated with an SDO output, for example gate and FF combination 3502 and 3506 for SDO 1.

Figure 36:
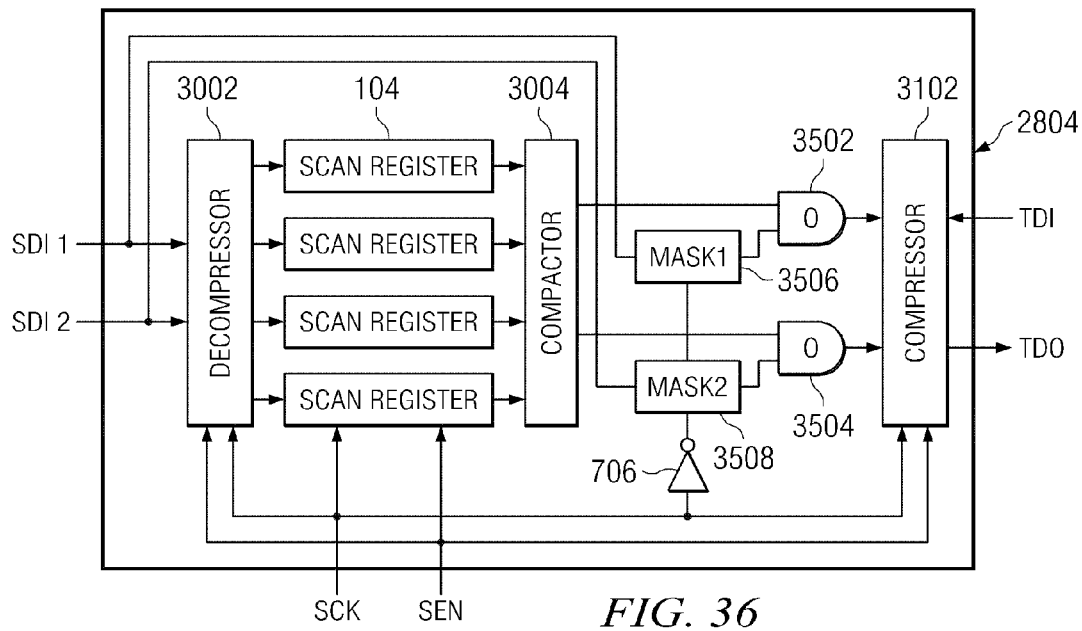
FIG. 36 illustrates a scan test architecture using a decompressor, compactor, masking circuitry, and compressor circuit that could be substituted for the general scan test architecture of FIG. 28 according to the disclosure.

FIG. 36 illustrates that the scan test circuitry 2804 may comprise the decompressor circuit 3002, compactor circuit 3004 and compressor circuit 3102 of FIG. 32, mask gates 3502 and 3504, mask flip flops (FF) 3506 and 3508, and inverter 706 connected as shown. The scan test circuit 2804 of FIG. 36 is similar to the scan test circuit 2804 of FIG. 34 with the exception that the scan test circuit of FIG. 36 uses the mask gates and FFs to individually mask the compacted scan register outputs to compressor 3102. The masking approach of FIG. 36 differs from the masking approach of FIG. 34 in that the outputs of the compactor 3004 are masked in FIG. 36 instead of the inputs to the compactor 3304 as shown in FIG. 33C.

In this embodiment, the decompressor 3002, scan registers 104, compactor 3004, mask gates 3502-3504, mask FFs 3506-3508 and compressor 3102 operate in response to the SCK and SEN signals of FIG. 28 and, in addition, the mask data inputs (MDI) to FFs 3506-3508 are provided using the SDI 1-2 input leads that provide the compressed data inputs (COD) to the decompressor 3002. Thus a device using this embodiment, which uses the SDI input leads for inputting compressed data and mask data, requires fewer connections to a tester.

As described in regard to the timing example of FIG. 35B, and while SEN is high (shift mode), COD data from SDI 1 and SDI 2 is input to decompressor 3002 on the rising edge of SCK and MDI data from SDI 1 and SDI 2 is input to the mask FFs 3506-3508 on the falling edge of SCK, via inverter 706. The Mask 1 and Mask 2 outputs of FFs 3506 and 3508 are input to gates 3502 and 3504, respectively, to either mask or unmask one or both of the compacted scan register outputs to compressor 3102.

The advantage provided by the masking technique of FIG. 36 as opposed to the masking technique of FIG. 33C is that it allows the compacted scan register outputs to be masked or unmasked during every SCK period of a shift operation, whereas the masking technique of FIG. 33C can only mask or unmask the compacted scan register outputs once per shift operation. As seen in FIG. 33C, MUR 3310 is updated with new mask data during the capture operation when SEN is low and this mask data remains in effect during the subsequent shift operation when SEN is high. While only two SDIs are used to mask or unmask two compacted scan register outputs in this example, any number of SDIs and compacted scan register outputs could be used. There should be an SDI for each compacted scan register output to allow an SDI to provide mask data to a FF and gate circuit combination associated with a compacted scan register output.

Figure 37A:
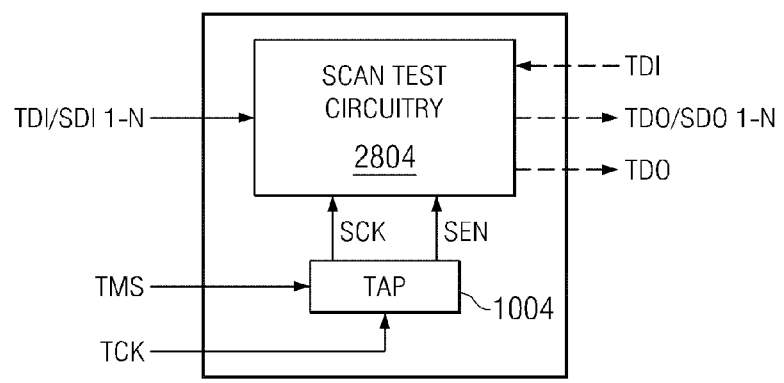
FIG. 37A illustrates the general scan test architecture of FIG. 28 being controlled by a TAP interface according to the disclosure.
Figure 37B:
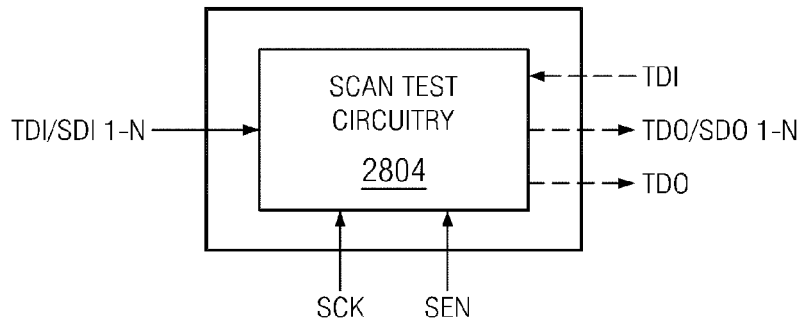
FIG. 37B illustrates the general scan test architecture of FIG. 28 being controlled by a scan control interface according to the disclosure.

FIG. 37B is provided to illustrate that scan test circuits 2804 shown and described in regard to FIGS. 29, 30, 31, 32, 33, 34, 35 and 36 could be controlled via the SCK and SEN signal outputs from a TAP 1004 being conventionally controlled by a devices TMS and TCK input leads, instead of by the SCK and SEN signals of FIG. 28.

FIG. 37C is provided to illustrate that scan test circuits 2804 shown and described in regard to FIGS. 29, 30, 31, 32, 33, 34, 35 and 36 could be controlled via a devices SCK and SEN input leads, instead of the SCK and SEN signals of FIG. 28.

As described above in regard to FIGS. 33A, 33B and 33C, MUR circuit 3310 is updated with new mask data when the SEN signal goes low. SEN goes low at the end of a shift operation to cause scan registers 104 to capture response data from combinational logic. Thus the MUR circuit 3310 can only update new mask data to the mask circuit 3306 once per scan cycle, where the scan cycle is defined by a shift operation and capture operation. It would be advantageous to be able to update the MUR 3310 mask outputs multiple times during the shift operation of the scan cycle as this would allow masking of don't care bits and unmasking of care bits to occur multiple times during the shift operation. The following description provides a way to allow the MUR 3310 to be updated multiple times with new mask data during shift operations.

Figure 38A:
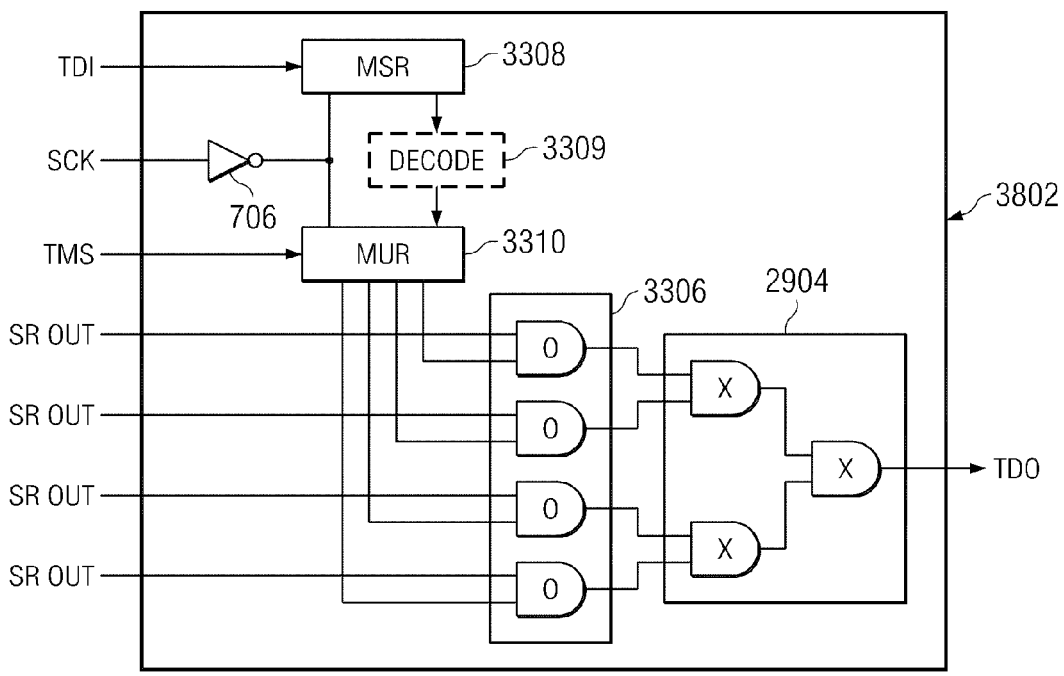
FIG. 38A illustrates an example single input maskable compactor that allows inputting multiple mask patterns during shift operations according to the disclosure.

FIG. 38A illustrates an example implementation of a maskable compactor circuit 3802 that allows mask data to be output from MUR 3310 multiple times during the above mentioned shift operation. Compactor circuit 3802 is similar to compactor circuit 3304 of FIG. 33B in that it comprises a MSR circuit 3308, MUR circuit 3310, mask circuit 3306, and compactor circuit 2904. The difference between the compactor circuit 3802 of FIG. 38A and the compactor circuit 3304 of FIG. 33B is that the MUR circuit 3310 is clocked by the falling edge of SCK, via inverter 706, instead of the rising SCK edge, and the update control input to MUR circuit 3310 is provide by the TMS signal instead of by the SEN signal of FIG. 33A.

FIG. 38A assumes the TMS signal can be used to input the update control signal on the falling edge of SCK, i.e. TMS provides conventional TAP control input on the rising edge of TCK and update control input to MUR 3310 on the falling edge of TCK, via SCK. FIG. 37B illustrates a device with a TMS signal that inputs TAP control on the rising edge of TCK. Since FIG. 37B does not have a purpose for TMS on the falling edge of TCK, the TMS signal of FIG. 37B can be used to input the update control signal on the falling edge of TCK, which is the same signal as SCK during shift and capture operations.

Figure 38B:
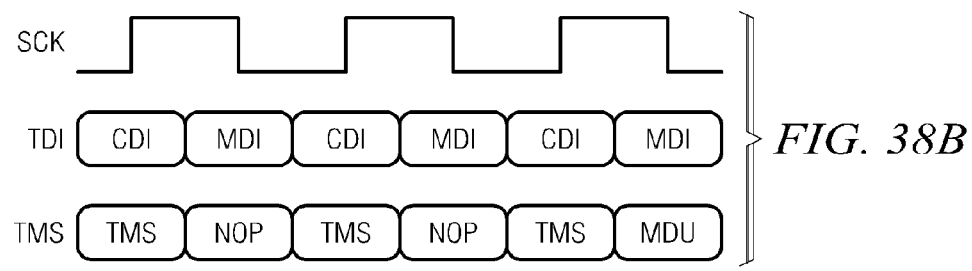
FIG. 38B illustrates timing of inputting a mask pattern into the compactor of FIG. 38A.

As seen in the timing diagram of FIG. 38B, the TDI signal provides compressed data input (COD) to a decompressor, such as decompressor 3302 of FIG. 33, on the rising edge of SCK and mask data input (MDI) to the MSR 3308 on the falling edge of SCK. Also as seen in FIG. 38B, the TMS signal provides TMS input to a TAP 1004 on the rising edge of SCK and either a no-operation (NOP) or a mask data update (MDU) signal to the MUR 3310 on the falling edge of SCK, via inverter 706. MUR 3310 updates on the falling edge of SCK when a MDU signal is input on TMS. MUR 3310 does not update on the falling edge of SCK when a NOP signal is input on TMS.

Figure 38C:
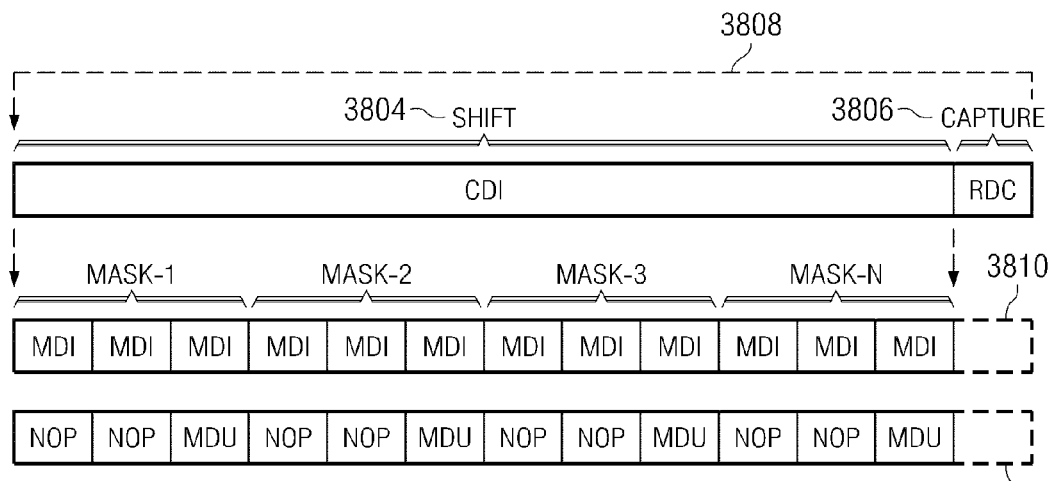
FIG. 38C illustrates the inputting multiple mask patterns to the compactor of FIG. 38A during a scan cycle shift operation according to the disclosure.

As seen in timing diagram of FIG. 38C, and during shift operation 3804, MDI data is input to the MSR 3308 from TDI to load a first mask pattern (Mask-1) while NOP signals are input to MUR 3310 from TMS. When the Mask-1 pattern is loaded, a MDU signal is input to MUR 3310 from TMS to cause MUR 3310 to update the Mask-1 pattern from MSR 3308 and output the Mask-1 pattern to mask circuit 3306. Similarly Mask-2 through Mask-N patterns are input to MSR 3308 and updated into MUR 3310 during the shift operation 3804. Thus maskable compactor circuit 3802 allows multiple mask patterns to be shifted in and updated to mask circuit 3306 during shift operation 3804. At the end of the shift operation 3804 a response data capture (RDC) operation 3806 occurs to load the scan registers 104 with new response data from combinational logic. MDI input to MSR 3308 from TDI may continue during the RDC operation 3806 as indicated by dotted line box 3810. NOP or MDU signal input to MUR 3310 from TMS may continue during the RDC operation 3806 as indicated by dotted line box 3812.

Figure 39A:
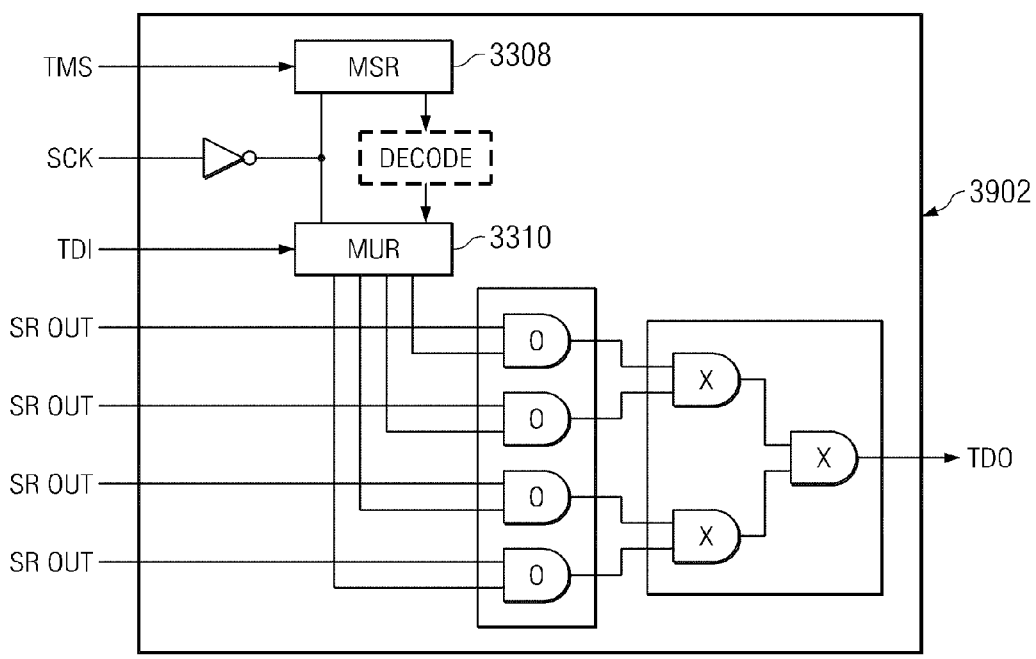
FIG. 39A illustrates another example single input maskable compactor that allows inputting multiple mask patterns during shift operations according to the disclosure.
Figure 39B:
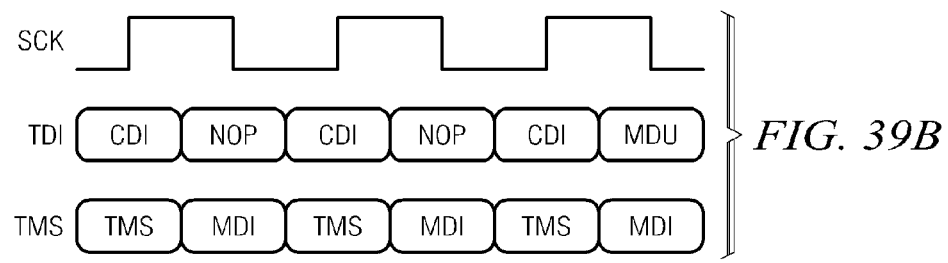
FIG. 39B illustrates timing of inputting a mask pattern into the compactor of FIG. 39A.

FIGS. 39A and 39B are provided to illustrate a maskable compactor circuit 3902 where the TMS signal is used to input MDI data to MSR 3308 on the falling edge of SCK and the TDI signal is used to input the NOP or MDU signal to MUR 3310 on the falling edge of SCK. With the exception that the TMS signal is used to input the MDI data and the TDI signal is used to input the NOP or MDU signals, the operation of the maskable compactor circuit 3902 is the same as the maskable compactor circuit 3802 of FIG. 38.

Figure 40A:
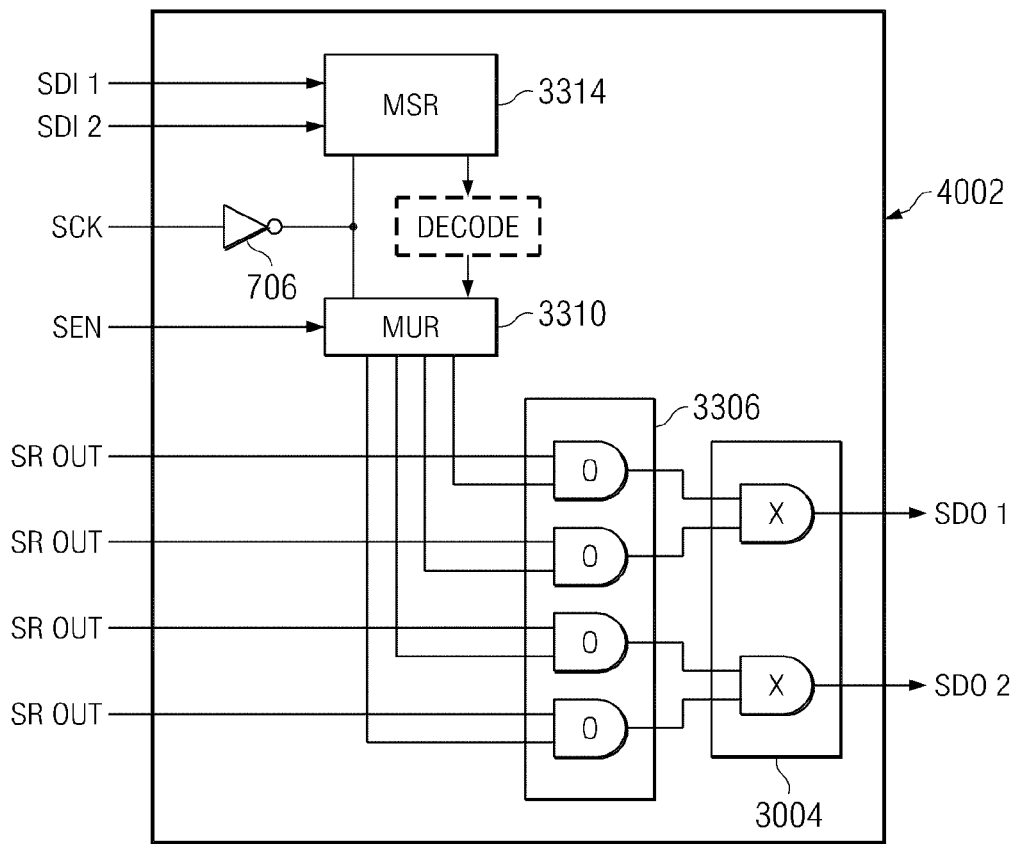
FIG. 40A illustrates an example multiple input maskable compactor that allows inputting multiple mask patterns during shift operations according to the disclosure.

FIG. 40A illustrates an example implementation of a maskable compactor circuit 4002 that allows mask data to be output from MUR 3310 multiple times during shift operations. Compactor circuit 4002 is similar to compactor circuit 3304 of FIG. 33C in that it comprises a MSR circuit 3314, MUR circuit 3310, mask circuit 3306, and compactor circuit 3004. The difference between the compactor circuit 4002 of FIG. 40A and the compactor circuit 3304 of FIG. 33C is that the MUR circuit 3310 is clocked by the falling edge of SCK, via inverter 706, instead of the rising SCK edge, and the NOP and MDU signals, mentioned in regard to FIG. 38, to MUR 3310 are input to MUR 3310 on the falling edge of SCK via the SEN signal.

Figure 40B:
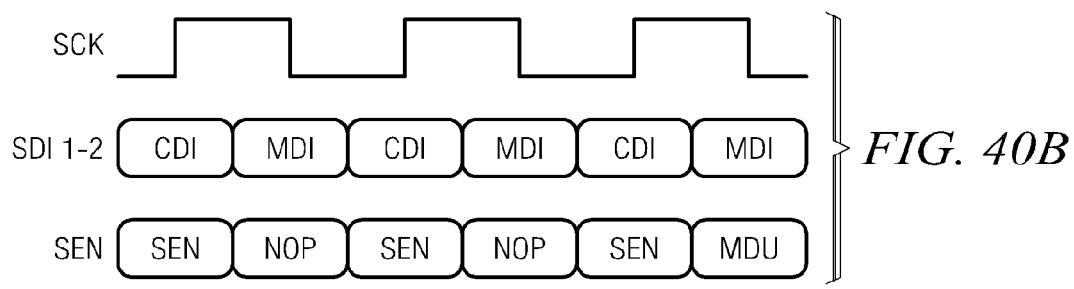
FIG. 40B illustrates timing of inputting a mask pattern into the compactor of FIG. 40A.

As seen in the timing diagram of FIG. 40B, the SDI 1 and SDI 2 signals provide compressed data input (COD) to a decompressor, such as decompressor 3302 of FIG. 33A, on the rising edge of SCK and mask data input (MDI) to the MSR 3314 on the falling edge of SCK. Also as seen in FIG. 40B, the SEN signal provides the scan register shift or capture operation signal on the rising edge of SCK and either a NOP or MDU signal to the MUR 3310 on the falling edge of SCK. MUR 3310 updates on the falling edge of SCK when a MDU signal is input on the SEN signal. MUR 3310 does not update on the falling edge of SCK when a NOP signal is input on the SEN signal.

The scan cycle timing is the same as that shown in FIG. 38C with the exception the SDO 1 and SDO 2 signals are used to input MDI data to MSR 3314 and the SEN signal is used to input the NOP or MDU signal to MUR 3310. As seen in timing diagram of FIG. 38C, and during shift operation 3804, MDI data is input to the MSR 3314 from SDI 1 and 2 to load a first mask pattern (Mask-1) while NOP signals are input to MUR 3310 from the SEN signal. When the Mask-1 pattern is loaded, a MDU signal is input to MUR 3310 from the SEN signal to cause MUR 3310 to update the Mask-1 pattern from MSR 3314 and output the Mask-1 pattern to mask circuit 3306. Similarly Mask-2 through Mask-N patterns are input to MSR 3314 and updated into MUR 3310 during the shift operation 3804. Thus maskable compactor circuit 4002 allows multiple mask patterns to be shifted in and updated to mask circuit 3306 during shift operation 3804. At the end of the shift operation 3804 a response data capture (RDC) operation 3806 occurs to load the scan registers 104 with new response data from combinational logic. The MDI to MSR 3314 and the NOP or MDU signal input to MUR 3310 may continue during the RDC operation 3806, as indicated by dotted line boxes 3810 and 3812. The advantage of maskable compactor circuit 4002 over the maskable compactor circuits 3802 and 3902 is that mask data can be loaded into MSR 3314 faster since multiple inputs (SDI 1-2) are use to input mask data to MSR 3314, as described previously in regard to FIGS. 33C and 33D.

Figure 41A:
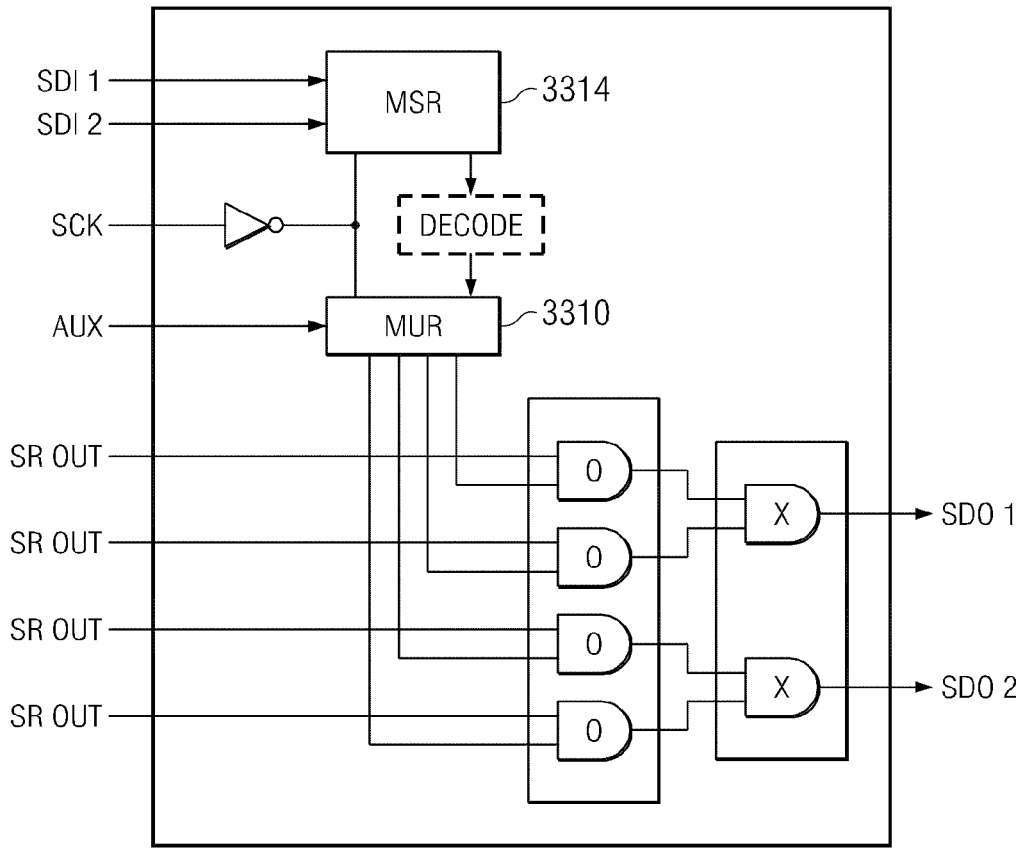
FIG. 41A illustrates another example multiple input maskable compactor that allows inputting multiple mask patterns during shift operations according to the disclosure.
Figure 41B:
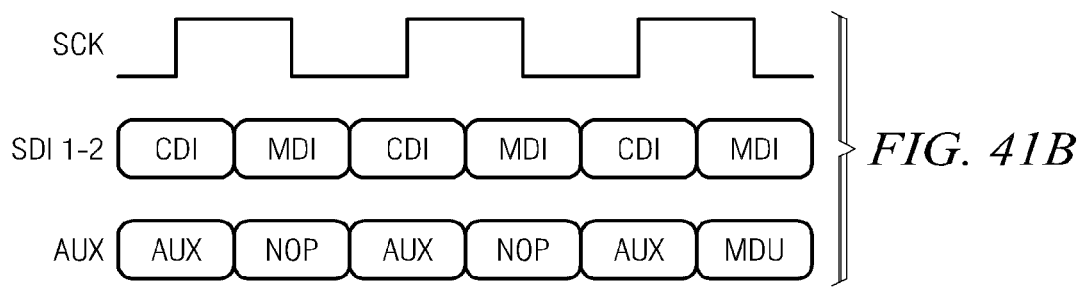
FIG. 41B illustrates timing of inputting a mask pattern into the compactor of FIG. 41A.

FIGS. 41A and 41B are provided to illustrate that another signal, an auxiliary (AUX) signal in this example, may be used to input the NOP or MDU signals to MUR 3310 instead of using the SEN signal of FIG. 40A. The AUX signal would provide the NOP and MDU signal to MUR 3310 on the falling edge of SCK as did the SEN signal of FIG. 40A. Use of another signal, such as AUX, may be required if the SEN signal for some reason cannot be used for inputting capture and shift control on the rising SCK and NOP or MDU control on the falling edge of SCK.

It should be understood that while this disclosure has described the rising edge of TCK or SCK as the edge for inputting conventional test signals such as TDI, SDO, and TMS, and the falling edge of the TCK or SCK for inputting additional test signals such as EDI, MDI, and SEN, it is not limited to this rising and falling clock edge operation. Indeed the disclosure can be practiced whereby the rising clock edge inputs the additional test signals and the falling clock edge inputs the conventional test signals if so desired.

Although the disclosure has been described in detail, it should be understood that various changes, substitutions and alterations may be made without departing from the spirit and scope of the disclosure as defined by the appended claims.

Aspects

A device comprising a first scan data input lead, at least a second scan data input lead, a scan clock input lead, a scan enable input lead, a first scan register having a scan input coupled to the first scan data input lead, a clock input coupled to the scan clock input lead, a control input coupled to the scan enable input lead, and a scan output, at least a second scan register having a scan input coupled to the second scan data input lead, a clock input coupled to the scan clock input lead, a control input coupled to the scan enable input lead, and a scan output, a first flip flop having a data input coupled to the first scan data input lead, a clock input coupled to the scan clock input lead via an inverter, and a data output, at least a second flip flop having a data input coupled to the second scan data input lead, a clock input coupled to the scan clock input lead via an inverter, and a data output, and a compressor circuit having a data input coupled to the scan output of the first scan register, a data input coupled to the data output of the first flip flop, a data input coupled to the scan output of the second scan register, and a data input coupled to the data output of the second flip flop.

A test system for testing devices in parallel comprising a tester having a scan clock output, a scan enable output, and an output bus for outputting test signals, and a group of devices each having a scan clock input coupled to the scan clock output, a scan enable input coupled to the scan enable output, and an input bus coupled to the output bus for inputting a first group of test signals from the tester on the rising edge of the scan clock input and inputting a second group of test signals from the tester on the falling edge of the scan clock input.

A device comprising a first scan data input lead, at least a second scan data input lead, a test clock input lead, a test mode select input lead, a Test Access Port having a clock input coupled to the test clock input lead, a mode input coupled to the test mode select input lead, a scan clock output, and a scan enable output, a first scan register having a scan input coupled to the first scan data input lead, a clock input coupled to the scan clock output, a control input coupled to the scan enable output, and a scan output, at least a second scan register having a scan input coupled to the second scan data input lead, a clock input coupled to the scan clock output, a control input coupled to the scan enable output, and a scan output, a first flip flop having a data input coupled to the first scan data input lead, a clock input coupled to one of the test clock input lead and scan clock output via an inverter, and a data output, at least a second flip flop having a data input coupled to the second scan data input lead, a clock input coupled to the scan clock input lead via an inverter, and a data output, and a compare circuit having a data input coupled to the scan output of the first scan register, a data input coupled to the data output of the first flip flop, a data input coupled to the scan output of the second scan register, and a data input coupled to the data output of the second flip flop.

A device comprising a first scan data input lead, at least a second scan data input lead, a test clock input lead, a test mode select input lead, a Test Access Port having a clock input coupled to the test clock input lead, a mode input coupled to the test mode select input lead, a scan clock output, and a scan enable output, a first scan register having a scan input coupled to the first scan data input lead, a clock input coupled to the scan clock output, a control input coupled to the scan enable output, and a scan output, at least a second scan register having a scan input coupled to the second scan data input lead, a clock input coupled to the scan clock output, a control input coupled to the scan enable output, and a scan output, a first flip flop having a data input coupled to the first scan data input lead, a clock input coupled to one of the test clock input lead and scan clock output via an inverter, and a data output, at least a second flip flop having a data input coupled to the second scan data input lead, a clock input coupled to the scan clock input lead via an inverter, and a data output, and a compressor circuit having a data input coupled to the scan output of the first scan register, a data input coupled to the data output of the first flip flop, a data input coupled to the scan output of the second scan register, and a data input coupled to the data output of the second flip flop.

A device comprising a first scan data input lead, at least a second scan data input lead, a test clock input lead, a test mode select input lead, a Test Access Port having a clock input coupled to the test clock input lead, a mode input coupled to the test mode select input lead, a scan clock output, and a control output, a first flip flop having a data input coupled to the test mode select input lead, a clock input coupled to one of the test clock input lead and scan clock output via an inverter, and a data output, a gate having an input coupled to the control output of the test access port, an input coupled to the data output of the first flip flop, and a scan enable output, a first scan register having a scan input coupled to the first scan data input lead, a clock input coupled to the scan clock output, a control input coupled to the scan enable output, and a scan output, at least a second scan register having a scan input coupled to the second scan data input lead, a clock input coupled to the scan clock output, a control input coupled to the scan enable output, and a scan output, a second flip flop having a data input coupled to the first scan data input lead, a clock input coupled to one of the test clock input lead and scan clock output via an inverter, and a data output, at least a third flip flop having a data input coupled to the second scan data input lead, a clock input coupled to the scan clock input lead via an inverter, and a data output, and a compare circuit having a data input coupled to the scan output of the first scan register, a data input coupled to the data output of the second flip flop, a data input coupled to the scan output of the second scan register, and a data input coupled to the data output of the third flip flop.

A device comprising a test clock input lead, a test mode select input lead, a Test Access Port having a clock input coupled to the test clock input lead, a mode input coupled to the test mode select input lead, and a control output, a flip flop having a data input coupled to the test mode select input lead, a clock input coupled to the test clock input lead via an inverter, and a data output, and a gate having an input coupled to the control output of the test access port, an input coupled to the data output of the flip flop, and a scan enable output.

A device comprising a first scan data input lead, at least a second scan data input lead, a test clock input lead, a test mode select input lead, a Test Access Port having a clock input coupled to the test clock input lead, a mode input coupled to the test mode select input lead, a scan clock output, and a control output, a first flip flop having a data input coupled to the test mode select input lead, a clock input coupled to one of the test clock input lead and scan clock output via an inverter, and a data output, a gate having an input coupled to the control output of the test access port, an input coupled to the data output of the first flip flop, and a scan enable output, a first scan register having a scan input coupled to the first scan data input lead, a clock input coupled to the scan clock output, a control input coupled to the scan enable output, and a scan output, at least a second scan register having a scan input coupled to the second scan data input lead, a clock input coupled to the scan clock output, a control input coupled to the scan enable output, and a scan output, a second flip flop having a data input coupled to the first scan data input lead, a clock input coupled to one of the test clock input lead and scan clock output via an inverter, and a data output, at least a third flip flop having a data input coupled to the second scan data input lead, a clock input coupled to the scan clock input lead via an inverter, and a data output, and a compressor circuit having a data input coupled to the scan output of the first scan register, a data input coupled to the data output of the second flip flop, a data input coupled to the scan output of the second scan register, and a data input coupled to the data output of the third flip flop.

A device comprising a test data input lead, a test clock input lead, a test mode select input lead, a Test Access Port having a clock input coupled to the test clock input lead, a mode input coupled to the test mode select input lead, a scan clock output, and a scan enable output, a flip flop having a data input coupled to the test data input lead, a clock input coupled to one of the test clock input lead and scan clock output via an inverter, and a data output, a scan register having a scan input coupled to the test data input lead, a clock input coupled to the scan clock output, a control input coupled to the scan enable output, and a scan output, and one of a compare circuit and compressor circuit having a data input coupled to the scan output of the scan register and a data input coupled to the data output of the flip flop.

A device comprising a test data input lead, a test clock input lead, a test mode select input lead, a Test Access Port having a clock input coupled to the test clock input lead, a mode input coupled to the test mode select input lead, a scan clock output, and a scan enable output, a flip flop having a data input coupled to the test mode select input lead, a clock input coupled to one of the test clock input lead and scan clock output via an inverter, and a data output, a scan register having a scan input coupled to the test data input lead, a clock input coupled to the scan clock output, a control input coupled to the scan enable output, and a scan output, and one of a compare circuit and compressor circuit having a data input coupled to the scan output of the scan register and a data input coupled to the data output of the flip flop.

A device comprising a test data input lead, a test clock input lead, a test mode select input lead, a Test Access Port having a clock input coupled to the test clock input lead, a mode input coupled to the test mode select input lead, a scan clock output, and a control output, a first flip flop having a data input coupled to the test mode select input lead, a clock input coupled to one of the test clock input lead and scan clock output via an inverter, and a data output, a second flip flop having a data input coupled to the test data input lead, a clock input coupled to one of the test clock input lead and scan clock output via an inverter, and a data output, a gate having an input coupled to the control output of the test access port, an input coupled to the data output of the first flip flop, and a scan enable output, a scan register having a scan input coupled to the test data input lead, a clock input coupled to the scan clock output, a control input coupled to the scan enable output, and a scan output, and one of a compare circuit and compressor circuit having a data input coupled to the scan output of the scan register and a data input coupled to the data output of the second flip flop.

a device comprising a test data input lead, a test clock input lead, a test mode select input lead, a Test Access Port having a clock input coupled to the test clock input lead, a mode input coupled to the test mode select input lead, a scan clock output, and a control output, a first flip flop having a data input coupled to the test mode select input lead, a clock input coupled to one of the test clock input lead and scan clock output via an inverter, and a data output, a second flip flop having a data input coupled to the test data input lead, a clock input coupled to one of the test clock input lead and scan clock output via an inverter, and a data output, a gate having an input coupled to the control output of the test access port, an input coupled to the data output of the second flip flop, and a scan enable output, a scan register having a scan input coupled to the test data input lead, a clock input coupled to the scan clock output, a control input coupled to the scan enable output, and a scan output and one of a compare circuit and compressor circuit having a data input coupled to the scan output of the scan register and a data input coupled to the data output of the first flip flop.

A device comprising a test data input lead, a test clock input lead, a test mode select input lead, a Test Access Port having a clock input coupled to the test clock input lead, a mode input coupled to the test mode select input lead, a scan clock output, and a scan enable output, a first flip flop having a data input coupled to the test mode select input lead, a clock input coupled to one of the test clock input lead and scan clock output via an inverter, and a data output, a second flip flop having a data input coupled to the test data input lead, a clock input coupled to one of the test clock input lead and scan clock output via an inverter, and a data output, a scan register having a scan input coupled to the test data input lead, a clock input coupled to the scan clock output, a control input coupled to the scan enable output, and a scan output and a maskable compare circuit having a data input coupled to the scan output of the scan register, a data input coupled to the data output of the first flip flop, and a data input coupled to the data output of the second flip flop.

A device comprising a test data input lead a test clock input lead, a test mode select input lead, a test data output lead, a Test Access Port having a clock input coupled to the test clock input lead, a mode input coupled to the test mode select input lead, a scan clock output, and a control output, a flip flop having a data input coupled to one of the test mode select input lead and test data input lead, a clock input coupled to one of the test clock input lead and scan clock output via an inverter, and a data output, a gate having an input coupled to the control output of the test access port, an input coupled to the data output of the flip flop, and a scan enable output and a scan register having a scan input coupled to the test data input lead, a clock input coupled to the scan clock output, a control input coupled to the scan enable output, and a scan output coupled to the test data output lead.

A device comprising a first scan data input lead, a second scan data input lead, a test clock input lead, a test mode select input lead, a first scan data output lead, a second scan data output lead, a Test Access Port having a clock input coupled to the test clock input lead, a mode input coupled to the test mode select input lead, a scan clock output, and a control output, a flip flop having a data input coupled to the test mode select input lead, a clock input coupled to one of the test clock input lead and scan clock output via an inverter, and a data output, a gate having an input coupled to the control output of the test access port, an input coupled to the data output of the flip flop, and a scan enable output, a first scan register having a scan input coupled to the first scan data input lead, a clock input coupled to the scan clock output, a control input coupled to the scan enable output, and a scan output coupled to the first scan data output lead and a second scan register having a scan input coupled to the second scan data input lead, a clock input coupled to the scan clock output, a control input coupled to the scan enable output, and a scan output coupled to the second scan data output lead.

A device comprising a test clock input lead, a test mode select input lead, scan test circuitry having a scan clock input and a scan enable input, a Test Access Port having a clock input coupled to the test clock input lead, a mode input coupled to the test mode select input lead, a scan clock output coupled to the scan clock input of the scan test circuitry, and a control output, a flip flop having a data input coupled to the test mode select input lead, a clock input coupled to one of the test clock input lead and scan clock output via an inverter, and a data output and a gate having an input coupled to the control output of the test access port, an input coupled to the data output of the flip flop, and a scan enable output coupled to the scan enable input of the scan test circuitry.

The scan test circuitry the preceding paragraph including a decompressor circuit having one or more inputs coupled to one or more compressed stimulus data input leads of the device and outputs for transmitting decompressed stimulus data to the scan inputs of plural scan registers.

The scan test circuitry of the preceding paragraph including a compactor circuit having inputs for receiving response data outputs from plural scan registers and one or more outputs for outputting compacted response data on one or more output leads of the device.

The scan test circuitry of the preceding paragraph including a compactor circuit having inputs for receiving response data outputs from plural scan registers and outputting compacted response data to a compressor circuit on the device.

The scan test circuitry of the preceding paragraph including a maskable compactor circuit having inputs for receiving response data outputs from plural scan registers and one or more outputs for outputting compacted response data on one or more output leads of the device.

The scan test circuitry of the preceding paragraph including a maskable compactor circuit having inputs for receiving response data outputs from plural scan registers and one or more outputs for outputting compacted response data to a compressor circuit on the device.

The scan test circuitry of the preceding paragraph including a compactor circuit having inputs for receiving response data outputs from plural scan registers and one or more outputs for outputting compacted response data to corresponding one or more output leads of the device via one or more corresponding mask circuits on the device.

The scan test circuitry of the preceding paragraph including a compactor circuit having inputs for receiving response data outputs from plural scan registers and one or more outputs for outputting compacted response data to a compressor circuit on the device via one or more corresponding mask circuits on the device.

A scan test architecture on a device comprising test input leads, test output leads, a test clock input lead, a decompressor circuit having inputs coupled to the test input leads for inputting compressed stimulus data from the test input leads on the rising edge of the test clock input lead, and outputs coupled to the scan inputs of plural scan registers for inputting decompressed stimulus data to the scan registers, a maskable compactor circuit having inputs coupled to the scan outputs of plural scan registers for inputting test response from the plural scan registers, one or more inputs coupled to one or more test input leads for inputting mask data from the one or more test input leads on the falling edge of the test clock input lead, and outputs coupled to the test output leads for outputting compacted test response data.

A scan test architecture on a device comprising test input leads, a test clock input lead, a decompressor circuit having inputs coupled to the test input leads for inputting compressed stimulus data from the test input leads on the rising edge of the test clock input lead, and outputs coupled to the scan inputs of plural scan registers for inputting decompressed stimulus data to the scan registers, a maskable compactor circuit having inputs coupled to the scan outputs of the plural scan registers for inputting test response from the scan registers, one or more inputs coupled to one or more test input leads for inputting mask data from the one or more test input leads on the falling edge of the test clock input lead, and outputs for outputting compacted test response data, and a compressor circuit having inputs coupled to the outputs of the maskable compactor circuit and a clock input coupled to the test clock input lead.

A scan test architecture on a device comprising, test input leads, test output leads a test clock input lead, a decompressor circuit having inputs coupled to the test input leads for inputting compressed stimulus data from the test input leads on the rising edge of the test clock input lead, and outputs coupled to the scan inputs of plural scan registers for inputting decompressed stimulus data to the scan registers, a compactor circuit having inputs coupled to the scan outputs of the plural scan registers for inputting test response from the scan registers, and outputs for outputting compacted response data, a mask flip flop for each compacted response data output from the compactor circuit, each said mask flip flop having an input coupled to one of said test input leads, a clock input coupled to the test clock input lead via an inverter, and a mask output, and a mask gate for each compacted response data output from the compactor circuit, each said mask gate having an input coupled to a compacted response data output from the compactor circuit, an input coupled to a mask output from a mask flip flop, and an output coupled to a test output leads.

A scan test architecture on a device comprising test input leads, test output leads a test clock input lead, a decompressor circuit having inputs coupled to the test input leads for inputting compressed stimulus data from the test input leads on the rising edge of the test clock input lead, and outputs coupled to the scan inputs of plural scan registers for inputting decompressed stimulus data to the scan registers, a compactor circuit having inputs coupled to the scan outputs of the plural scan registers for inputting test response from the scan registers, and outputs for outputting compacted response data, a mask flip flop for each compacted response data output from the compactor circuit, each said mask flip flop having an input coupled to one of said test input leads, a clock input coupled to the test clock input lead via an inverter, and a mask output, and a mask gate for each compacted response data output from the compactor circuit, each said mask gate having an input coupled to a compacted response data output from the compactor circuit, an input coupled to a mask output from a mask flip flop, and an output, and a compressor circuit having inputs coupled to the outputs of the mask gates and a clock input coupled to the test clock input lead.

A maskable compactor circuit on a device comprising a mask shift register having a mask data input coupled to one of a test data input lead and test mode select input lead, a clock input coupled to a test clock input lead via an inverter, and mask data outputs, a mask update register having an update control input coupled to one of the test data input lead and test mode select input lead, a clock input coupled to the test clock input lead via an inverter, and mask data outputs, a masking circuit having scan data inputs coupled to the scan outputs of plural scan registers on the device, mask data inputs coupled to the mask data outputs from the mask update register, and data outputs, and a compactor circuit having data inputs coupled to the data outputs of the masking circuit and a compacted data output coupled to a test data output lead.

A maskable compactor circuit on a device comprising a mask shift register having mask data inputs coupled to scan data input leads, a clock input coupled to a scan clock input lead via an inverter, and mask data outputs, a mask update register having an update control input coupled to one of a scan enable input lead and auxiliary input lead, a clock input coupled to the scan clock input lead via an inverter, and mask data outputs, a masking circuit having scan data inputs coupled to the scan outputs of plural scan registers on the device, mask data inputs coupled to the mask data outputs from the mask update register, and data outputs, and a compactor circuit having data inputs coupled to the data outputs of the masking circuit and compacted data outputs coupled to scan data output leads.

What is claimed is:

1. A device comprising;
   A. a scan data input lead;
   B. a scan clock lead;
   C. a scan enable lead,
   D. a scan register having a scan input coupled to the scan data input lead, a clock input coupled to the scan clock lead, a control input coupled to the scan enable lead, and a scan output;
   E. an inverter having an input connected to the scan clock lead and an output;
   F. a flip flop having a data input coupled to the scan data input lead, a clock input coupled to the output of the inverter, and a data output; and
   G. a compare circuit having a first data input coupled to the scan output of the scan register and a second data input coupled to the data output of the flip flop.

2. The device of claim 1 in which the compare circuit includes a serial test data input and a serial test data output separate from the first and second data inputs.

3. The device of claim 1 in which the compare circuit includes a clock input coupled to the scan clock lead and a control input coupled to the scan enable lead.

4. The device of claim 1 in which the compare circuit includes a gate and a memory circuit, the gate having an input connected to the first data input, another input connected to the second data input, and an output, and the memory circuit having an input connected to the output of the gate, an input connected to the clock input, an input connected to the control input, a test data input, and a test data output.

* * * * *